(12) United States Patent
Masuoka et al.

(10) Patent No.: US 8,198,654 B2
(45) Date of Patent: Jun. 12, 2012

(54) SEMICONDUCTOR DEVICE

(75) Inventors: Fujio Masuoka, Tokyo (JP); Hiroki Nakamura, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 69 days.

(21) Appl. No.: 12/882,771

(22) Filed: Sep. 15, 2010

(65) Prior Publication Data

US 2011/0062515 A1     Mar. 17, 2011

Related U.S. Application Data

(60) Provisional application No. 61/276,904, filed on Sep. 17, 2009.

(30) Foreign Application Priority Data

Sep. 16, 2009   (JP) .................. 2009-214043

(51) Int. Cl.
*H01L 29/78* (2006.01)

(52) U.S. Cl. .................. 257/204; 257/206; 257/347

(58) Field of Classification Search .................. 257/204, 257/206, 347
See application file for complete search history.

(56) References Cited

U.S. PATENT DOCUMENTS

| | | | |
|---|---|---|---|
| 5,382,816 A | | 1/1995 | Mitsui |
| 5,480,838 A | | 1/1996 | Mitsui |
| 5,767,549 A | * | 6/1998 | Chen et al. ............ 257/347 |
| 5,994,735 A | | 11/1999 | Maeda et al. |
| 6,127,209 A | | 10/2000 | Maeda et al. |
| 6,624,459 B1 | * | 9/2003 | Dachtera et al. ......... 257/296 |
| 7,052,941 B2 | | 5/2006 | Lee |
| 7,193,278 B2 | | 3/2007 | Song |
| 7,579,214 B2 | * | 8/2009 | Yamazaki et al. ........... 438/107 |
| 2002/0195652 A1 | | 12/2002 | Maeda et al. |
| 2004/0113207 A1 | | 6/2004 | Hsu et al. |
| 2004/0135215 A1 | | 7/2004 | Song |

(Continued)

FOREIGN PATENT DOCUMENTS

EP      2239771 A1    10/2010

(Continued)

OTHER PUBLICATIONS

Watanabe, Shigeyoshi et al., "A Novel Circuit Technology with Surrounding Gate Transistors (SGT's) for Ultra High Density DRAM's," IEEE Journal of Solid-State Circuits, vol. 30, No. 9, Sep. 1995, pp. 960-971.

(Continued)

*Primary Examiner* — Eugene Lee
(74) *Attorney, Agent, or Firm* — Brinks Hoffer Gilson & Lione

(57) ABSTRACT

A first gate electrode surrounding the periphery of the first gate insulating film, a second gate insulating film surrounding the periphery of the first gate electrode, a first columnar silicon layer surrounding the periphery of the second gate insulating film, a first upper part high concentration semiconductor layer of the first conductivity type formed in the upper part of the first island-shaped silicon layer, a second lower part high concentration semiconductor layer of the first conductivity type formed in the lower part of the first island-shaped silicon layer, a first upper part high concentration semiconductor layer of the second conductivity type formed in the upper part of the first columnar silicon layer, and a second lower part high concentration semiconductor layer of the second conductivity type formed in the lower part of the first columnar silicon layer.

10 Claims, 71 Drawing Sheets

U.S. PATENT DOCUMENTS

| | | |
|---|---|---|
| 2007/0007601 A1 | 1/2007 | Hsu et al. |
| 2007/0138557 A1* | 6/2007 | Ipposhi ........................ 257/347 |
| 2009/0114989 A1* | 5/2009 | Hamamoto ................... 257/347 |
| 2009/0290082 A1* | 11/2009 | Yamazaki et al. .............. 349/43 |
| 2010/0207213 A1* | 8/2010 | Tan et al. ...................... 257/347 |

FOREIGN PATENT DOCUMENTS

| | | |
|---|---|---|
| JP | 63-158866 A | 7/1988 |
| JP | 64-089560 A | 4/1989 |
| JP | 02-188966 A | 7/1990 |
| JP | 03-225873 A | 10/1991 |
| JP | 04-234166 A | 8/1992 |
| JP | 06-021467 A | 1/1994 |
| JP | 06-069441 A | 3/1994 |
| JP | 06-237003 A | 8/1994 |
| JP | 07-099311 A | 4/1995 |
| JP | 10-079482 A | 3/1998 |
| JP | 10-223777 A | 8/1998 |
| JP | 2003-068883 A | 3/2003 |
| JP | 2003-224211 A | 8/2003 |
| JP | 2004-193588 A | 7/2004 |
| JP | 2008-205168 A | 9/2008 |
| KR | 2004-0063348 A | 7/2004 |
| WO | WO 2009/096465 A1 | 8/2000 |

OTHER PUBLICATIONS

Written Opinion of the International Searching Authority for International Application No. PCT/JP2008/051301, dated Apr. 1, 2008, 5 pages.

Written Opinion of the International Searching Authority for International Application No. PCT/JP2009/051460, dated Apr. 21, 2009, 5 pages.

International Search Report for International Application No. PCT/JP2008/051301, dated Apr. 1, 2008, 2 pages.

International Search Report for International Application No. PCT/JP2009/051460, dated Apr. 21, 2009, 2 pages.

* cited by examiner

FIG.30
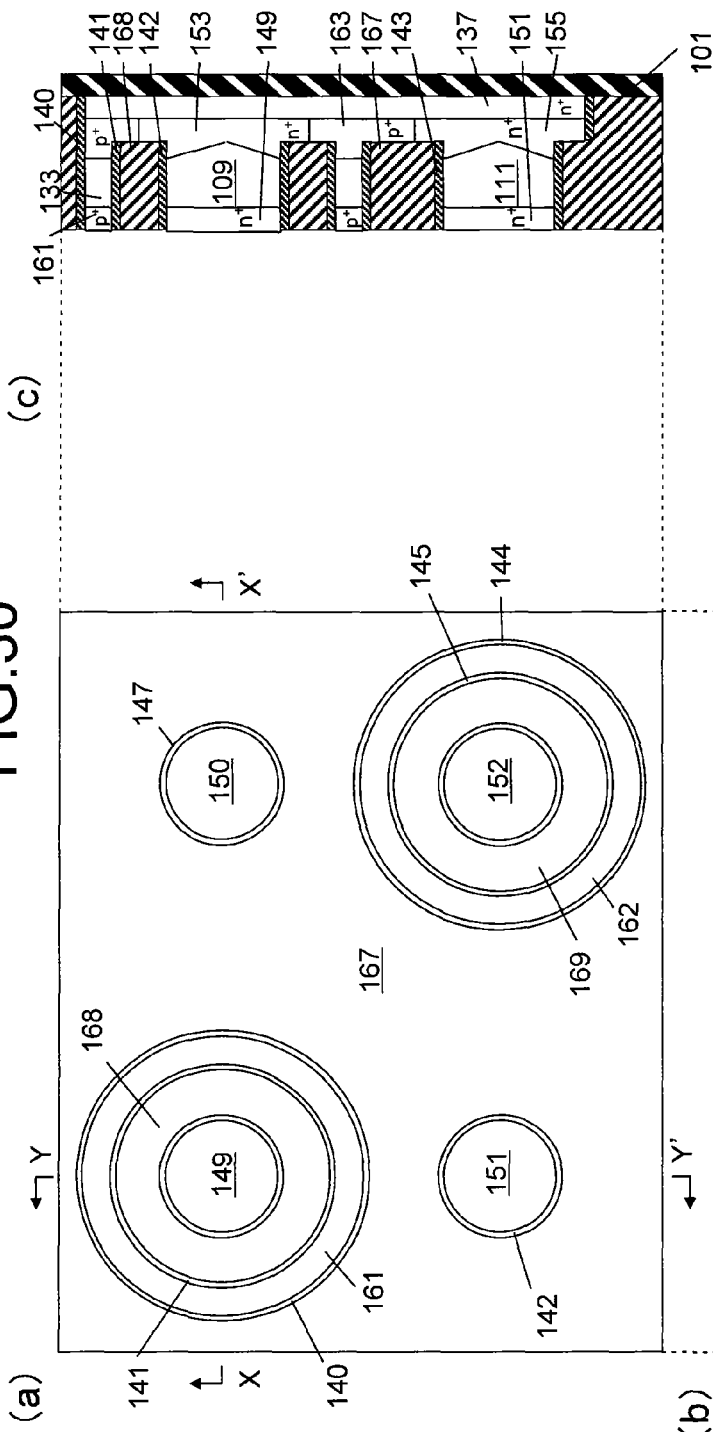
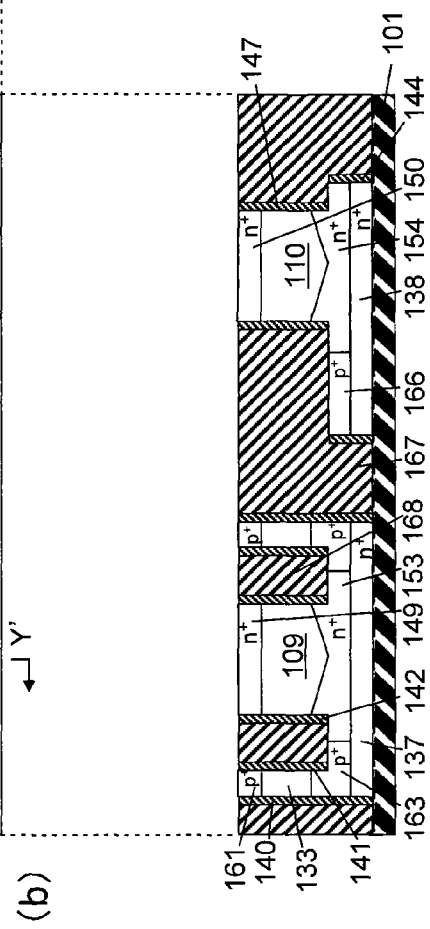

FIG.33
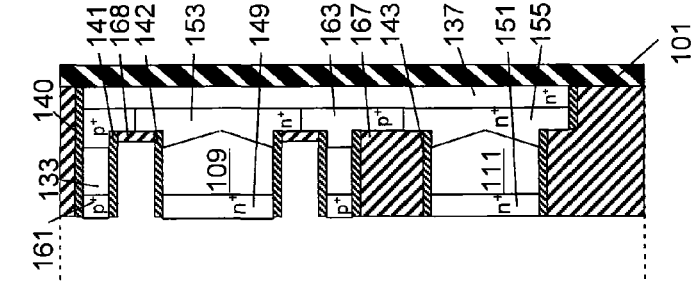
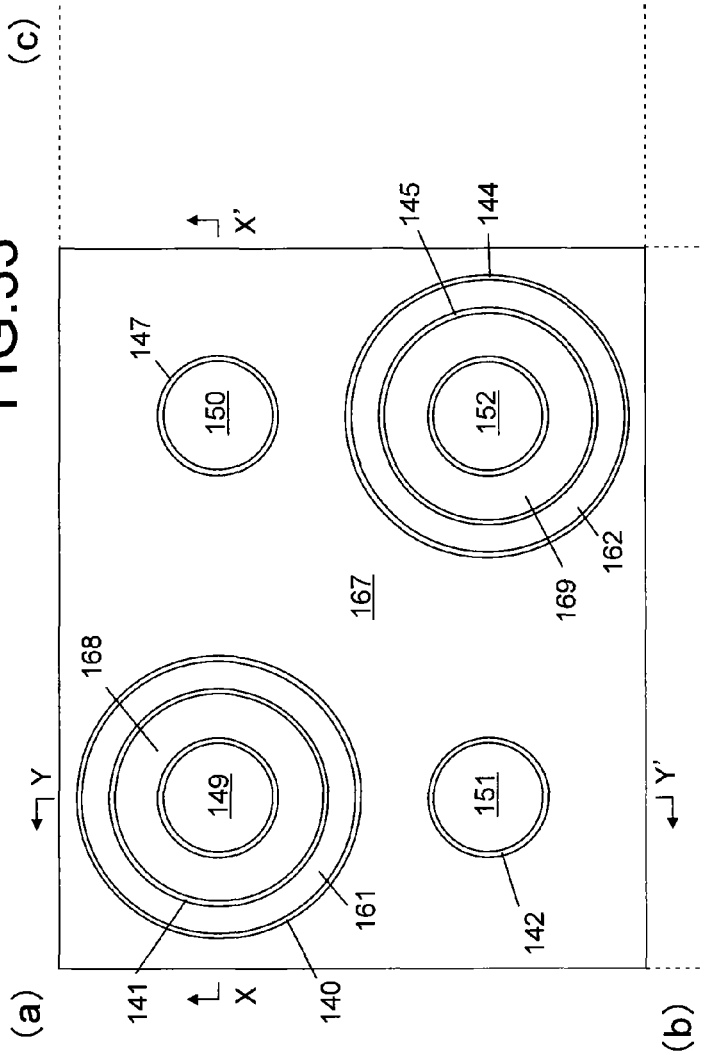
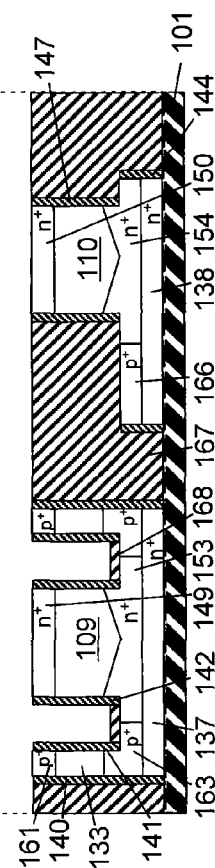

FIG.35
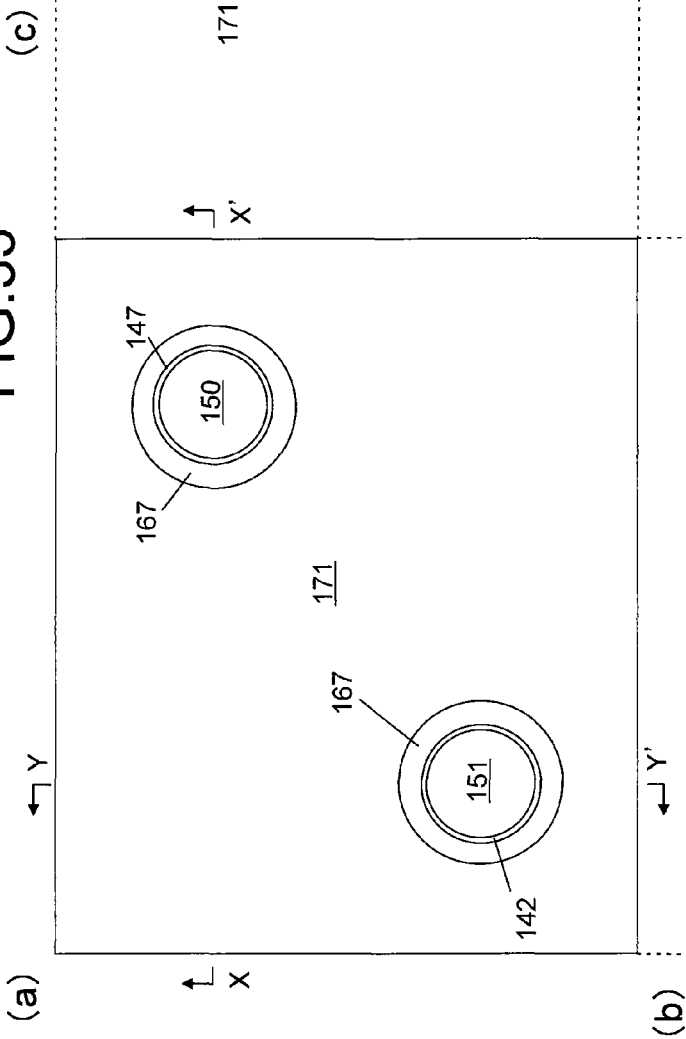
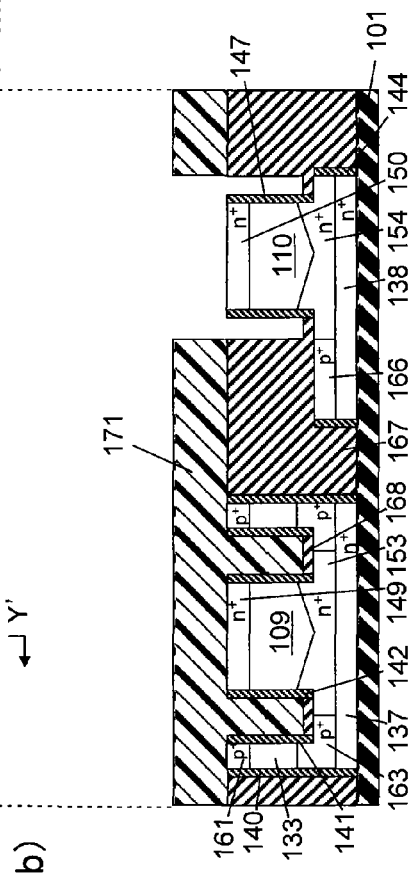

FIG. 36
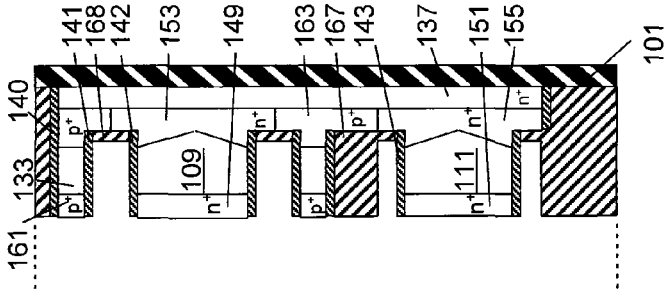
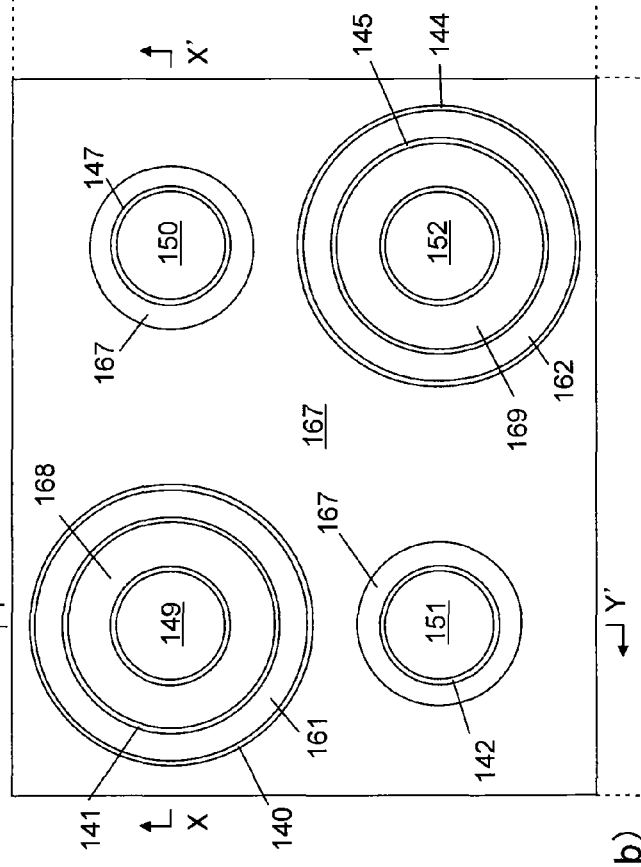
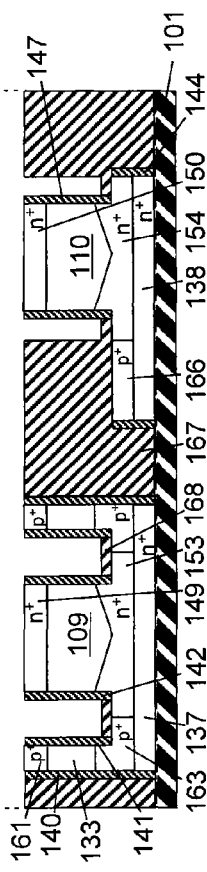

FIG. 40
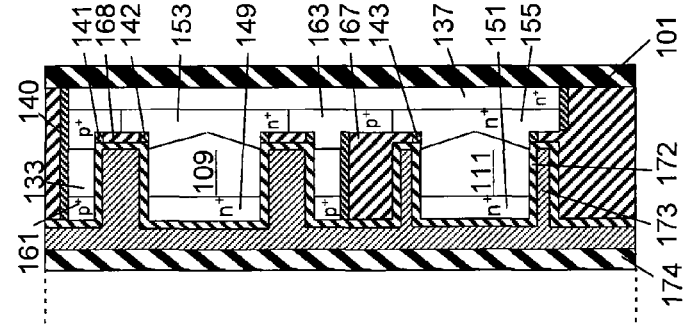
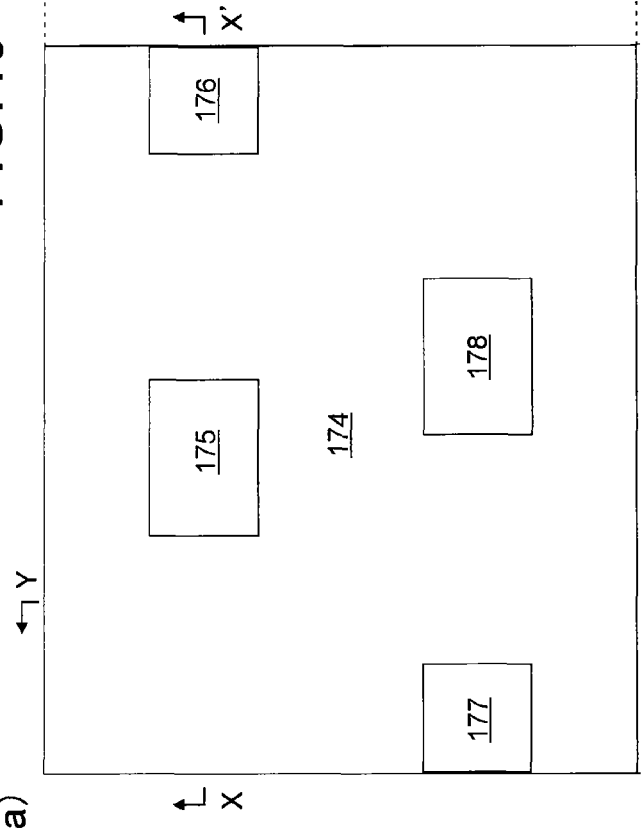
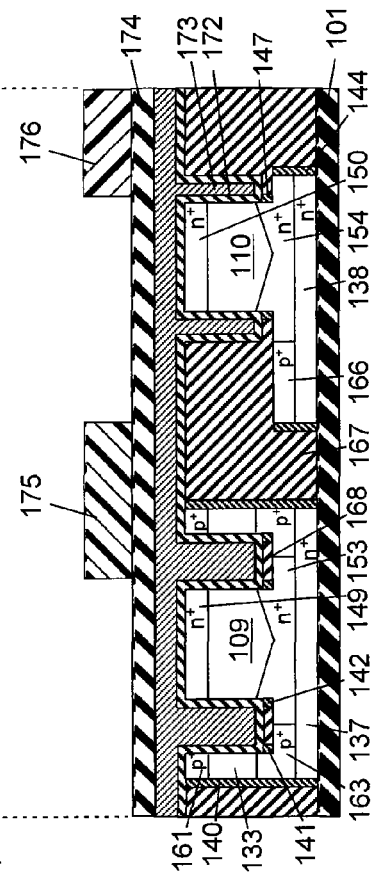

FIG.69

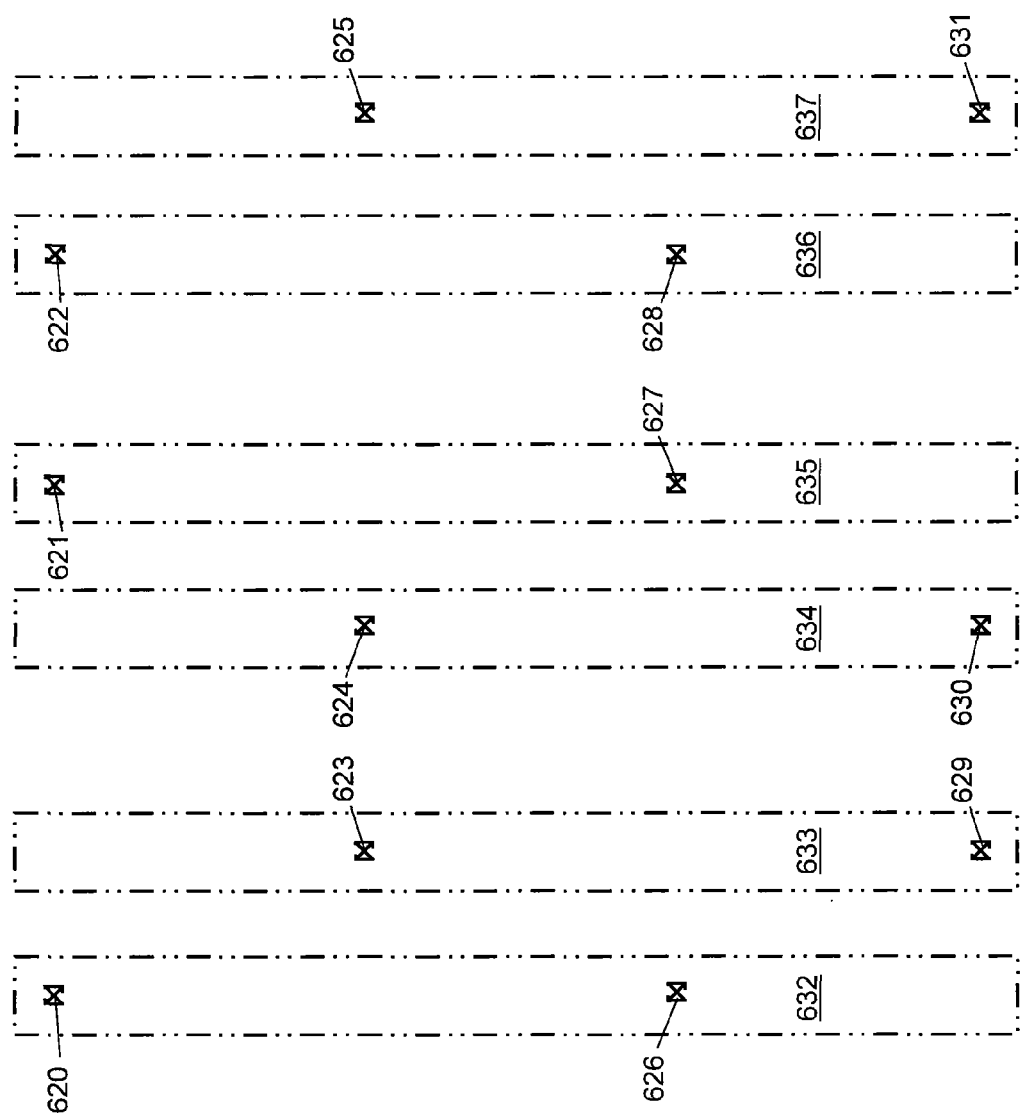

SEMICONDUCTOR DEVICE

RELATED APPLICATIONS

Pursuant to 35 U.S.C. §119(e), this application claims the benefit of the filing date of Provisional U.S. Patent Application Ser. No. 61/276,904 filed on Sep. 17, 2009. This application also claims priority under 35 U.S.C. §119(a) to JP2009-214043 filed on Sep. 16, 2009. The entire contents of these applications are hereby incorporated by reference.

BACKGROUND OF THE INVENTION

1. Field of the Invention

This application relates generally to a semiconductor device.

2. Description of the Related Art

Semiconductor devices, particularly integrated circuits using MOS transistors, which are field effect transistors having gate electrodes with a MOS (metal-oxide semiconductor) structure, are increasingly being highly integrated. MOS transistors in integrated circuits have been downsized to nano sizes as the integration level is increased. When MOS transistors constitute an inverter circuit (a NOT circuit)—one of the basic types of digital circuits—as those MOS transistors are downsized, problems arise such as difficulty in leaking current control and reduced reliability occurs due to hot carrier effect. In addition, the problem occurs that reducing the area occupied by circuits is impossible due to the necessity of assuring the necessary current quantity. In order to resolve these problems, a surrounding gate transistor (SGT) structure has been proposed having an island-shaped semiconductor layer in which the source, gate and drain are provided on a substrate in the vertical direction and the gate surrounds this island-shaped semiconductor, and CMOS inverter circuits using SGTs have been proposed (for example, see 1. Watanabe, K. Tsuchida, D. Takashima, Y. Oowaki, A. Nitayama, K. Hieda, H. Takato, K. Sunouchi, F. Horiguchi, K. Ohuchi, F. Masuoka, H. Hara, "A Novel Circuit Technology with Surrounding Gate Transistors (SGT's) for Ultra High Density DRAM's", IEEE JSSC, Vo. 30, No. 9, 1995).

An inverter circuit, which is one of the basic types of digital circuits, consists of a p-channel type MOS transistor (pMOS transistor) and an n-channel type MOS transistor (pMOS transistor). The mobility of holes is half the mobility of electrons. Therefore, in an inverter circuit the pMOS transistor must have a gate width double the gate width of the nMOS transistor. For this reason, a conventional CMOS inverter circuit using SGTs comprises two directly connected pMOS SGTs and one nMOS SGT. In other words, a conventional CMOS inverter circuit using SGTs comprises three island-shaped semiconductors When composing SRAM (Static Random Access Memory) using CMOS inverter circuits using such SGTs, the SRAM comprises two inverter circuits and two selection transistors. When SRAM is made with a conventional CMOS inverter circuit using SGTs, such must constitute four pMOS SGTs and four pMOS SGTs. In other words, SRAM using conventional CMOS inverter circuits with SGTs comprises a total of eight island-shaped semiconductors. When SRAM using CMOS inverter circuits using SGTs comprises eight island-shaped semiconductor layers, this becomes an impediment to increasing integration of the semiconductor device.

SUMMARY OF THE INVENTION

In consideration of the foregoing, it is an objective of the present invention to provide a semiconductor device consisting of SRAM using SGTs in which increased integration can be realized.

A first aspect of present invention provides a semiconductor device having:

a first inverter circuit positioned in a first row and a first column in a matrix orientation on a substrate, wherein the first inverter circuit has:

a first gate insulating film surrounding the periphery of a first island-shaped semiconductor layer, a first gate electrode surrounding the periphery of the first gate insulating film, a second gate insulating film surrounding the periphery of the first gate electrode, a first columnar semiconductor layer surrounding the periphery of the second gate insulating film, a first upper part high concentration semiconductor layer of a first conductivity type positioned on the upper part of the first island-shaped semiconductor layer, a second lower part high concentration semiconductor layer of the first conductivity type positioned on the lower part of the first island-shaped semiconductor layer, a first upper part high concentration semiconductor layer of a second conductivity type positioned on the upper part of the first columnar semiconductor layer, and a second lower part high concentration semiconductor layer of the second conductivity type positioned on the lower part of the first columnar semiconductor layer;

further comprising a second inverter circuit positioned in a second row and a second column in a matrix orientation on the substrate, wherein the second inverter circuit has:

a second island-shaped semiconductor layer, a third gate insulating film surrounding the periphery of the second island-shaped semiconductor layer, a second gate electrode surrounding the periphery of the third gate insulating film, a fourth gate insulating film surrounding the periphery of the second gate electrode, a second columnar semiconductor layer surrounding the periphery of the fourth gate insulating film, a third upper part high concentration semiconductor layer of the first conductivity type positioned on the upper part of the second island-shaped semiconductor layer, a fourth lower part high concentration semiconductor layer of the first conductivity type positioned on the lower part of the second island-shaped semiconductor layer, a third upper part high concentration semiconductor layer of the second conductivity type positioned on the upper part of the second columnar semiconductor layer, and a fourth lower part high concentration semiconductor layer of the second conductivity type positioned on the lower part of the second columnar semiconductor layer;

further comprising a first selection transistor positioned in the first row and second column of the matrix orientation on the substrate, wherein this first selection transistor has:

a third island-shaped semiconductor layer, a fifth gate insulating film surrounding the periphery of the third island-shaped semiconductor layer, a third gate electrode surrounding the periphery of the fifth gate insulating film, a fifth upper part high concentration semiconductor layer of the first conductivity type positioned on the upper part of the third island-shaped semiconductor layer, and a sixth lower part high concentration semiconductor layer of the first conductivity type positioned on the lower part of the third island-shaped semiconductor layer, and further comprising a second selection transistor positioned in the second row and first column of the matrix orientation on the substrate, wherein the second selection transistor has:

a fourth island-shaped semiconductor layer, a sixth gate insulating film surrounding the periphery of the fourth island-shaped semiconductor layer, a fourth gate electrode surrounding the periphery of the sixth gate insulating film, a seventh upper part high concentration semiconductor layer of the first conductivity type positioned on the upper part of the fourth island-shaped semiconductor layer, and an eighth lower part high concentration semiconductor layer of the first conductivity type positioned on the lower part of the fourth island-shaped semiconductor layer;

further comprising a ninth lower part high concentration semiconductor layer of the first conductivity type that contacts the second lower part high concentration semiconductor layer of the first conductivity type, the second lower part high concentration semiconductor layer of the second conductivity type and the eighth lower part high concentration semiconductor layer of the first conductivity type; and a tenth lower part high concentration semiconductor layer of the first conductivity type positioned that contacts the fourth lower part high concentration semiconductor layer of the first conductivity type, the fourth lower part high concentration semiconductor layer of the second conductivity type and the sixth lower part high concentration semiconductor layer of the first conductivity type;

and having a first compound layer of semiconductor and metal that contacts the first upper part high concentration semiconductor layer of the first conductivity type;

a second compound layer of semiconductor and metal that contacts the first lower part high concentration semiconductor layer of the second conductivity type;

a third compound layer of semiconductor and metal that contacts the second lower part high concentration semiconductor layer of the second conductivity type, the ninth lower part high concentration semiconductor layer of the first conductivity type and the eighth lower part high concentration semiconductor layer of the first conductivity type;

a fourth compound layer of semiconductor and metal that contacts the seventh upper part high concentration semiconductor layer of the first conductivity type;

a fifth compound layer of semiconductor and metal that contacts the third upper part high concentration semiconductor layer of the first conductivity type;

a sixth compound layer of semiconductor and metal that contacts the third upper part high concentration semiconductor layer of the second conductivity type;

a seventh compound layer of semiconductor and metal that contacts the fourth lower part high concentration semiconductor layer of the second conductivity type, the tenth lower part high concentration semiconductor layer of the first conductivity type and the sixth lower part high concentration semiconductor layer of the first conductivity type;

an eighth compound layer of semiconductor and metal that contacts the fifth upper part high concentration semiconductor layer of the first conductivity type;

a first contact for electrically connecting the first gate electrode and the seventh compound layer; and a second contact for electrically connecting the second gate electrode and the third compound layer.

Furthermore, in a preferable aspect of the present invention:

in the first inverter circuit, the first upper part high concentration semiconductor layer of the first conductivity type is a first n+ type semiconductor layer, the second lower part high concentration semiconductor layer of the first conductivity type is a second n+ type semiconductor layer, the first upper part high concentration semiconductor layer of the second conductivity type is a first p+ type semiconductor layer, and the second lower part high concentration semiconductor layer of the second conductivity type is a second p+ type semiconductor layer;

in the second inverter circuit, the third upper part high concentration semiconductor layer of the first conductivity type is a third n+ type semiconductor layer, the fourth lower part high concentration semiconductor layer of the first conductivity type is a fourth n+ type semiconductor layer, the third upper part high concentration semiconductor layer of the second conductivity type is a third p+ type semiconductor layer, and the fourth lower part high concentration semiconductor layer of the second conductivity type is a fourth p+ type semiconductor layer;

in the first selection transistor, the fifth upper part high concentration semiconductor layer of the first conductivity type is a fifth n+ type semiconductor layer, the sixth lower part high concentration semiconductor layer of the first conductivity type is a sixth n+ type semiconductor layer, the fifth upper part high concentration semiconductor layer of the second conductivity type is a fifth p+ type semiconductor layer, and the sixth lower part high concentration semiconductor layer of the second conductivity type is a sixth p+ type semiconductor layer; and in the second selection transistor, the seventh upper part high concentration semiconductor layer of the first conductivity type is a seventh n+ type semiconductor layer, and the eighth lower part high concentration semiconductor layer of the first conductivity type is an eighth n+ type semiconductor layer.

Furthermore, in a preferable aspect of the present invention: the ninth lower part high concentration semiconductor layer of the first conductivity type is a ninth n+ type semiconductor layer, and the tenth lower part high concentration semiconductor layer of the first conductivity type is a tenth n+ type semiconductor layer.

Furthermore, in a preferable aspect of the present invention: $Wp \approx 2Wn$, where Wp is the inner circumference of the first columnar semiconductor layer and Wn is the outer circumference of the first island-shaped semiconductor layer, and $Wp \approx 2Wn$, where Wp is the inner circumference of the second columnar semiconductor layer and Wn is the outer circumference of the second island-shaped semiconductor layer.

Furthermore, in a preferable aspect of the present invention, $Rp \approx 2Rn$, where Rp is the inner diameter of the first columnar semiconductor layer and Rn is the radius of the first island-shaped semiconductor layer, and $Rp \approx 2Rn$, where Rp is the inner diameter of the second columnar semiconductor layer and Rn is the radius of the second island-shaped semiconductor layer.

Furthermore, in a preferable aspect of the present invention: Lp≈Ln, where Lp is the channel length of the first columnar semiconductor layer and Ln is the channel length of the first island-shaped semiconductor layer, and Lp≈Ln, where Lp is the channel length of the second columnar semiconductor layer and Ln is the channel length of the second island-shaped semiconductor layer.

Furthermore, in a preferable aspect of the present invention:

the first inverter circuit has an enhancement-type nMOS transistor, the first upper part high concentration semiconductor layer of the first conductivity type is a first n+ type semiconductor layer, the second lower part high concentration semiconductor layer of the first conductivity type is a second n+ type semiconductor layer, the first upper part high concentration semiconductor layer of the second conductivity type is a first p+ type semiconductor layer, the second lower part high concentration semiconductor layer of the second conductivity type is a second p+ type semiconductor layer, the second inverter circuit has an enhancement-type pMOS transistor, the third upper part high concentration semiconductor layer of the first conductivity type is a third n+ type semiconductor layer, the fourth lower part high concentration semiconductor layer of the first conductivity type is a fourth n+ type semiconductor layer, the third upper part high concentration semiconductor layer of the second conductivity type is a third p+ type semiconductor layer, the fourth lower part high concentration semiconductor layer of the second conductivity type is a fourth p+ type semiconductor layer, and the second gate electrode is formed of a material for making the nMOS transistor and the pMOS transistor enhancement type.

Furthermore, in a preferable aspect of the present invention, the first through fourth compound layers are each compound layers of silicon and metal.

Furthermore, in a preferable aspect of the present invention:

the first and second island-shaped semiconductor layers are each island-shaped silicon layers;

the first and second columnar semiconductor layers are each columnar silicon layers;

the first and second n+ type semiconductor layers are each n+ type silicon layers; and the first and second p+ type semiconductor layers are each p+ type silicon layers.

Furthermore, in a preferable aspect of the present invention, the first and second island-shaped silicon layers are each p type or non-doped island-shaped silicon layers; and the first and second columnar silicon layers are each n type or non-doped columnar silicon layers.

With the present invention, it is possible to provide a semiconductor device having SRAM using SGTs with which higher integration can be realized.

BRIEF DESCRIPTION OF THE DRAWINGS

A more complete understanding of this application can be obtained when the following detailed description is considered in conjunction with the following drawings, in which:

FIG. 30 shows a step in the example of the production process, wherein (a), (b) and (c) are a top plan view, a cross-sectional view taken along the line X-X' in (a), and a cross-sectional view taken along the line Y-Y' in (a), respectively.

FIG. 33 shows a step in the example of the production process, wherein (a), (b) and (c) are a top plan view, a cross-sectional view taken along the line X-X' in (a), and a cross-sectional view taken along the line Y-Y' in (a), respectively.

FIG. 35 shows a step in the example of the production process, wherein (a), (b) and (c) are a top plan view, a cross-sectional view taken along the line X-X' in (a), and a cross-sectional view taken along the line Y-Y' in (a), respectively.

FIG. 36 shows a step in the example of the production process, wherein (a), (b) and (c) are a top plan view, a cross-sectional view taken along the line X-X' in (a), and a cross-sectional view taken along the line Y-Y' in (a), respectively.

FIG. 40 shows a step in the example of the production process, wherein (a), (b) and (c) are a top plan view, a cross-sectional view taken along the line X-X' in (a), and a cross-sectional view taken along the line Y-Y' in (a), respectively.

FIG. 69 is a plane view showing the arrangement of the first via (contact between the first metal and the second metal) and the second metal layer of a device in which the semiconductor device according to the present invention is arranged in three rows and three columns on a substrate;

FIG. 71 is a plane view showing the arrangement of the third via (contact between the third metal and the fourth metal) and the fourth metal layer of a device in which the semiconductor device according to the present invention is arranged in three rows and three columns on a substrate.

DETAILED DESCRIPTION OF THE PREFERRED EMBODIMENTS

A semiconductor device according to an embodiment of the present invention and a method of producing such is described below with reference to the drawings.

Figure 1:
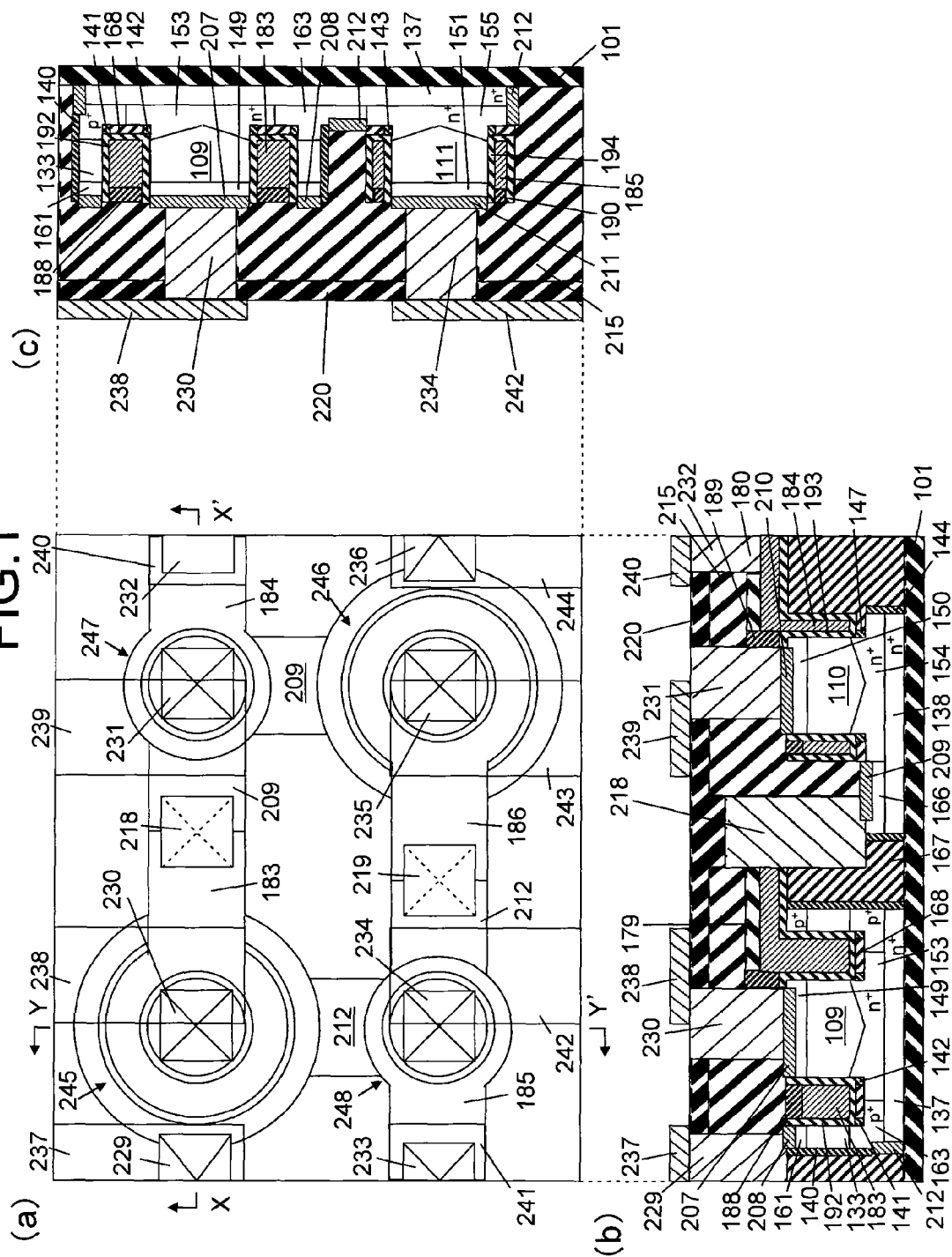
FIG. 1 shows a semiconductor device according to one embodiment of the present invention, wherein (a), (b) and (c) are a schematic diagram of the semiconductor device in a plane view, taken along the line X-X' in (a) and a cross-sectional view taken along the line Y-Y' in (a), respectively.

FIG. 1 shows a semiconductor device according to one embodiment of the present invention, wherein (a), (b) and (c) are a schematic diagram of the semiconductor device in a plane view, taken along the line X-X' in (a) and a cross-sectional view taken along the line Y-Y' in (a), respectively.

As shown in FIG. 1, the semiconductor device according to the present embodiment has SRAM using SGTs and is provided with a first CMOS inverter circuit 245 positioned in a first row and a first column of a matrix orientation on a substrate (unrepresented); a second CMOS inverter circuit 246 positioned in a second row and a second column of this matrix orientation, a first selection transistor 247 positioned in the first row and second column of this matrix orientation and a second selection transistor 248 positioned in the second row and first column of this matrix orientation.

The first CMOS inverter circuit 245 has a first island-shaped silicon layer 109 in which the source, gate and drain are arranged in a direction perpendicular to the substrate (unrepresented).

The first CMOS inverter circuit 245 further has a first gate insulating film 192 surrounding the periphery of the first island-shaped silicon layer 109, a first gate electrode 183 surrounding the periphery of the first gate insulating film 192, a second gate insulating film 192 surrounding the periphery of the first gate electrode 183, a first columnar silicon layer 133 surrounding the periphery of the second gate insulating film 192, a first n+ type silicon layer 149 formed in the upper part of the first island-shaped silicon layer 109, a second n+ type silicon layer 153 formed in the lower part of the first island-shaped silicon layer 109, a first p+ type silicon layer 161 formed in the upper part of the first columnar silicon layer 133, and a second p+ type silicon layer 163 formed in the lower part of the first columnar silicon layer 133.

The second CMOS inverter circuit 246 has a second island-shaped silicon layer (unrepresented) in which the source, gate and drain are arranged in a direction perpendicular to the substrate (unrepresented).

In addition, the second CMOS inverter circuit 246 is further provided with a third gate insulating film (unrepresented) surrounding the periphery of the second island-shaped silicon layer, a second gate electrode 186 surrounding the periphery of the third gate insulating film, a fourth gate insulating film (unrepresented) surrounding the periphery of the second gate electrode 186, a second columnar silicon layer (unrepresented) surrounding the periphery of the fourth gate insulating film, a third n+ type silicon layer (unrepresented) positioned on the upper part of the second island-shaped silicon layer, a fourth n+ type silicon layer (unrepresented) positioned on the lower part of the second island-shaped silicon layer, a third p+ type silicon layer (unrepresented) positioned on the upper part of the second columnar silicon layer, and a fourth p+ type silicon layer (unrepresented) positioned on the lower part of the second columnar silicon layer.

The first selection transistor 247 has a third island-shaped silicon layer 110 in which the source, gate and drain are arranged in a direction perpendicular to the substrate (unrepresented).

The first selection transistor 247 is further provided with a fifth gate insulating film 193 surrounding the periphery of the third island-shaped silicon layer 110, a third gate electrode 184 surrounding the periphery of the fifth gate insulating film 193, a fifth n+ type silicon layer 150 positioned on the upper part of the third island-shaped silicon layer 110, and a sixth n+ type silicon layer 154 positioned on the lower part of below the third island-shaped silicon layer 110.

The second selection transistor 248 has a fourth island-shaped silicon layer 111 in which the source, gate and drain are arranged in a direction perpendicular to the substrate (unrepresented).

The second selection transistor 248 is further provided with a sixth gate insulating film 194 surrounding the periphery of the fourth island-shaped silicon layer 111, a fourth gate electrode 185 surrounding the periphery of the sixth gate insulating film 194, a seventh n+ type silicon layer 151 positioned on the upper part of the fourth island-shaped silicon layer 111 and an eighth n+ type silicon layer 155 positioned on the lower part of the fourth island-shaped silicon layer 111.

The semiconductor device according to the present embodiment is further provided with a ninth n+ type silicon layer 137 contacting the bottom part of the second n+ type silicon layer 153, the second p+ type silicon layer 163 and the eighth n+ type silicon layer 155; a tenth n+ type silicon layer 138 contacting the bottom part of the fourth n+ type silicon layer, the fourth p+ type silicon layer and the sixth n+ type silicon layer 154; a first silicon and metal compound layer 207 contacting the first n+ type silicon layer 149; a second silicon and metal compound layer 208 contacting the first p+ type silicon layer 161; and a third silicon and metal compound layer 212 contacting the second p+ type silicon layer 163; and the ninth n+ type silicon layer 137 and the eighth n+ type silicon layer 155.

The semiconductor device according to the present embodiment is further provided with a fourth silicon and metal compound layer 211 contacting the seventh n+ type silicon layer 151; a fifth silicon and metal compound layer (unrepresented) formed on the third n+ type silicon layer (unrepresented); a sixth silicon and metal compound layer (unrepresented) formed on the third p+ type silicon layer (unrepresented); a seventh silicon and metal compound layer 209 contacting the fourth p+ type silicon layer, the tenth n+ type silicon layer 138 and the sixth n+ type silicon layer 154; an eighth silicon and metal compound layer 210 contacting the fifth n+ type silicon layer 150; a first contact 218 electrically connecting the first gate electrode 183 and the seventh silicon and metal compound layer 209; and a second contact 219 electrically connecting the second gate electrode 186 and the third silicon and metal compound layer 212.

In the semiconductor device according to the present embodiment, a contact 229 is formed above the second compound layer 208, a contact 230 is formed above the first compound layer 207, a contact 231 is formed above the eighth compound layer 210, a contact 232 is formed above the third gate electrode 184, a contact 233 is formed above the fourth gate electrode 185, a contact 234 is formed above the fourth compound layer 211, a contact 235 is formed above the fifth compound layer (unrepresented) and a contact 236 is formed above the sixth compound layer (unrepresented).

In the semiconductor device according to the present embodiment, a first metal 237 is formed above the contact 229, a first metal 238 is formed above the contact 230, a first metal 239 is formed above the contact 231, a first metal 240 is formed above the contact 232, a first metal 241 is formed above the contact 233, a first metal 242 is formed above the contact 234, a first metal 243 is formed above the contact 235 and a first metal 244 is formed above the contact 236.

In the semiconductor device according to the present embodiment, an SRAM memory cell is formed through the above.

In addition, in the first CMOS inverter circuit 245, $Wp \approx 2 \cdot Wn$, where Wp is the inner circumference of the first columnar silicon layer 133 and Wn is the outer circumference of the first island-shaped silicon layer 109.

In addition, in the second CMOS inverter circuit 246, $Wp \approx 2 \cdot Wn$, where Wp is the inner circumference of the second columnar silicon layer (unrepresented) and Wn is the outer circumference of the second island-shaped silicon layer (unrepresented).

Furthermore, in the first CMOS inverter circuit 245, $Rp \approx 2 \cdot Rn$, where Rp is the diameter of the first columnar silicon layer 133 and Rn is the radius of the first island-shaped silicon layer.

Furthermore, in the second CMOS inverter circuit 246, $Rp \approx 2 \cdot Rn$, where Rp is the diameter of the second columnar silicon layer (unrepresented) and Rn is the radius of the second island-shaped silicon layer (unrepresented).

By thus having $Wp \approx 2 \cdot Wn$ and $Rp \approx 2 \cdot Rn$, the gate width of the pMOS transistor is twice the gate width of the nMOS transistor.

Through this, because the mobility of holes is half the mobility of electrons, it is possible to make the electric current driving power of the nMOS transistor equal the electric current driving power of the pMOS transistor, so it is possible to make the threshold voltage of the inverter half of the power source voltage.

Figure 2:
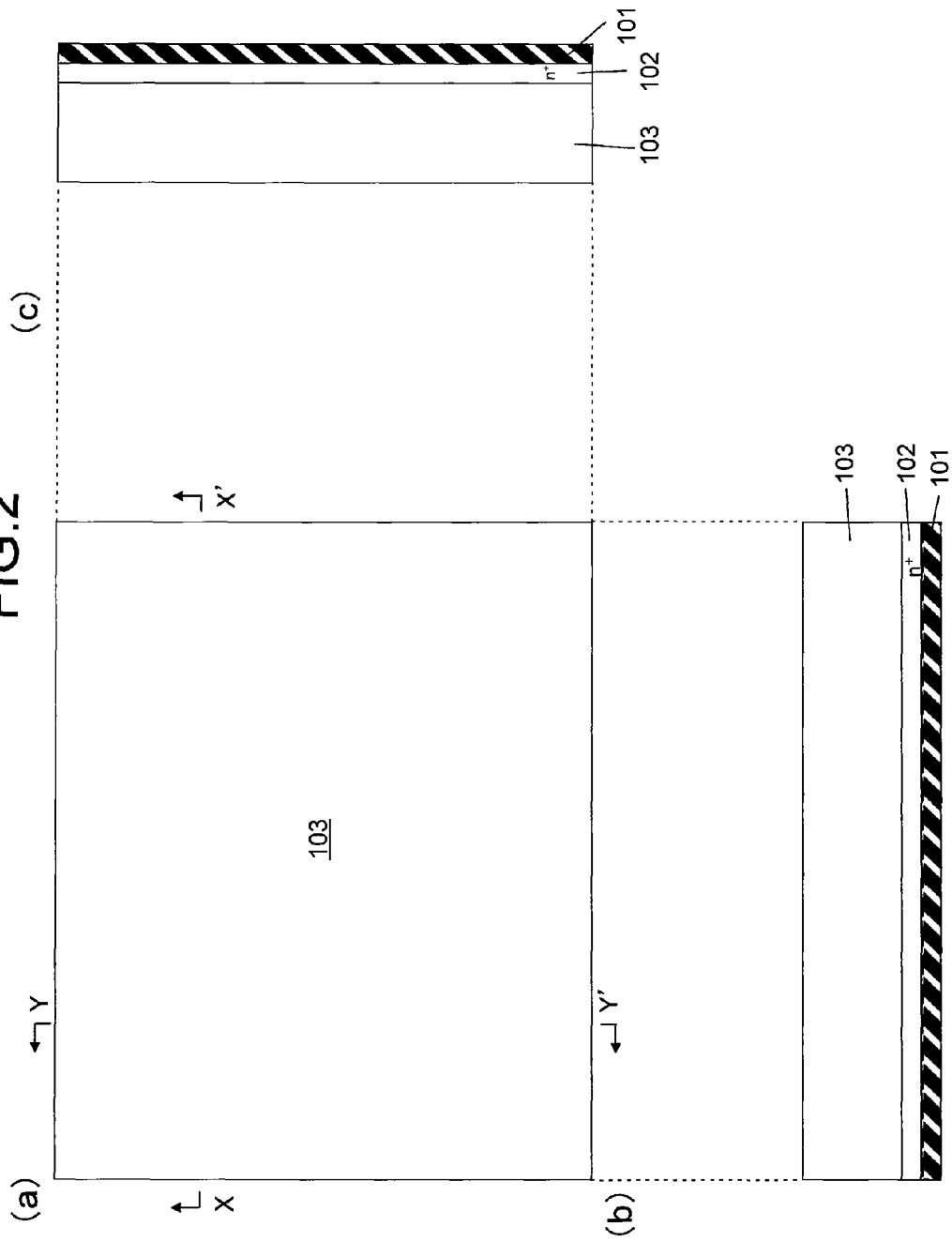
FIG. 2 shows a step in one example of a production process for the semiconductor device according to the embodiment, wherein (a), (b) and (c) are a top plan view, a cross-sectional view taken along the line X-X' in (a), and a cross-sectional view taken along the line Y-Y' in (a), respectively.
Figure 64:
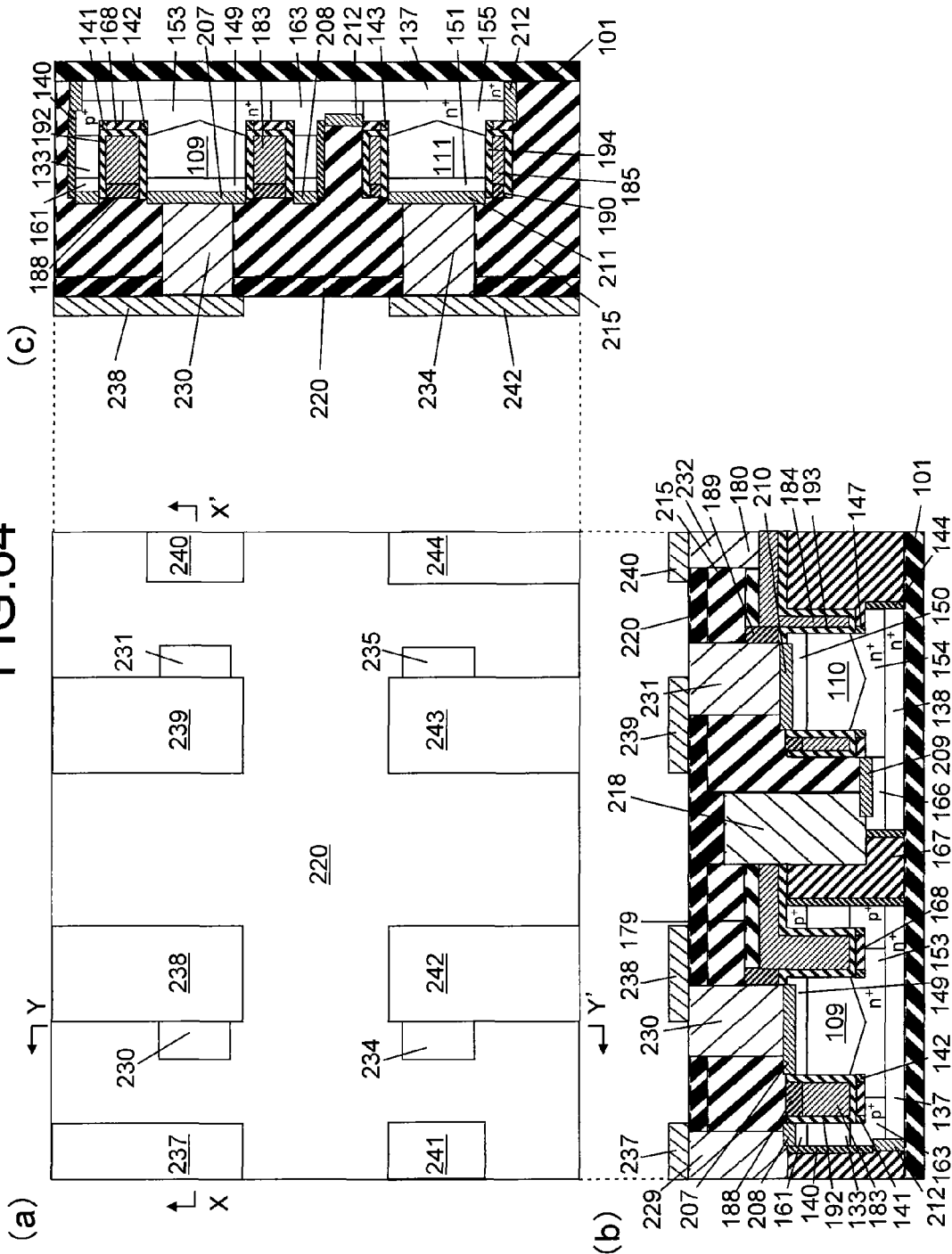
FIG. 64 shows a step in the example of the production process, wherein (a), (b) and (c) are a top plan view, a cross-sectional view taken along the line X-X' in (a), and a cross-sectional view taken along the line Y-Y' in (a), respectively.

In addition, it is preferable for $Lp \approx Ln$, where Lp is the channel length of the first and second columnar silicon layers and Ln is the channel length of the first and second island-shaped silicon layers An exemplary production process for forming the structure of the semiconductor device according to the present invention will be described hereafter with reference to FIGS. 2 to 64. In these figures, the same components are referred to by the same reference numbers. In FIGS. 2 to 64, part A is a planar view for explaining the production process of the semiconductor device according to an embodiment of the present invention, part B is a cross-sectional view at a line X-X' in this planar view, and part C is a cross-sectional view at a line Y-Y' in this planar view.

Referring to FIG. 2, phosphorus is implanted in the p type or non-doped silicon layer 103 formed on an oxide film 101, to form an n+ type silicon layer 102 near an interface contacting the oxide film 101.

Figure 3:
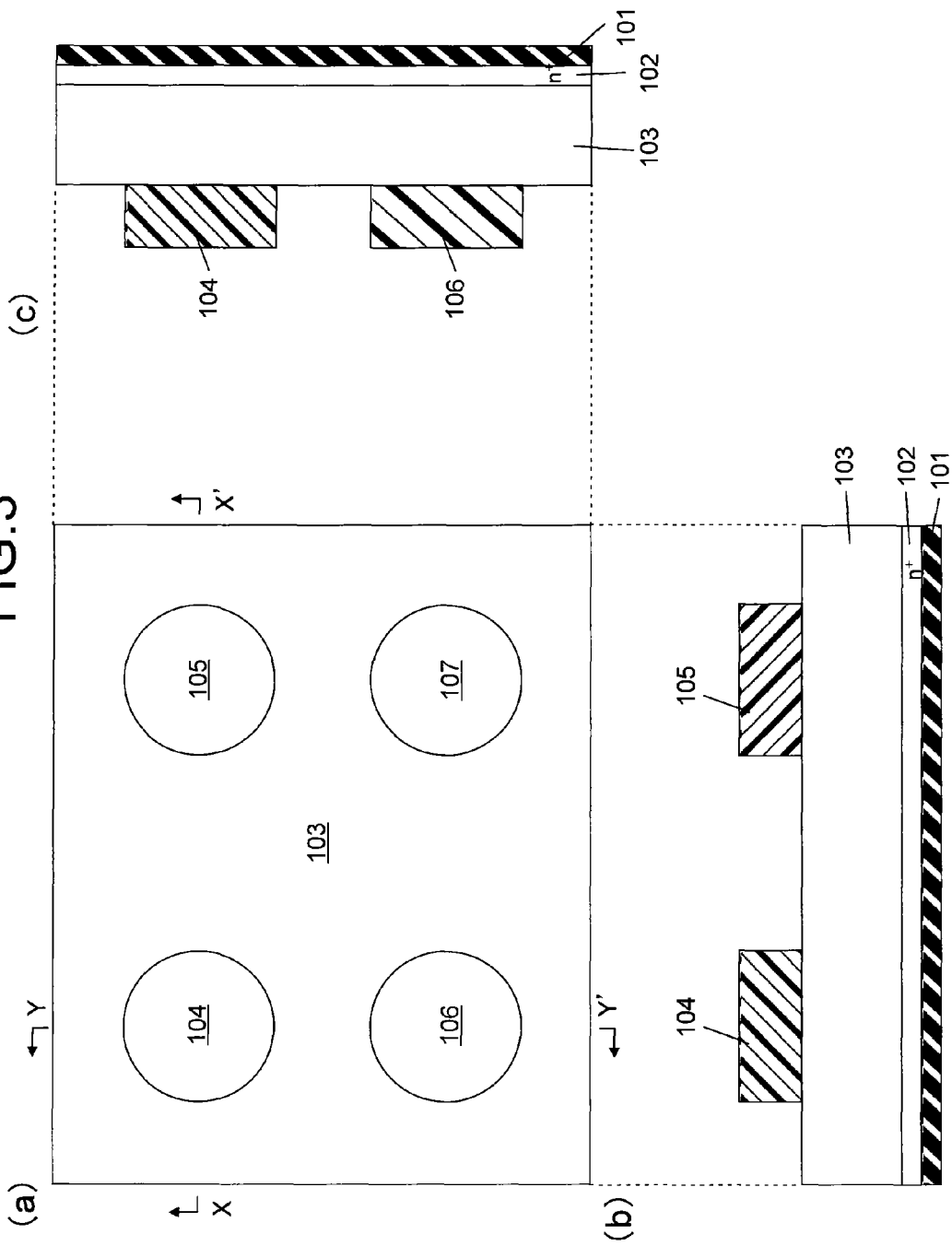
FIG. 3 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 3, resists 104, 105, 106 and 107 having specific patterns for forming an n type silicon layer are formed on a silicon layer 103. When the silicon layer 103 is non-doped, this step is unnecessary.

Figure 4:
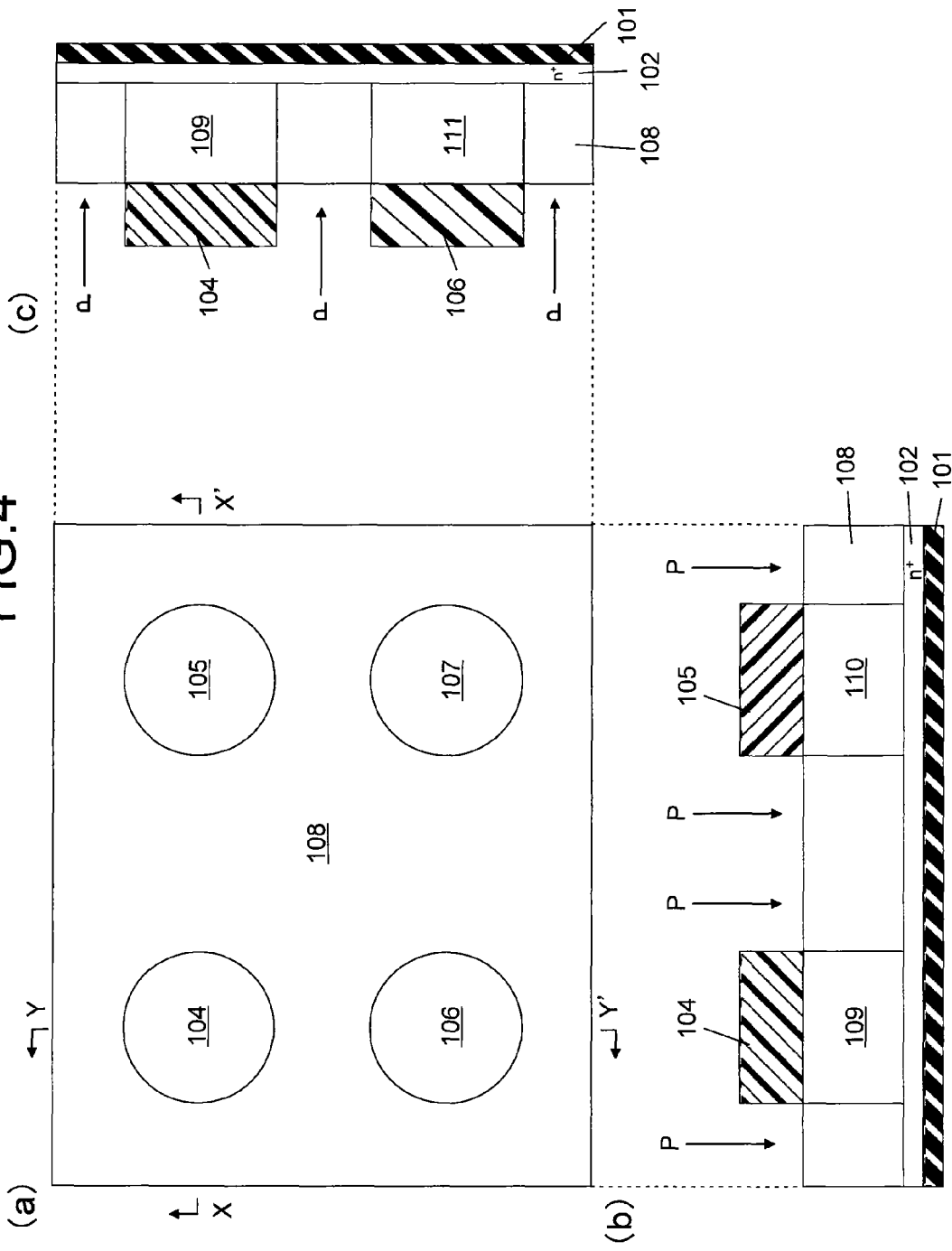
FIG. 4 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 4, phosphorus (P) is implanted in the silicon layer 103 using the resists 104, 105, 106 and 107 as a mask, to form an n type or non-doped silicon layer 108 at a prescribed position on the silicon layer 103. At this time, p type or non-doped silicon layers 109, 110, 111 and 112 are formed in the lower region of the resists 104, 105, 106 and 107. When the silicon layer 103 is non-doped, this step is unnecessary.

Figure 5:
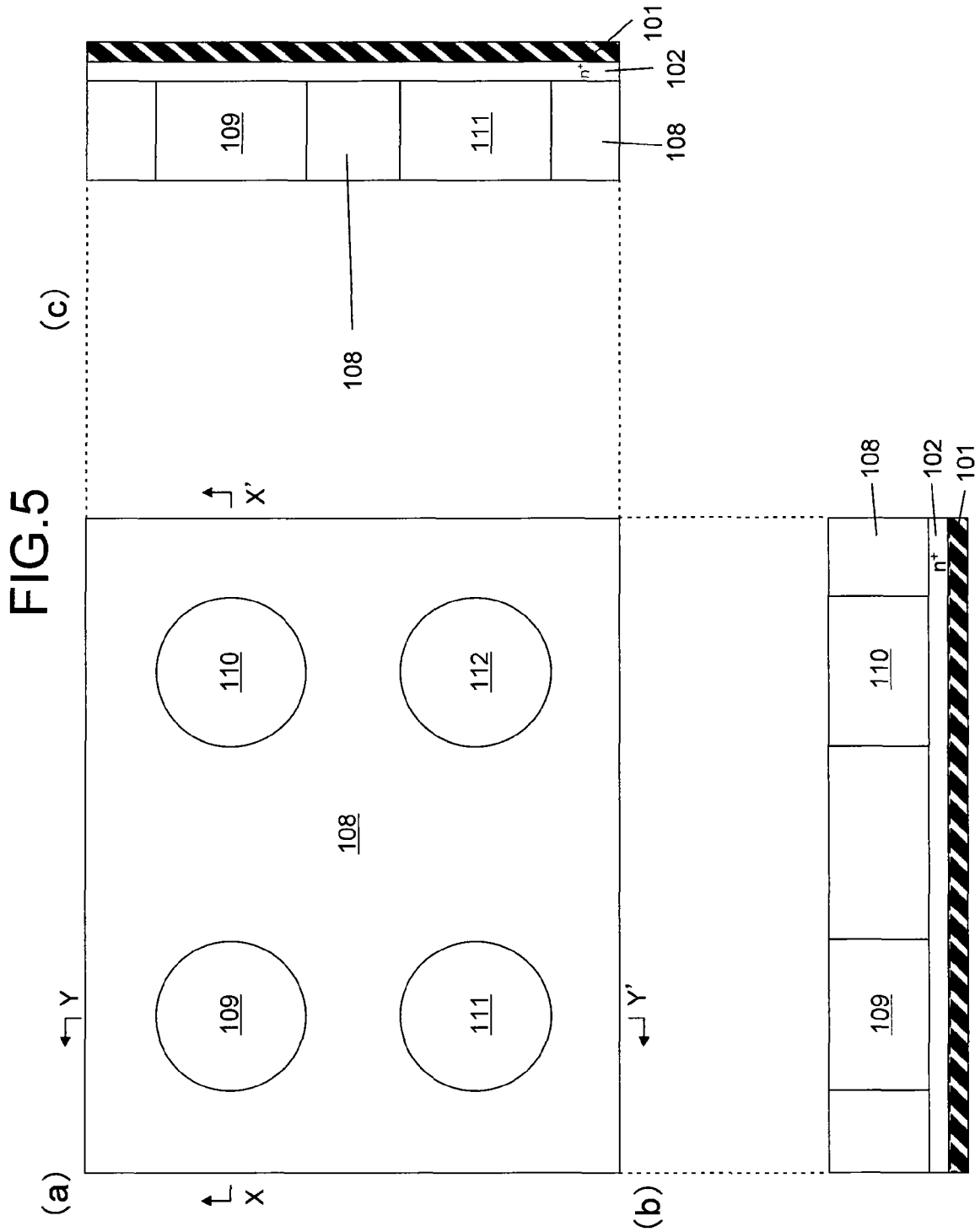
FIG. 5 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 5, the resists 104, 105, 106 and 107 are removed.

Figure 6:
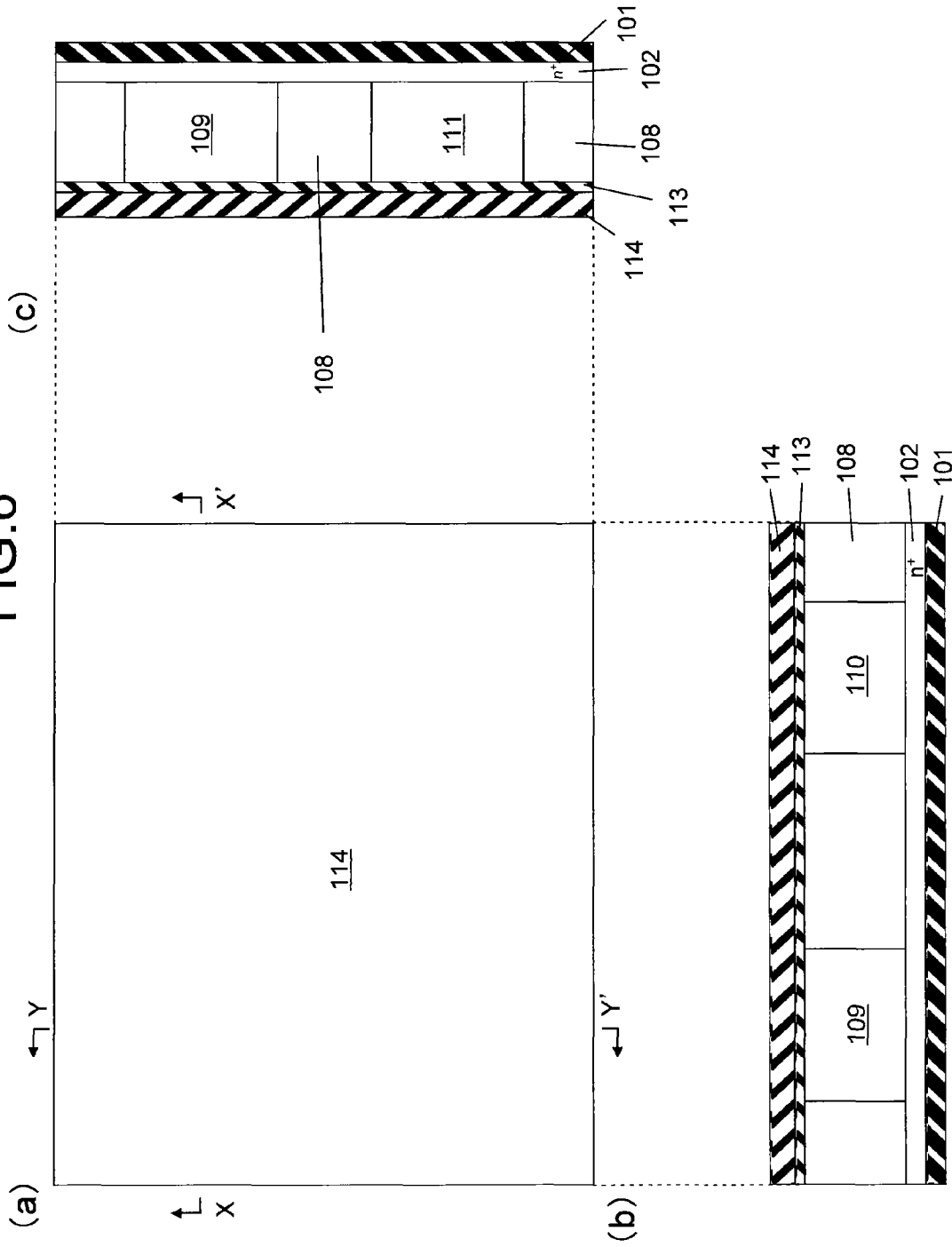
FIG. 6 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 6, an oxide film 113 and a nitride film 114 are deposited in this order on the silicon layer 108.

Figure 7:
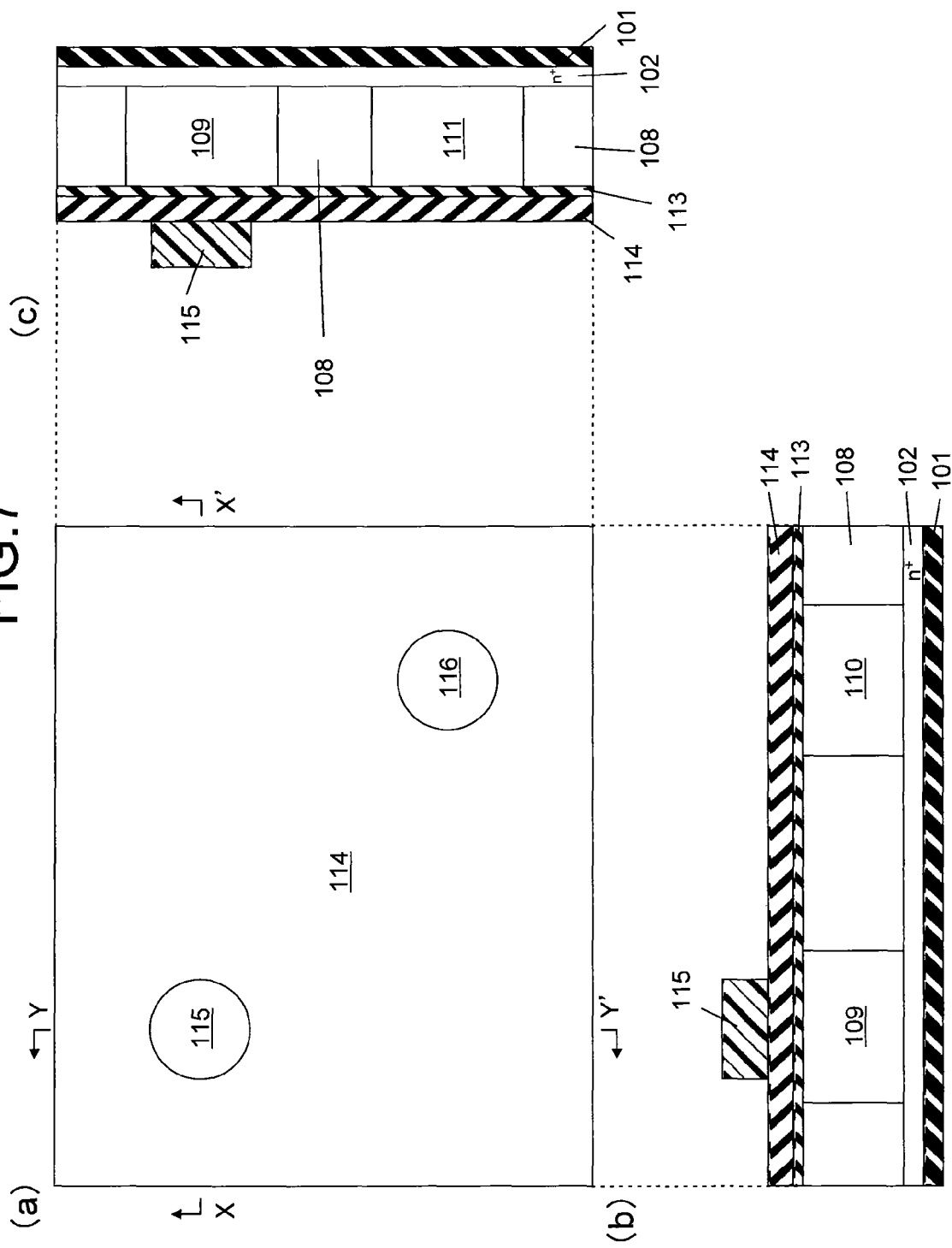
FIG. 7 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 7, resists 115 and 116 for forming silicon column structures that become island-shaped silicon layers are formed on the silicon layers 109 and 112, respectively.

Figure 8:
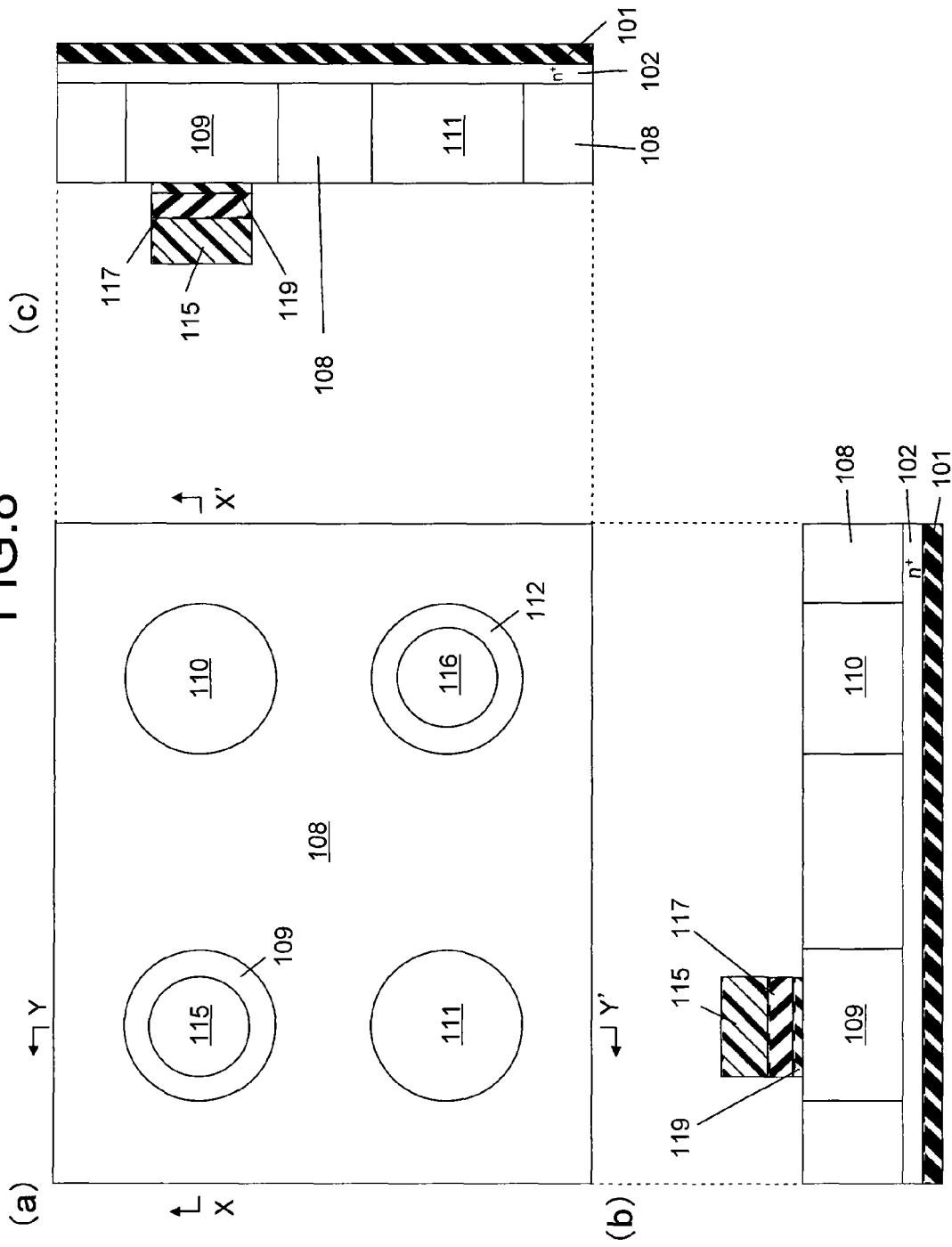
FIG. 8 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 8, the nitride film 114 and the oxide film 113 are etched using the resists 115 and 116 as masks to form a laminated structure of an oxide film hard mask 119 and a nitride film hard mask 118 on the silicon layers 109 and 112, respectively.

Figure 9:
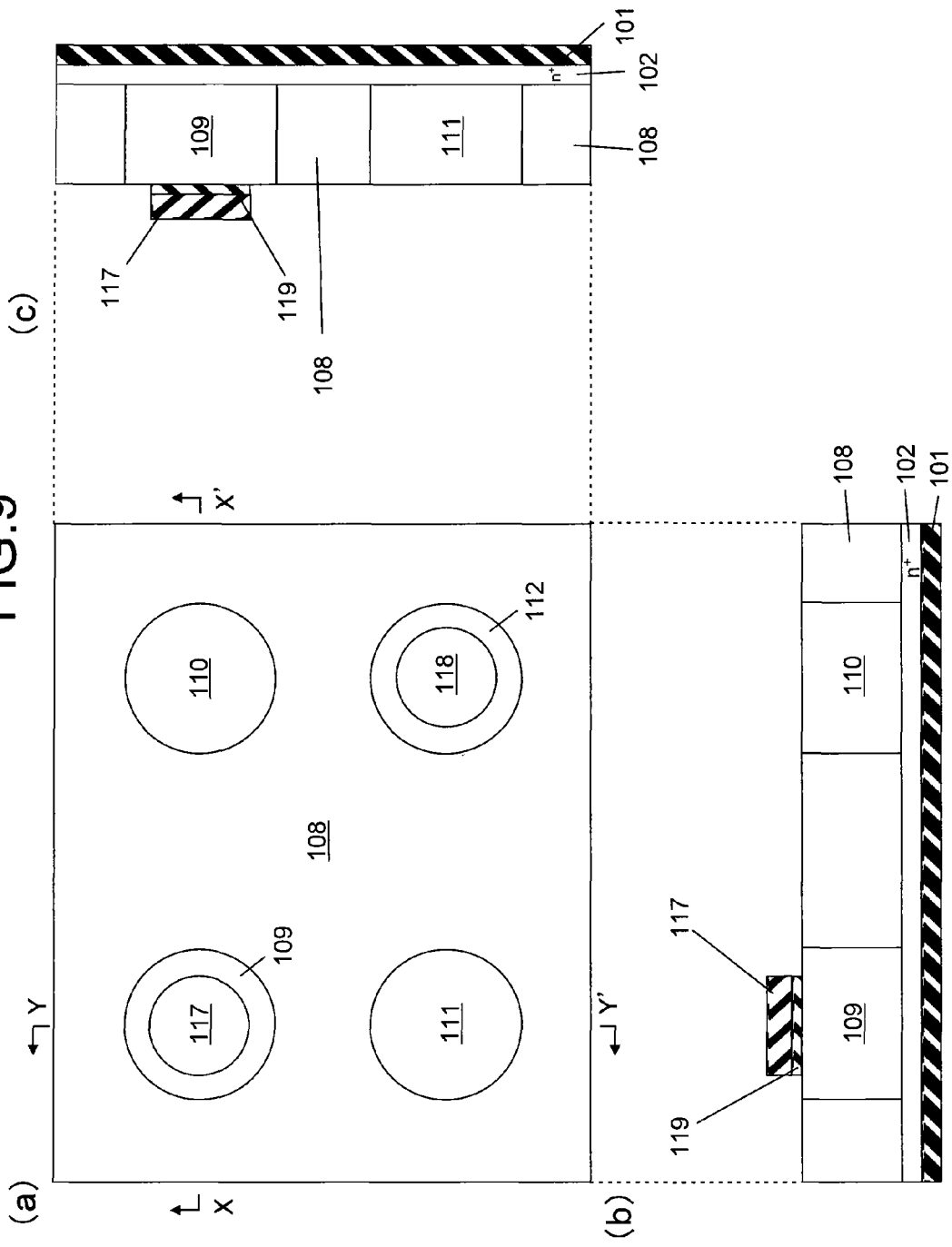
FIG. 9 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 9, the resists 115 and 116 are removed.

Figure 10:
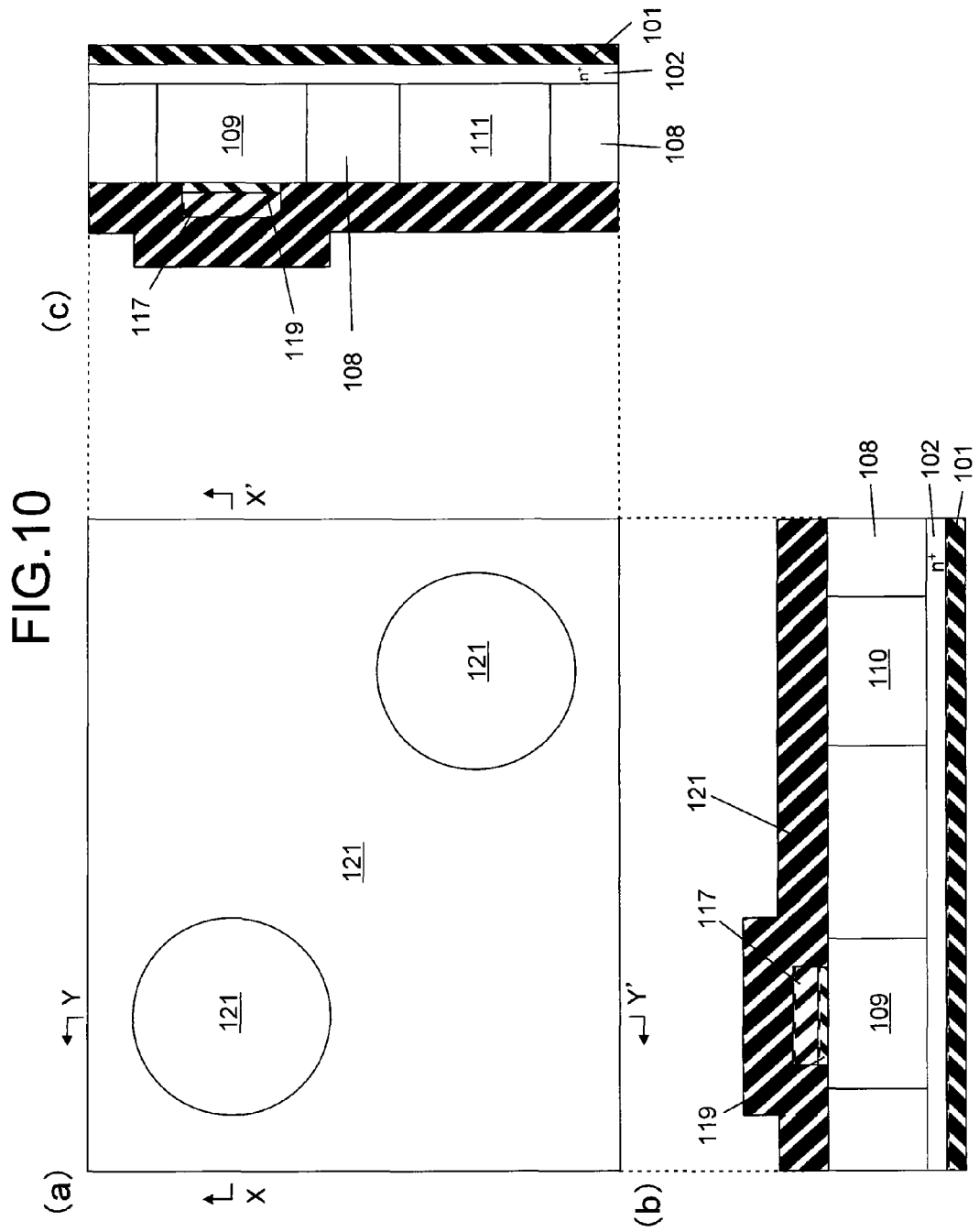
FIG. 10 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 10, an oxide film 121 is deposited so as to cover the oxide film hard mask 119, the nitride film hard mask 117 and the silicon layer 108.

Figure 11:
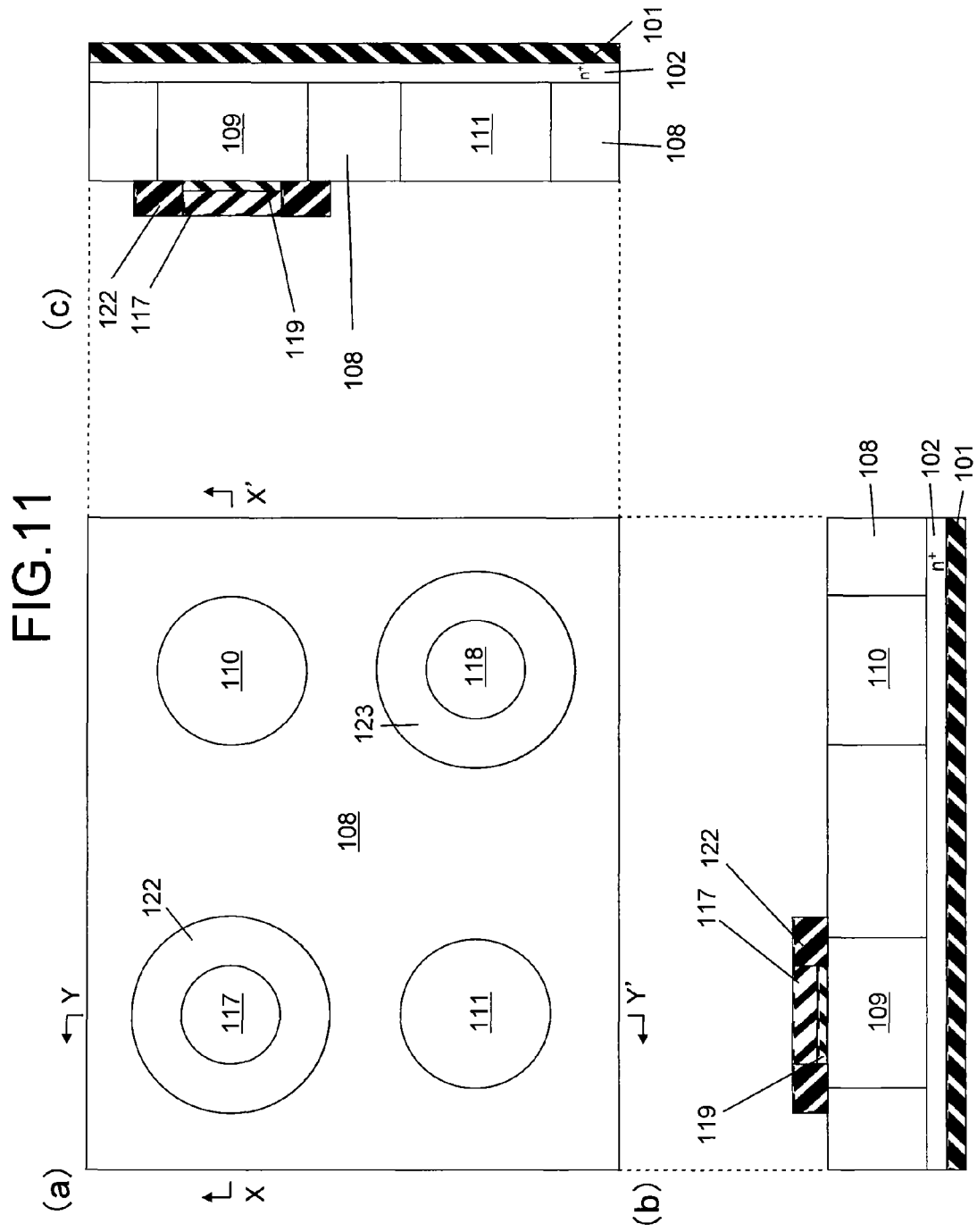
FIG. 11 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 11, oxide film sidewalls 122 and 123 are formed by etching the oxide film 121 so as to remain on the periphery of the oxide film hard mask 119 and the nitride film hard mask 117, respectively, on the silicon layers 109 and 112.

Figure 12:
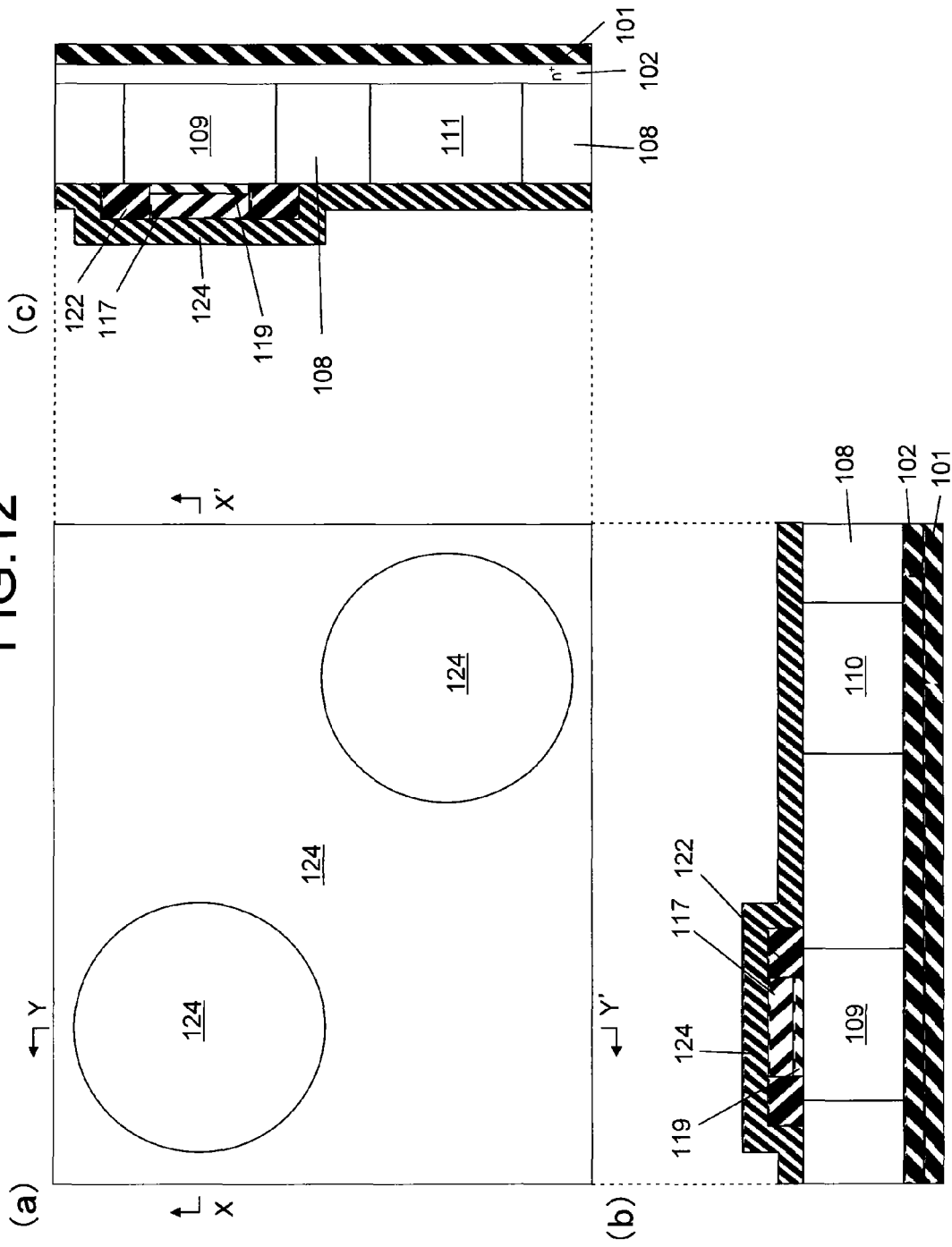
FIG. 12 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 12, a nitride film 124 is deposited so as to cover the oxide film hard mask 119, the nitride film hard mask 117, the oxide film sidewalls 122 and 123 and the silicon layer 108.

Figure 13:
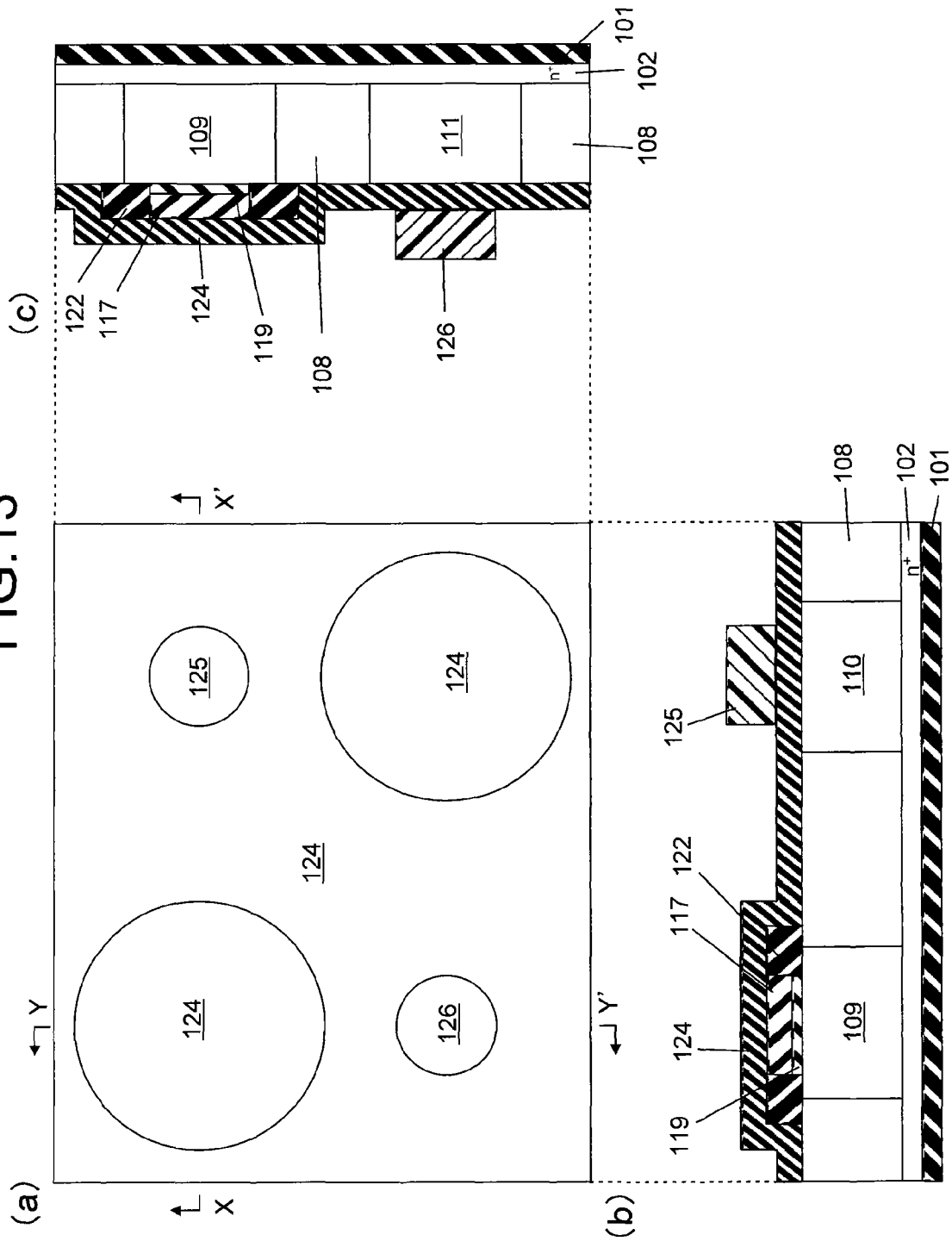
FIG. 13 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 13, resists 125 and 126 for forming silicon column structures that become island-shaped silicon layers are formed on the silicon layers 110 and 111, respectively.

Figure 14:
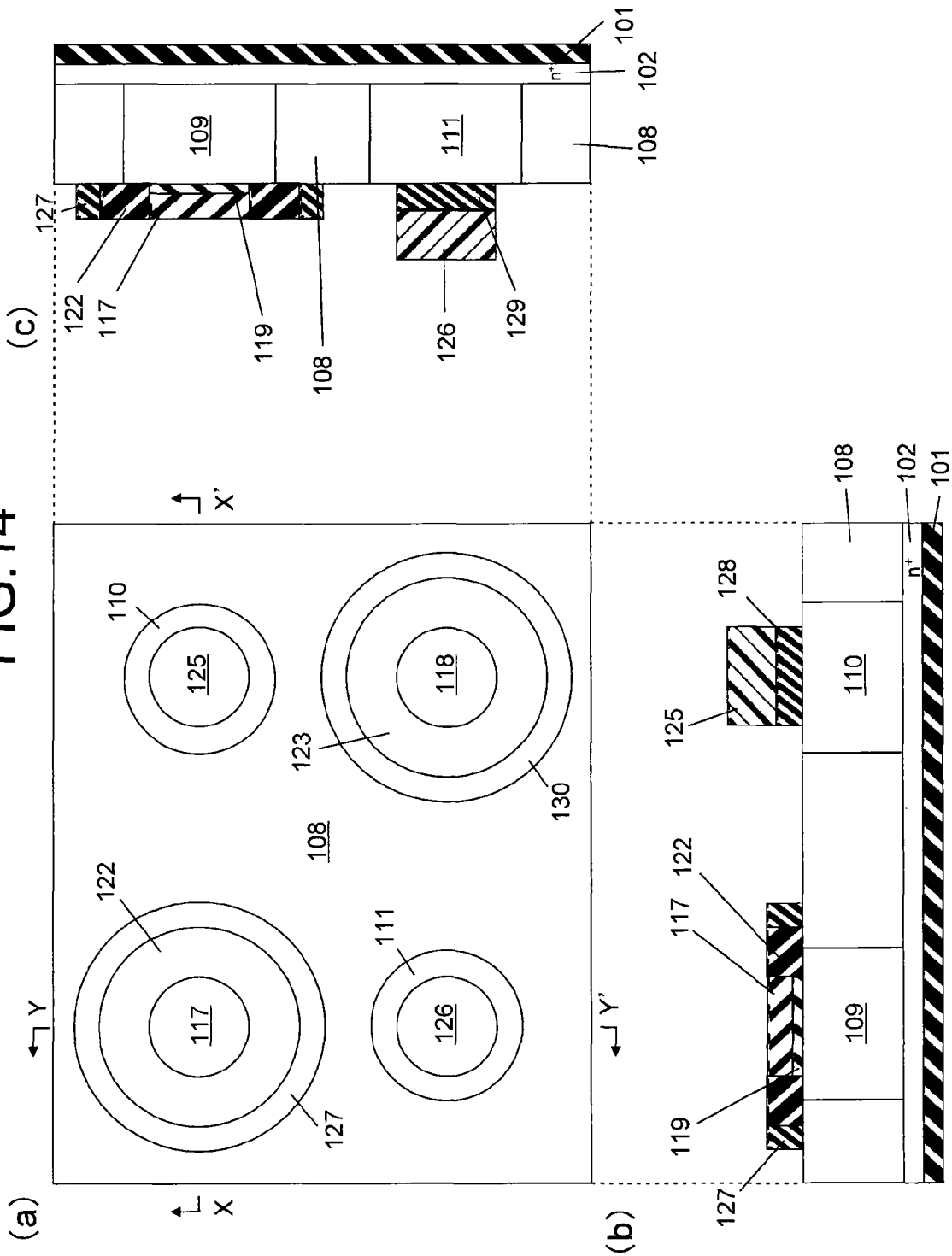
FIG. 14 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 14, by etching the nitride film 124 using the resists 125 and 126 as masks, nitride film hard masks 127 and 130 are formed so as to surround the periphery of the oxide film sidewalls 122 and 123, and nitride film hard masks 128 and 129 are formed on the silicon layers 110 and 111.

Figure 15:
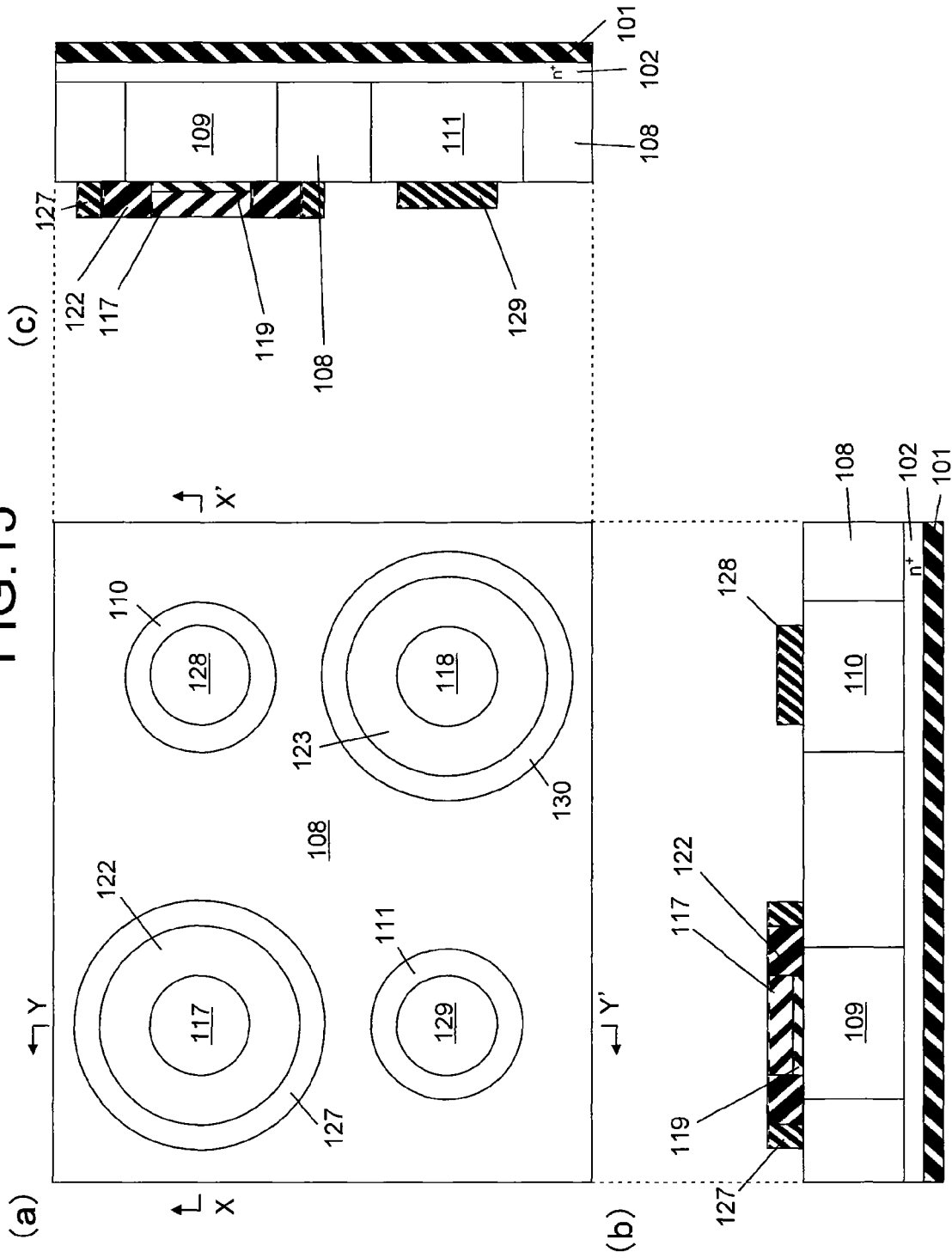
FIG. 15 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 15, the resists 125 and 126 are removed.

Figure 16:
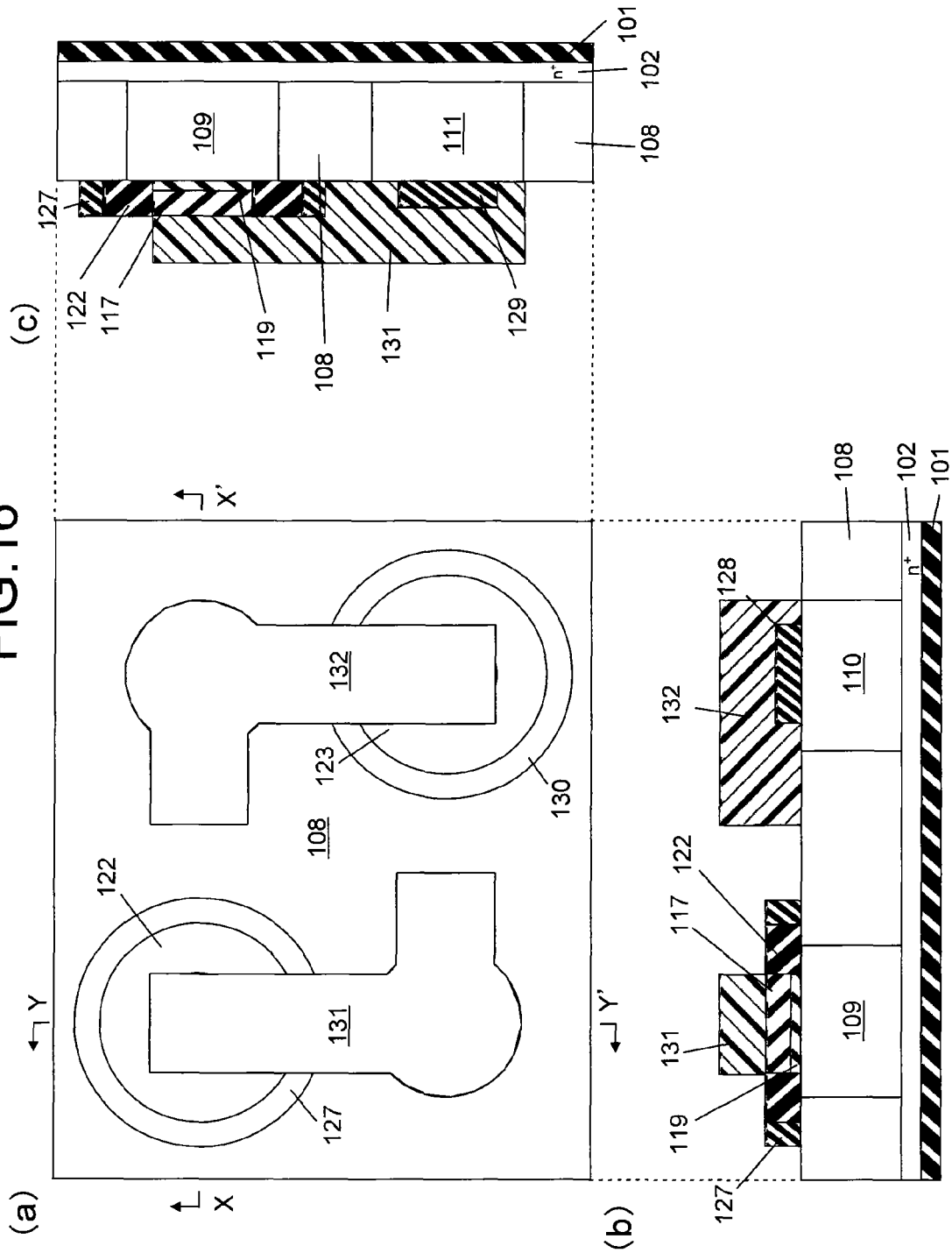
FIG. 16 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 16, L-shaped resists 131 and 132 for scattering layer wiring are formed at prescribed positions on the silicon layer 108 so as to respectively connect regions on the silicon layer 109 and the silicon layer 111, and regions on the silicon layer 111 and the silicon layer 112.

Figure 17:
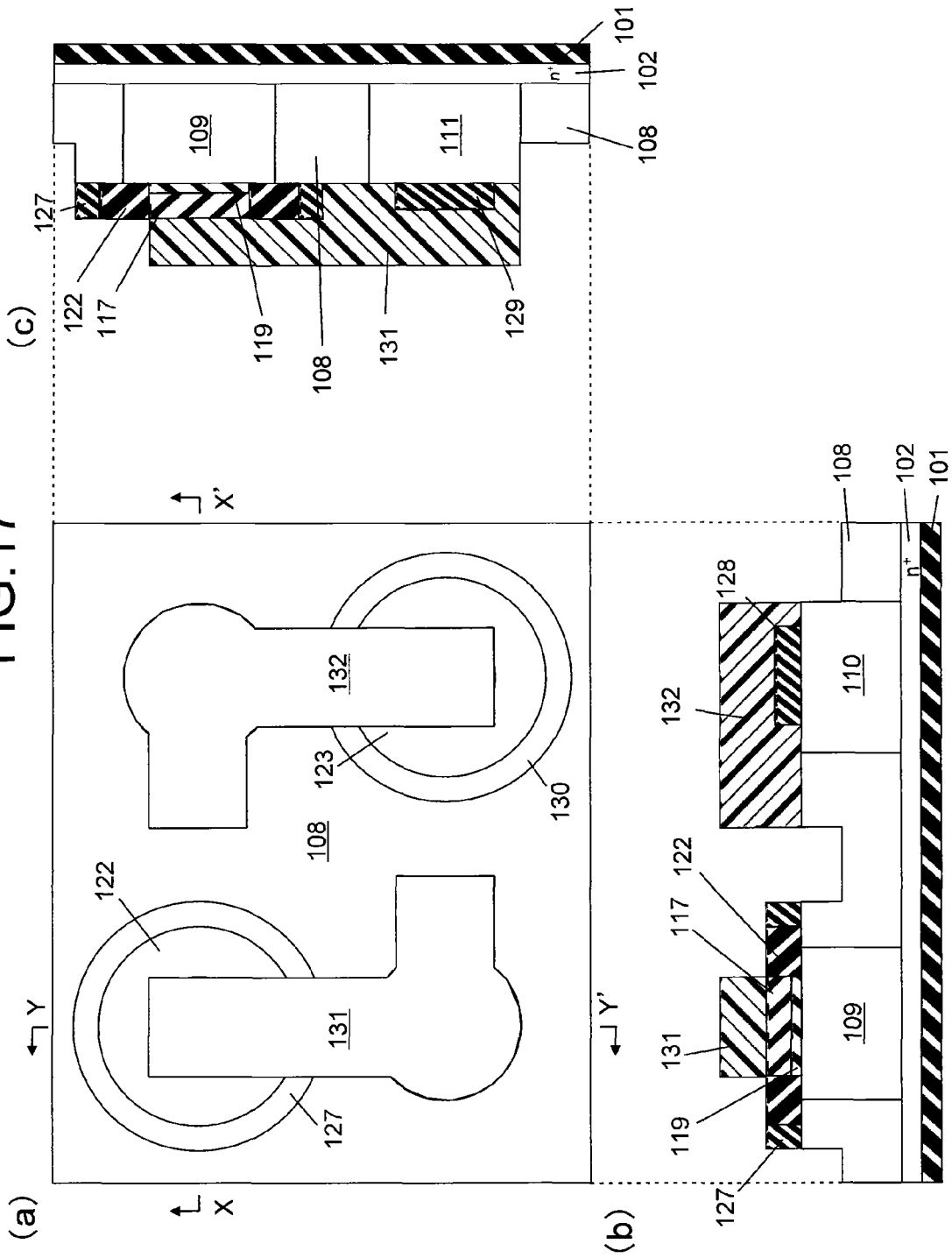
FIG. 17 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 17, the silicon layer 108 is etched using the resists 131 and 132 as masks to form scattering layer wiring to respectively connect regions on the silicon layer 109 and the silicon layer 111, and regions on the silicon layer 111 and the silicon layer 112.

Figure 18:
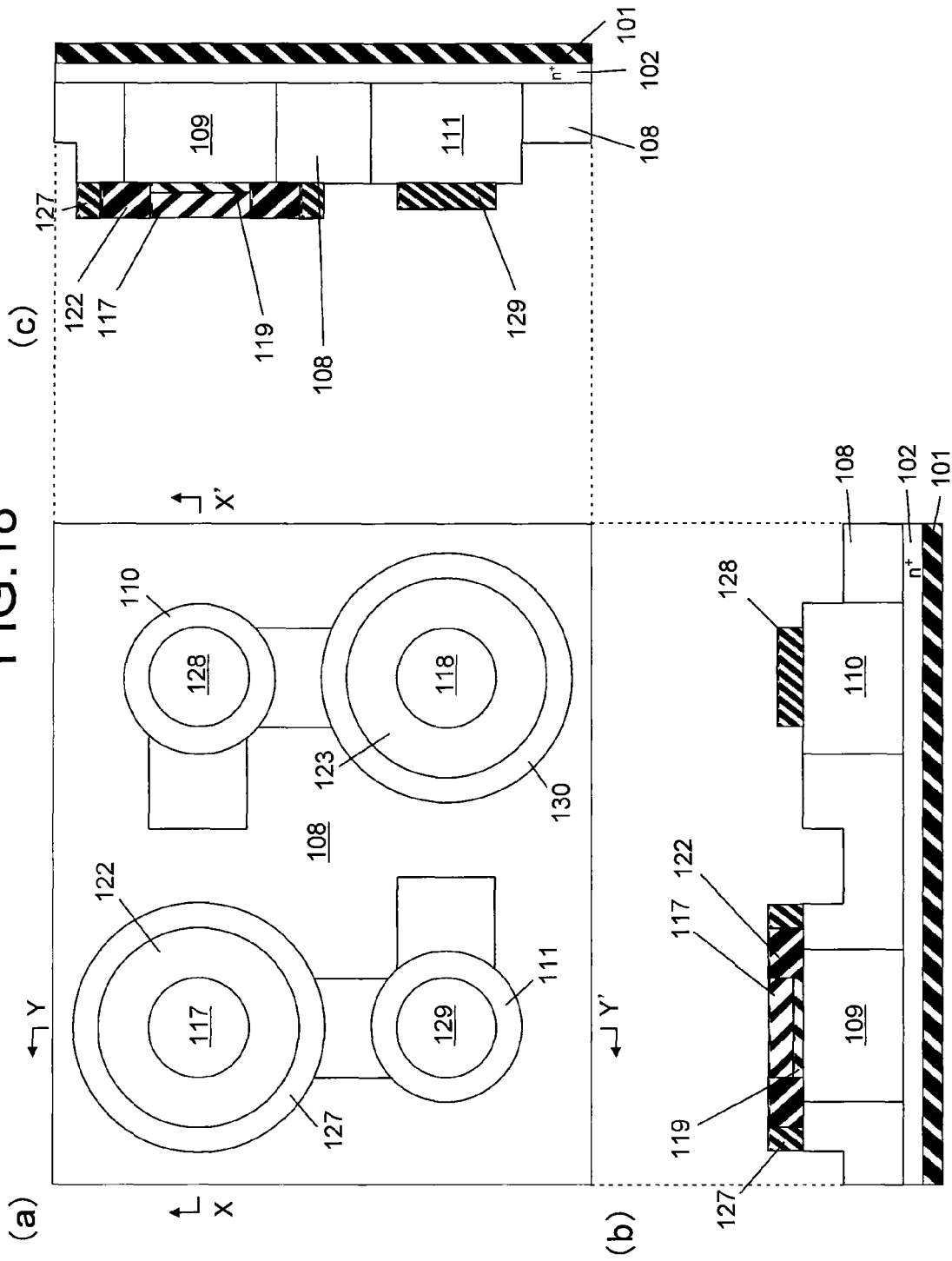
FIG. 18 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 18, the resists 131 and 132 are removed.

Figure 19:
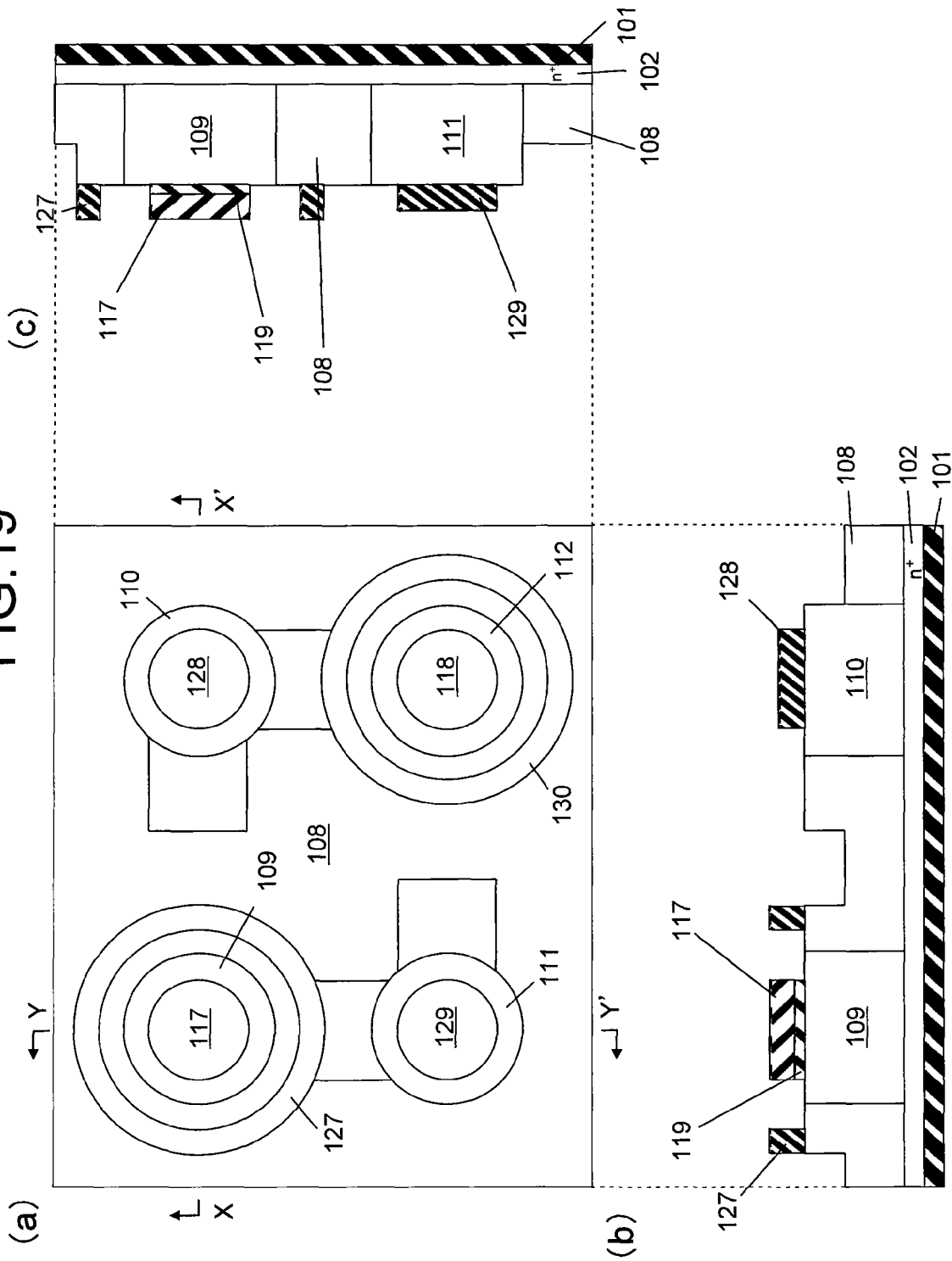
FIG. 19 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 19, the oxide film sidewalls 122 and 123 on the silicon layers 109 and 112 are removed through etching.

Figure 20:
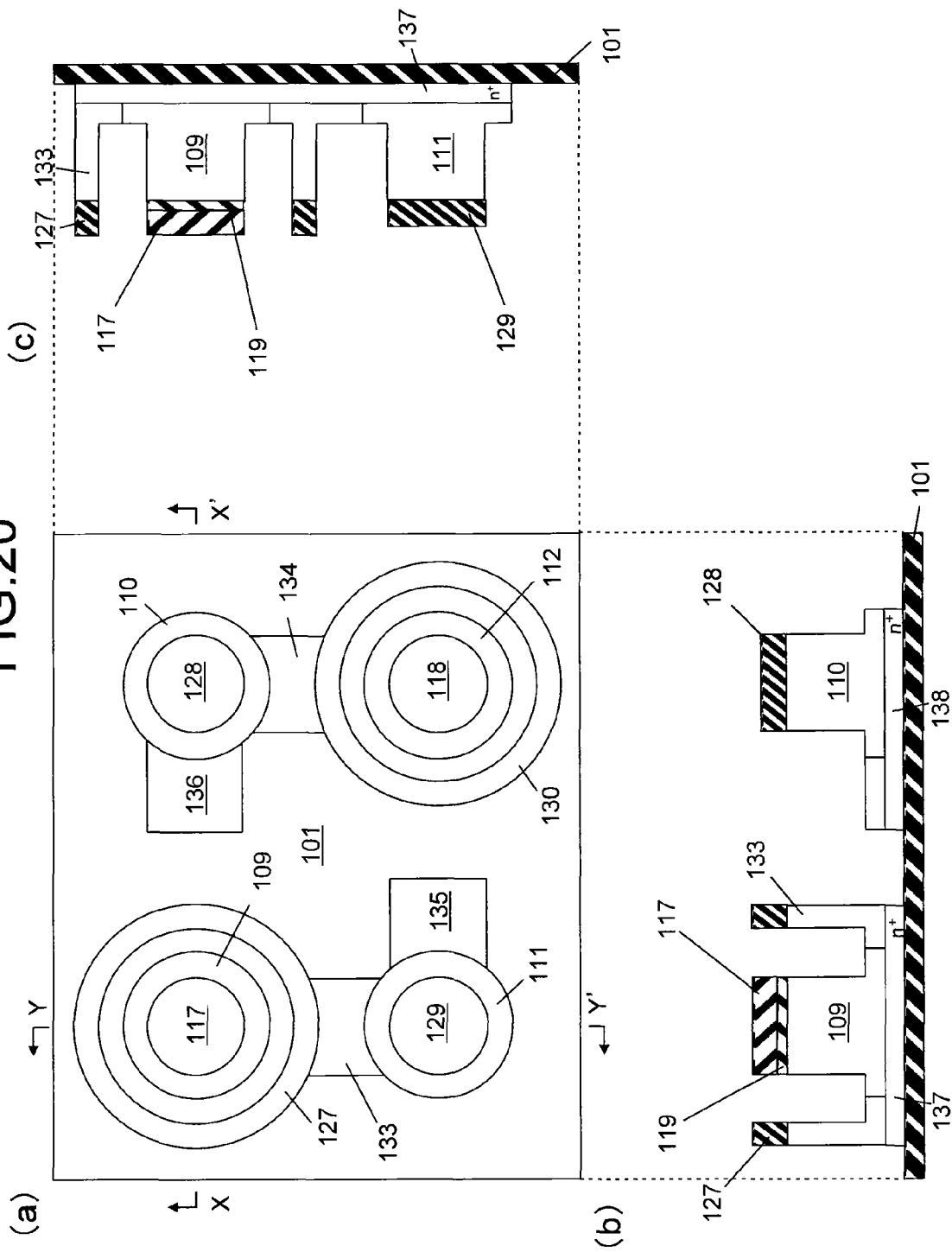
FIG. 20 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 20, the silicon layer 108 is etched using the nitride film hard masks 117, 118, 127, 128, 129 and 130 as masks to form on the oxide film 101 the first through fourth island-shaped silicon layers 109, 110, 111 and 112, the first and second columnar silicon layers 133 and 134, the n type or non-doped silicon layers 135 and 136 and the n+ silicon layers 137 and 138 that become scattering layer wiring.

Figure 21:
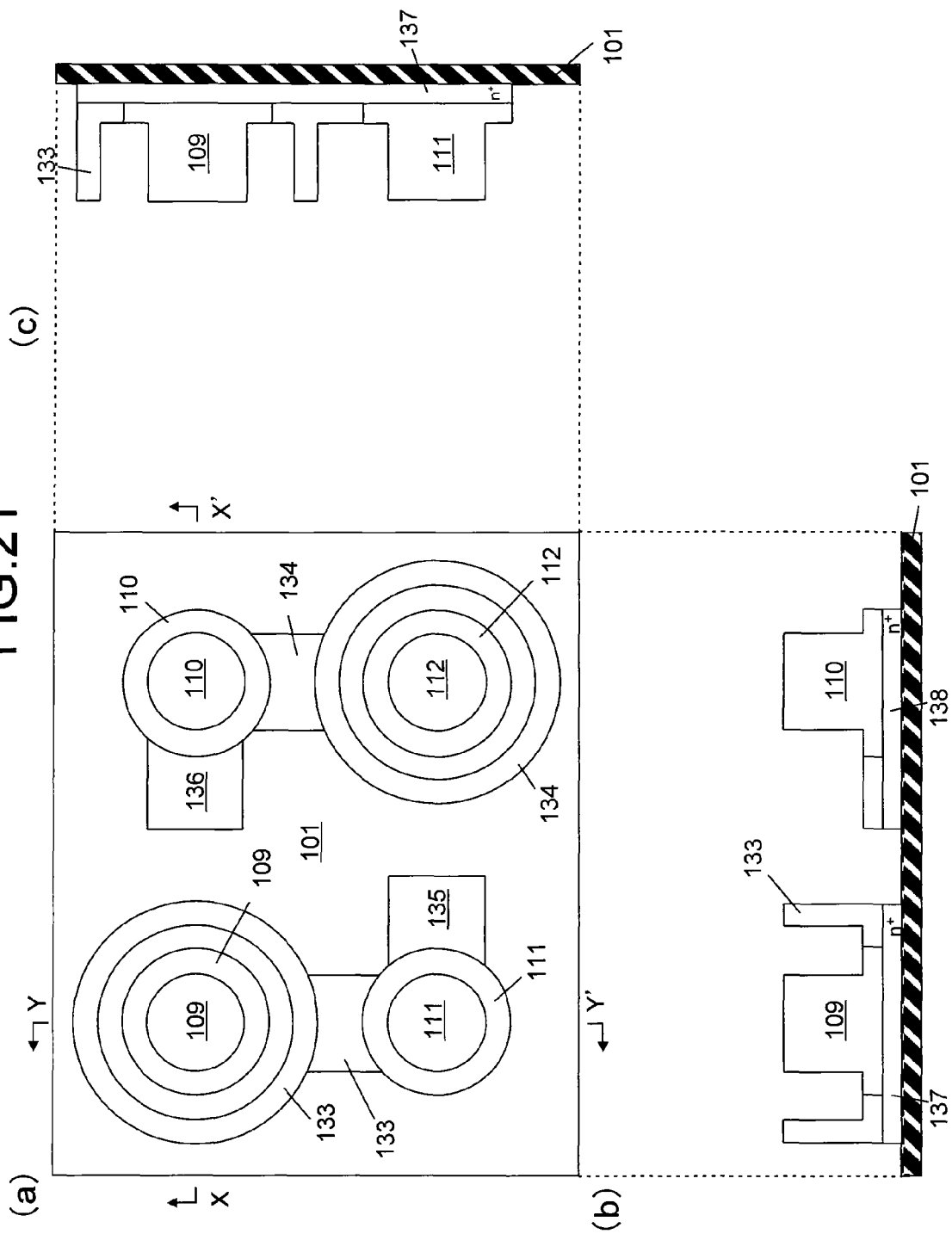
FIG. 21 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 21, the nitride film hard masks 117, 118, 127, 128, 129 and 130 and the oxide film 119 are removed by etching.

Figure 22:
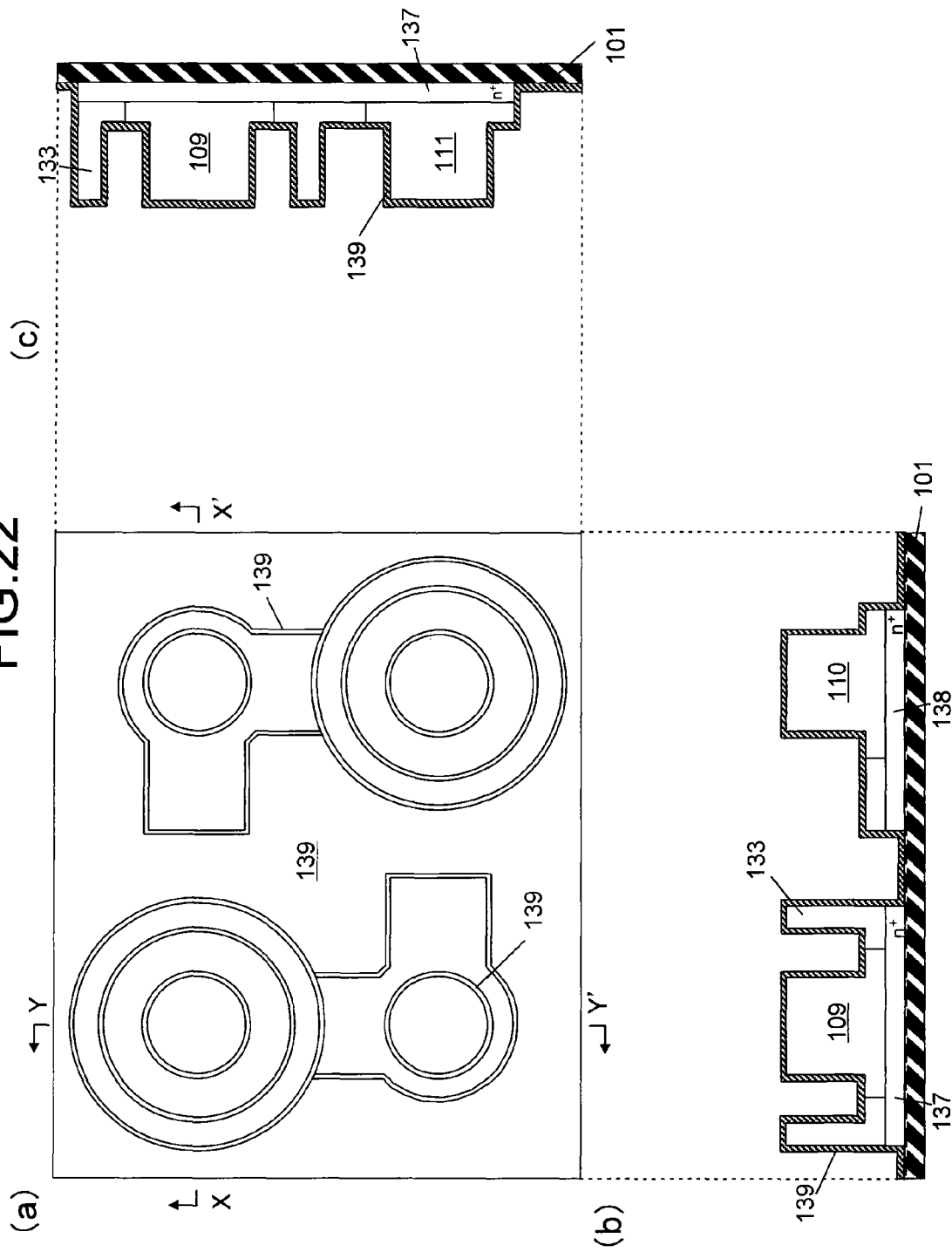
FIG. 22 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 22, a nitride film 139 is deposited on the oxide film 101 so as to thinly cover the first and second columnar silicon layers 133 and 134, the silicon layers 109, 110, 111 and 112, the silicon layers 135 and 136 and the n+ silicon layers 137 and 138 with a uniform thickness.

Figure 23:
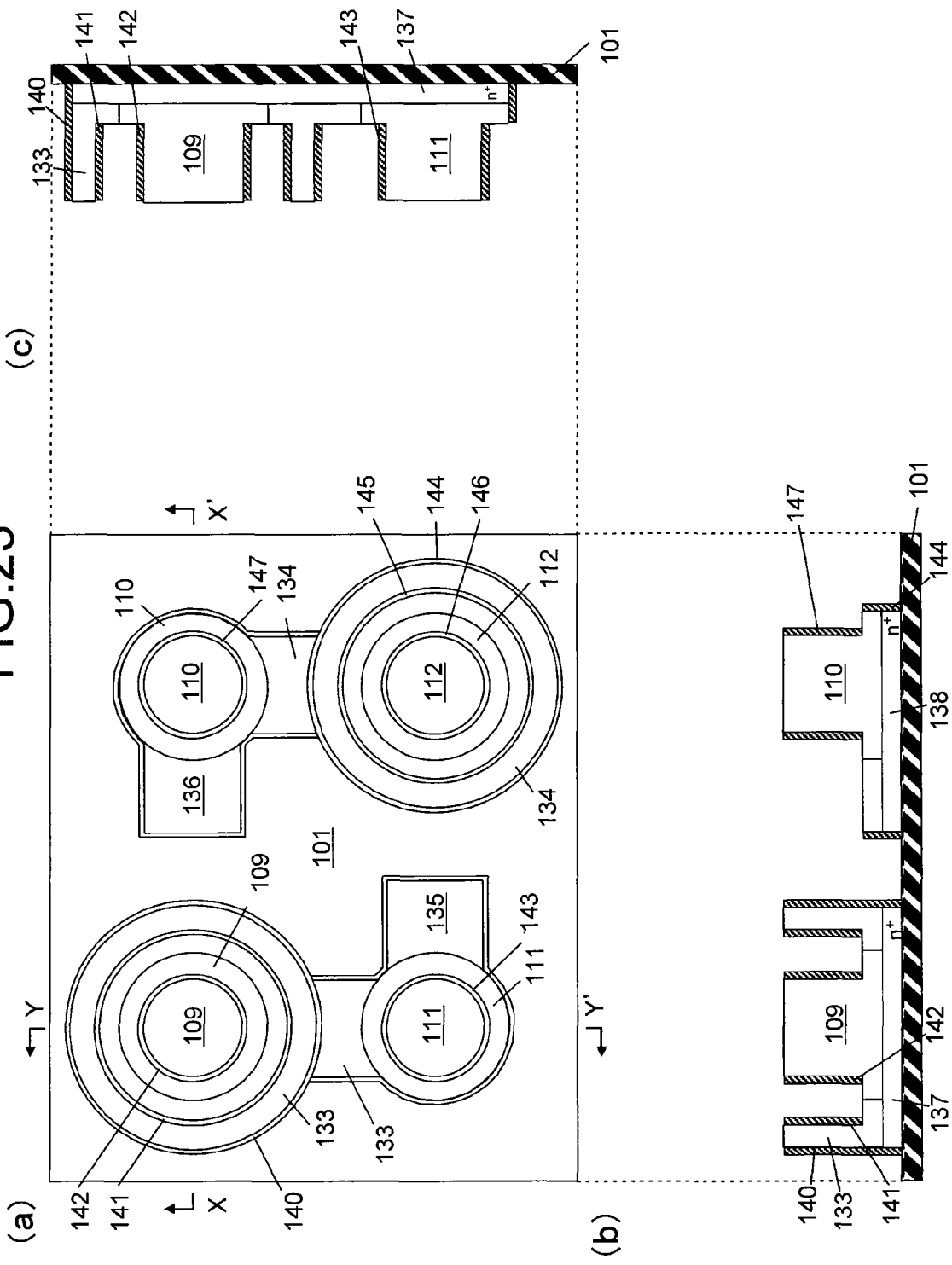
FIG. 23 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 23, the nitride film 139 is etched to form nitride film sidewalls 140, 141, 142, 143, 144, 145, 146 and 147 on the sidewalls of the first and second columnar silicon layers 133 and 134, the silicon layers 109, 110, 111 and 112 and the silicon layers 135 and 136.

Figure 24:
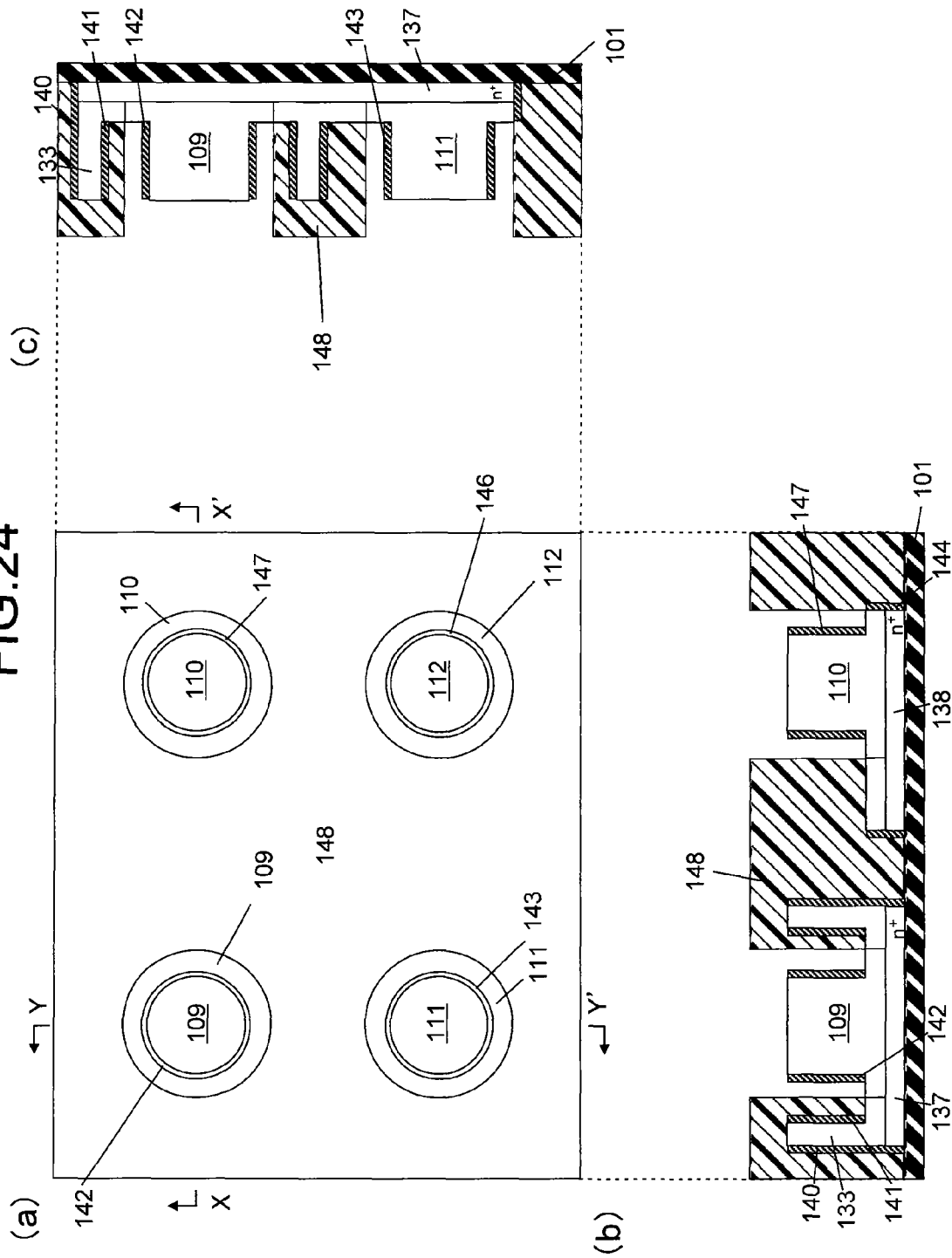
FIG. 24 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 24, a resist 148 for forming an n+ silicon layer is formed at a prescribed position on the oxide film 101 so as to expose the silicon layers 109, 110, 111 and 112 and a ring-shaped silicon layer surface around the periphery thereof.

Figure 25:
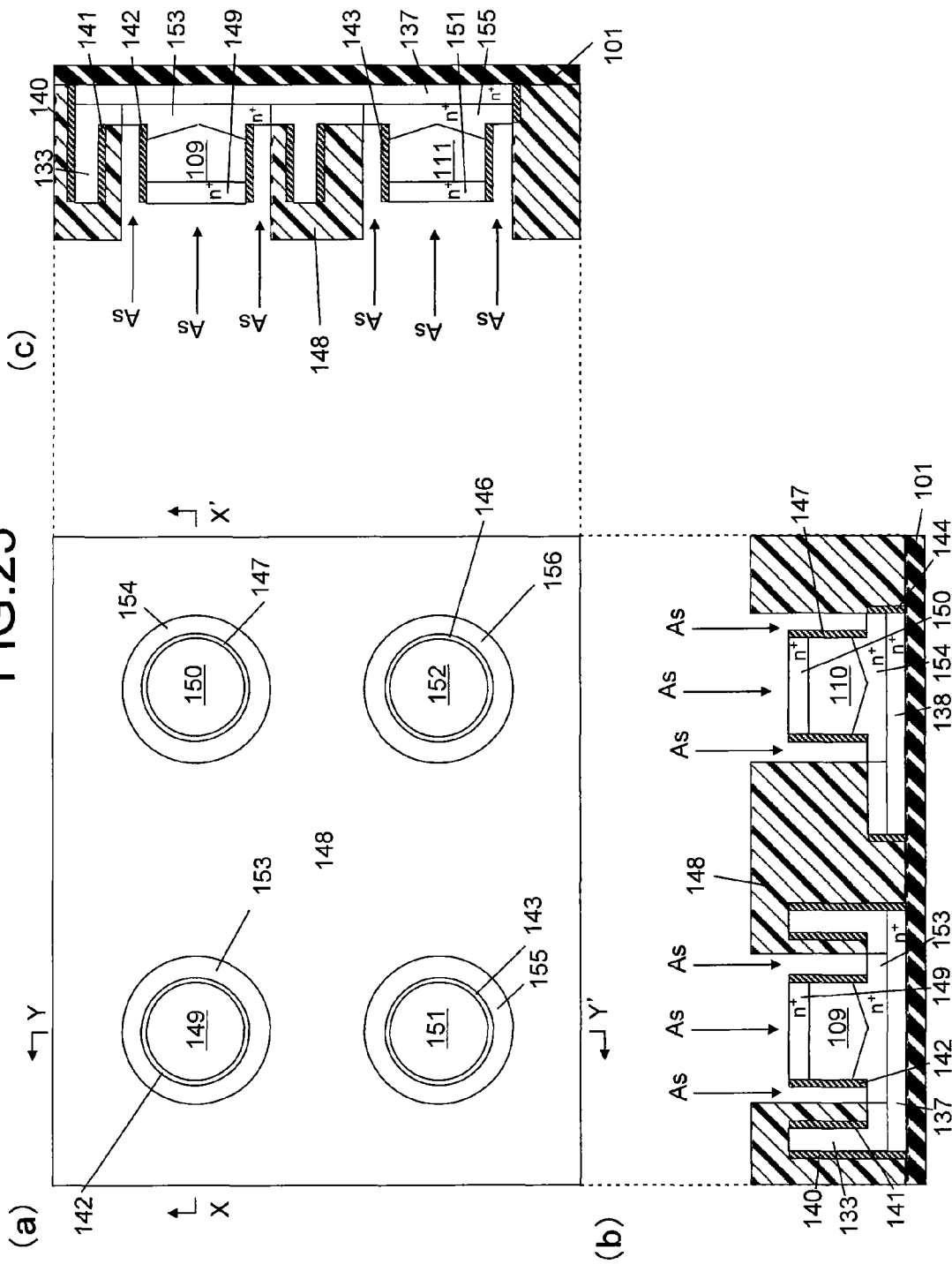
FIG. 25 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 25, arsenic (As) is implanted in the silicon layers 109, 110, 111 and 112 using the resist 148 as a mask to form n+ silicon layers 149, 153, 150, 154, 151, 155, 152 and 156.

Figure 26:
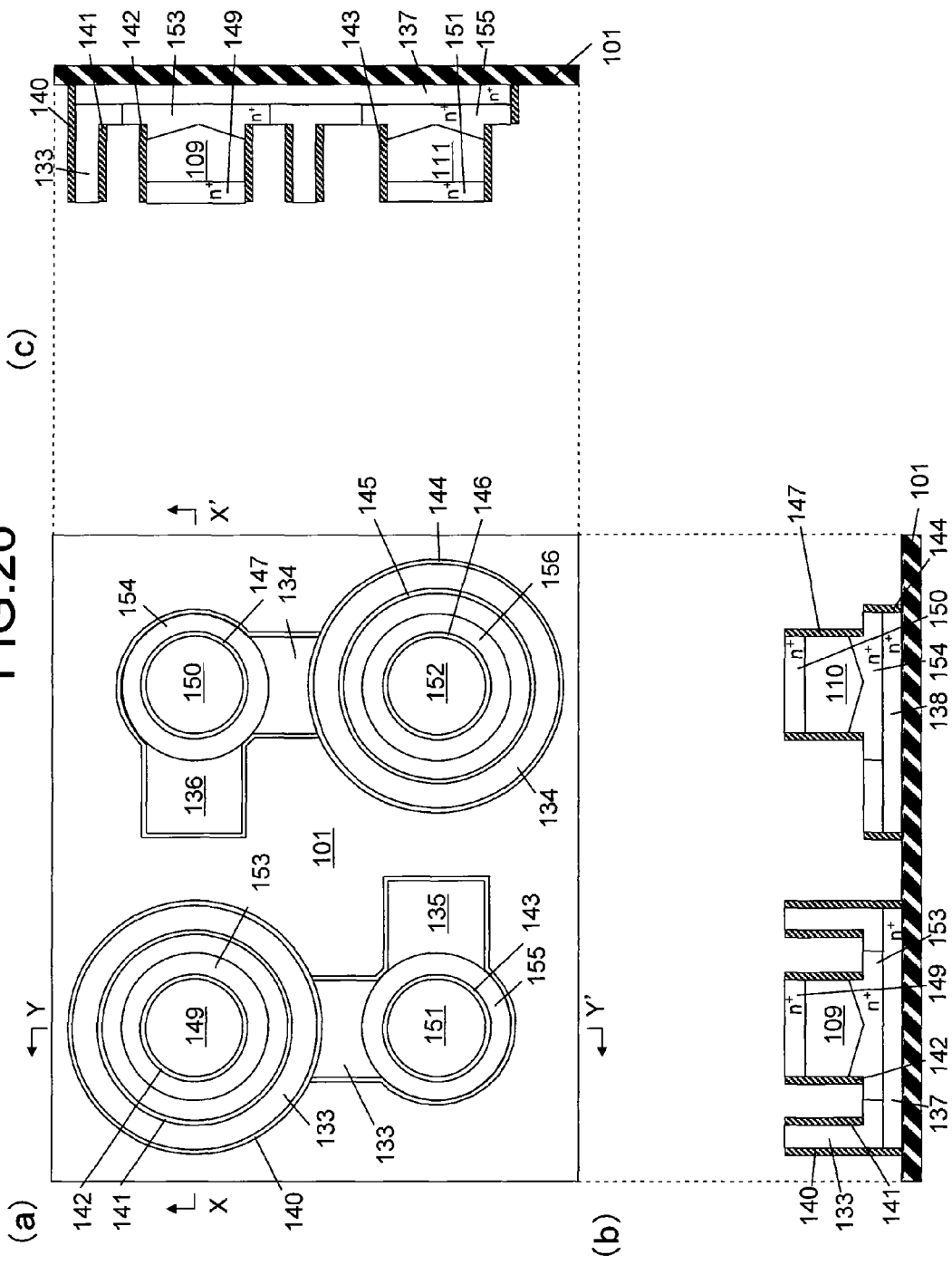
FIG. 26 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 26, the resist 148 is removed.

Figure 27:
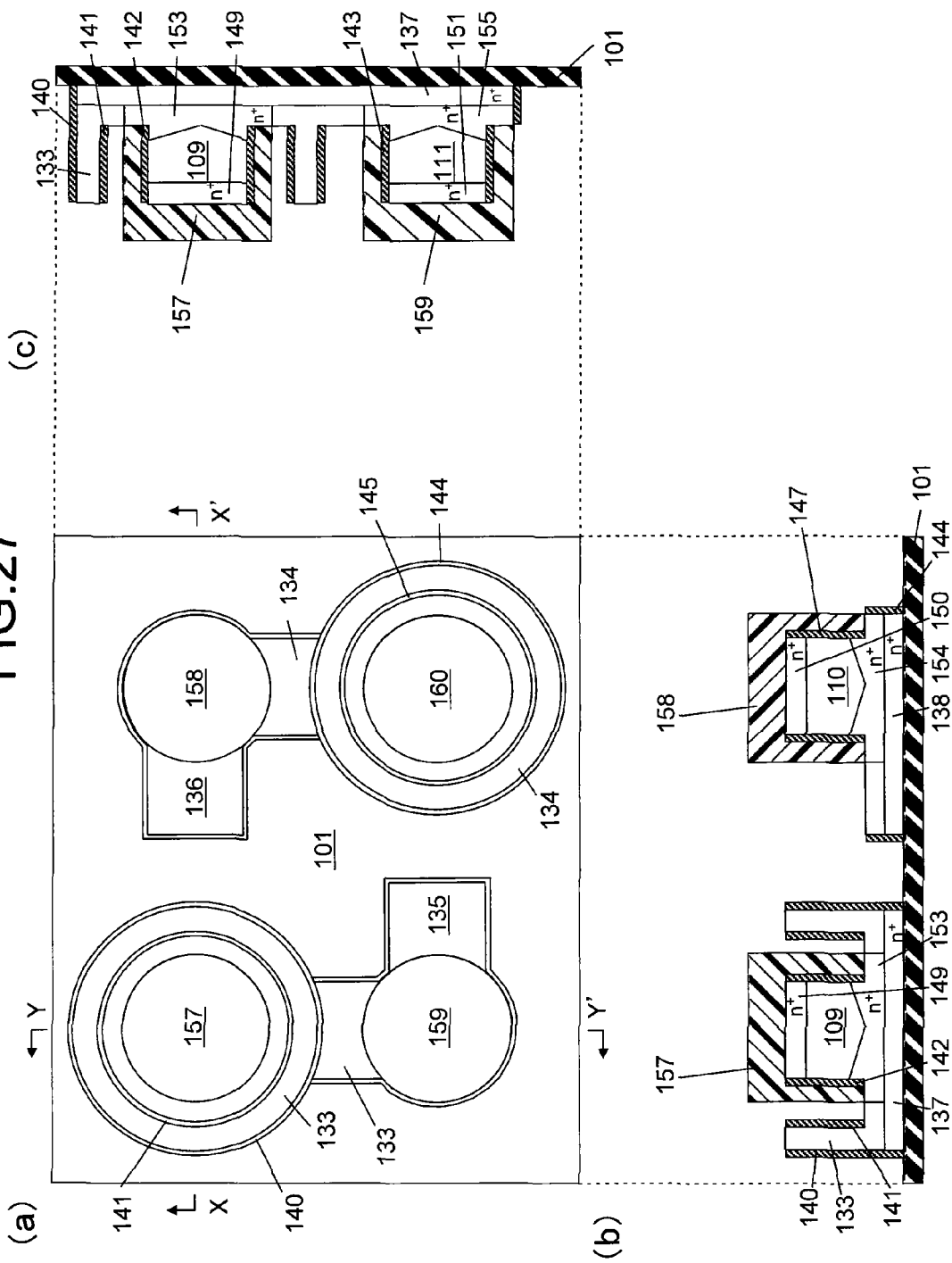
FIG. 27 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 27, resists 157, 158, 159 and 160 for forming a p+ silicon layer are formed so as to cover the silicon column structures the silicon layers 109, 110, 111 and 112 respectively have.

Figure 28:
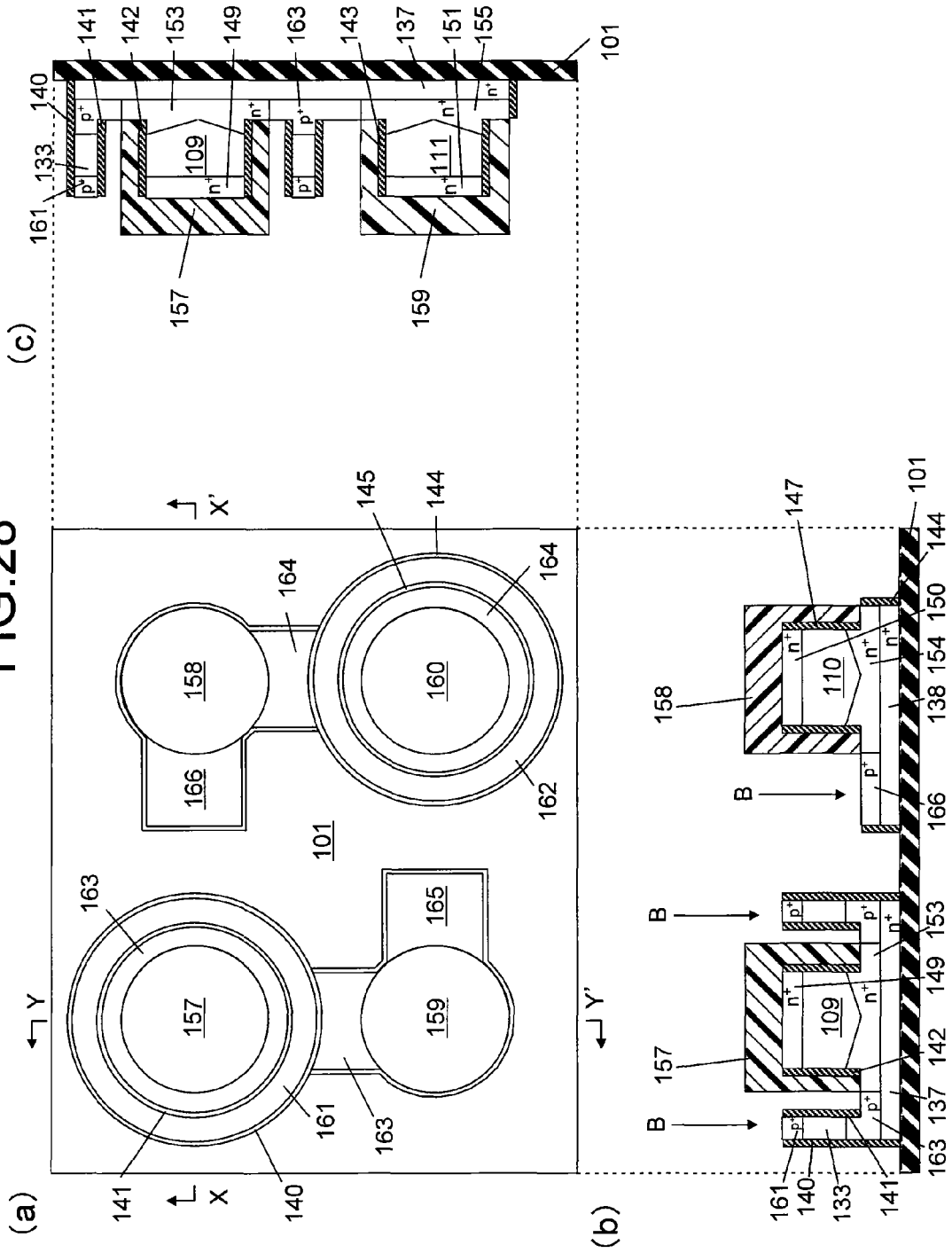
FIG. 28 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 28, boron (B) is implanted in the silicon layers containing the first and second columnar silicon layers 133 and 134 to form p+ silicon layers 161, 162, 163, 164, 165 and 166.

Figure 29:
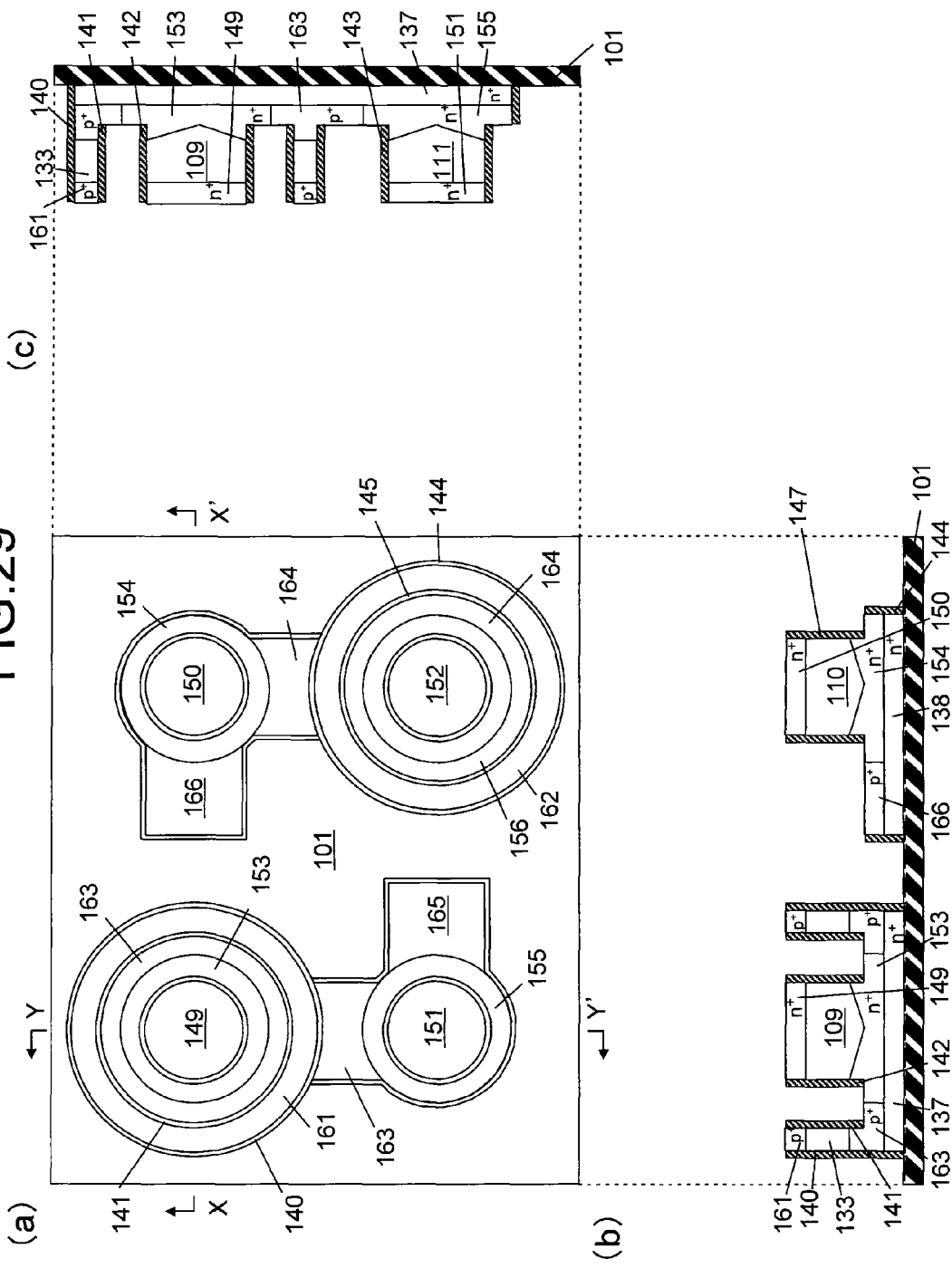
FIG. 29 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 29, the resists 157, 158, 159 and 160 are removed.

Next, referring to FIG. 30, oxide films 167, 168 and 169 are deposited in a space formed between the silicon layers 109, 110, 111, 112 and the first and second columnar silicon layers 133 and 134 and are then planarized by CMP (Chemical Mechanical Polishing).

Figure 31:
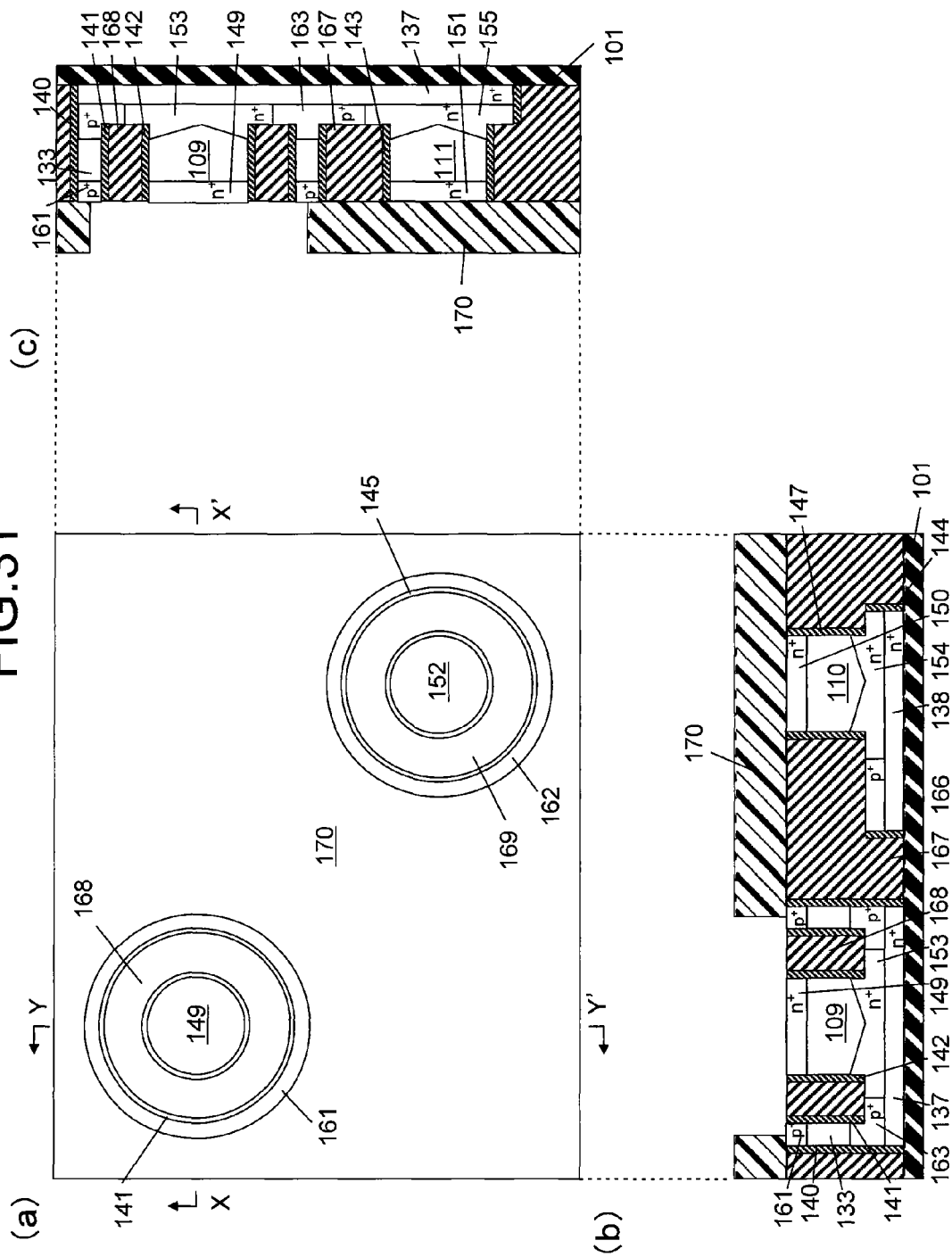
FIG. 31 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 31, a resist 170 for etching a gate part is formed so as to expose the inner circumference of the circular surface of the p+ type silicon layers 161 and 162, the n+ type silicon layers 149 and 152 and the oxide films 168 and 169.

Figure 32:
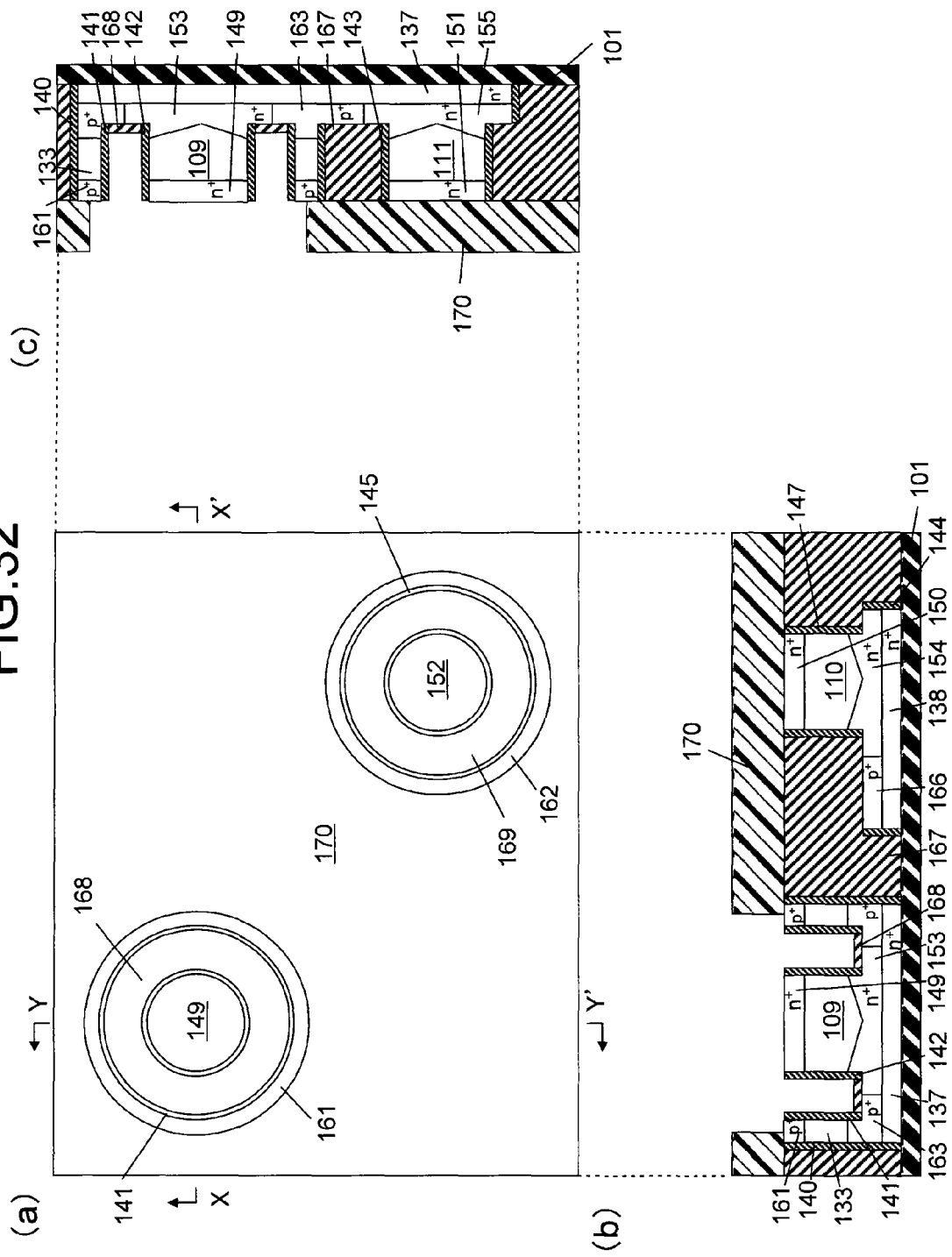
FIG. 32 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 32, the oxide films 168 and 169 are removed through etching.

Next, referring to FIG. 33, the resist 170 is removed.

Figure 34:
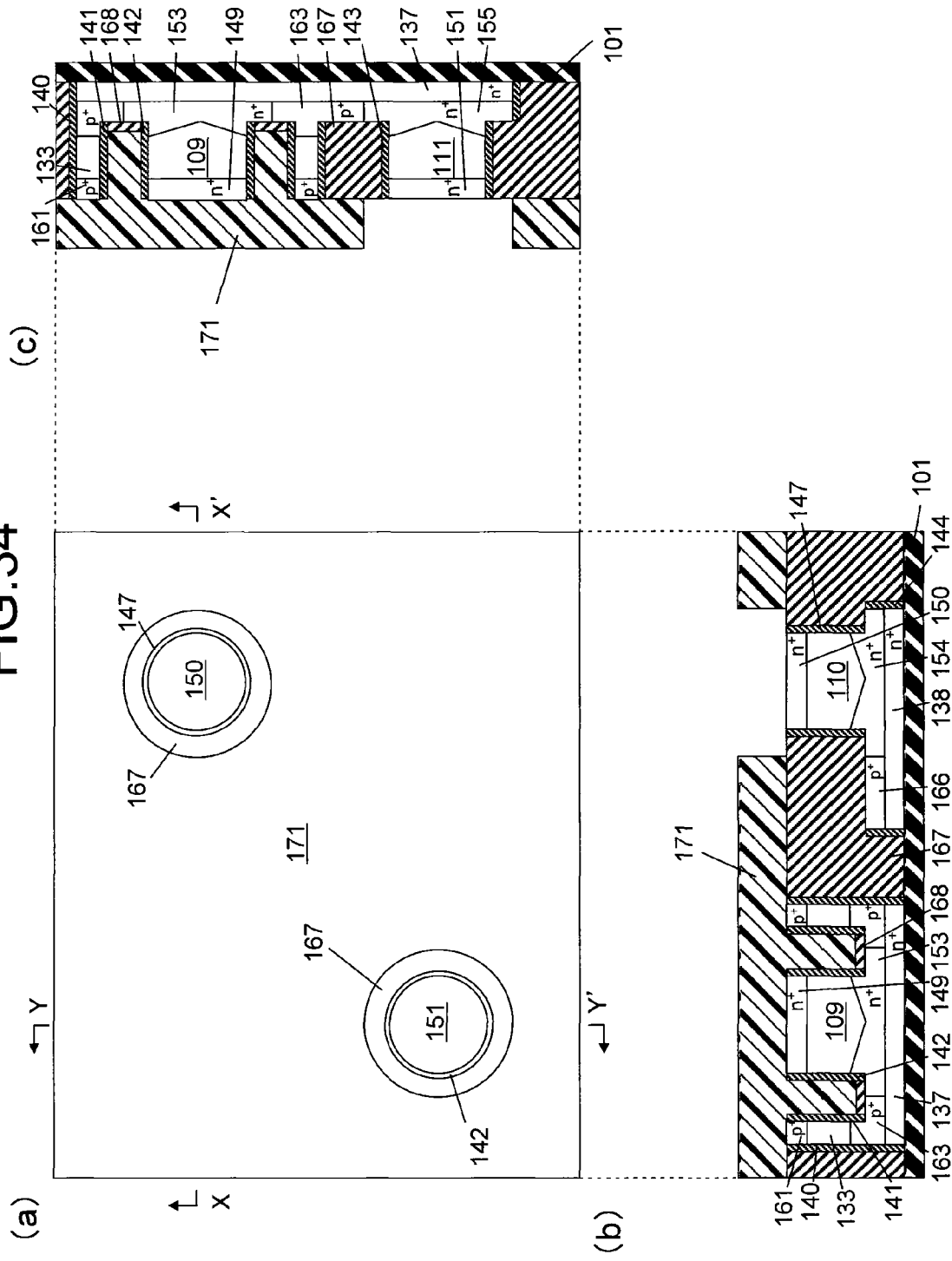
FIG. 34 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 34, a resist 171 for etching a gate part is formed so as to expose the n+ type silicon layers 150 and 151 and the oxide film 167 on the outer circumference thereof.

Next, referring to FIG. 35, the oxide film 167 on the outer circumference of the n+ type silicon layers 150 and 151 is etched.

Next, referring to FIG. 36, the resist 171 is removed.

Figure 37:
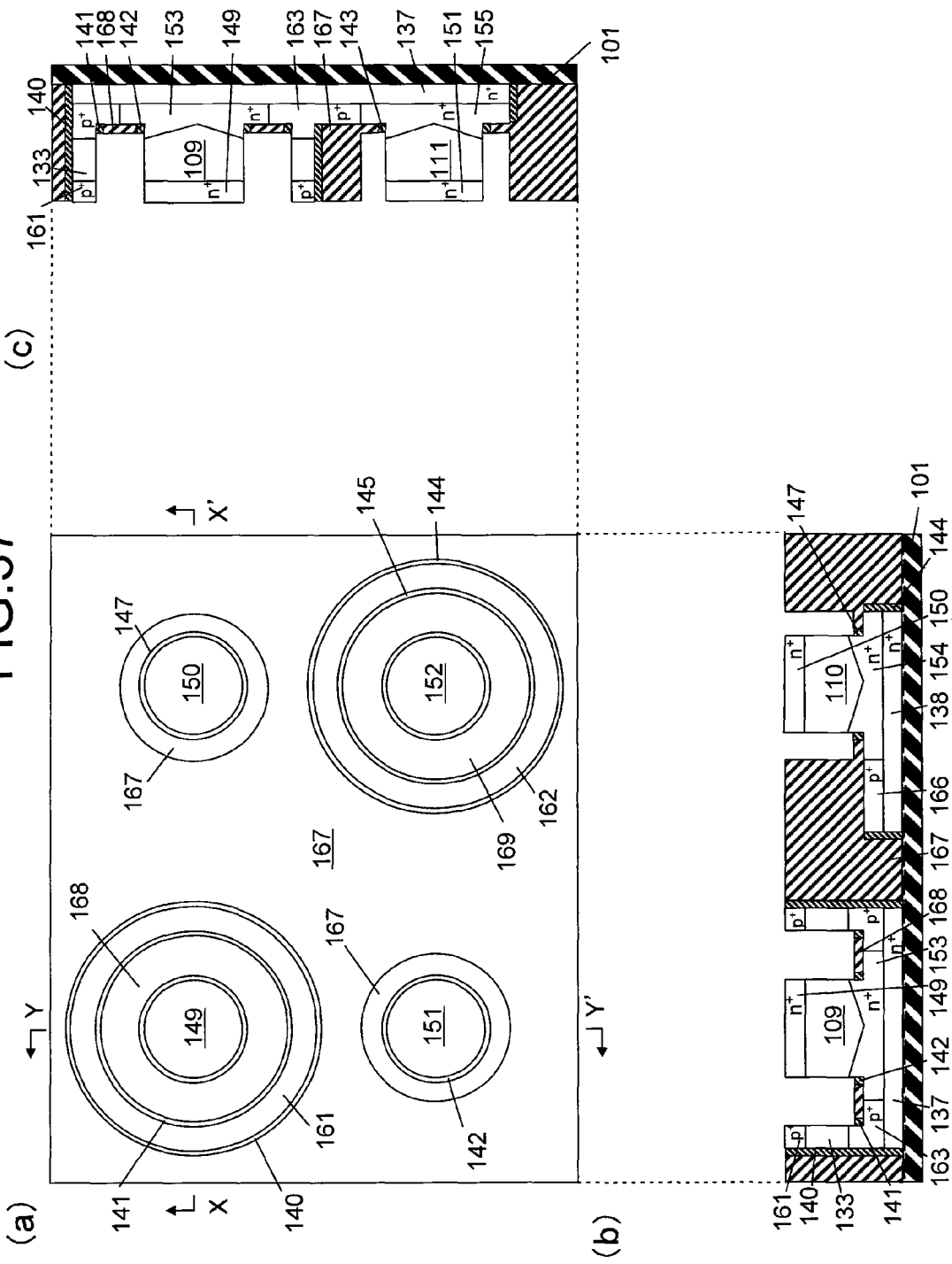
FIG. 37 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 37, the nitride film sidewalls 141, 142, 143, 145, 146 and 147 are etched, exposing the sidewalls of the first through fourth island-shaped silicon layers 109, 110, 111 and 112 and the inner walls of the first and second columnar silicon layers 133 and 134.

Figure 38:
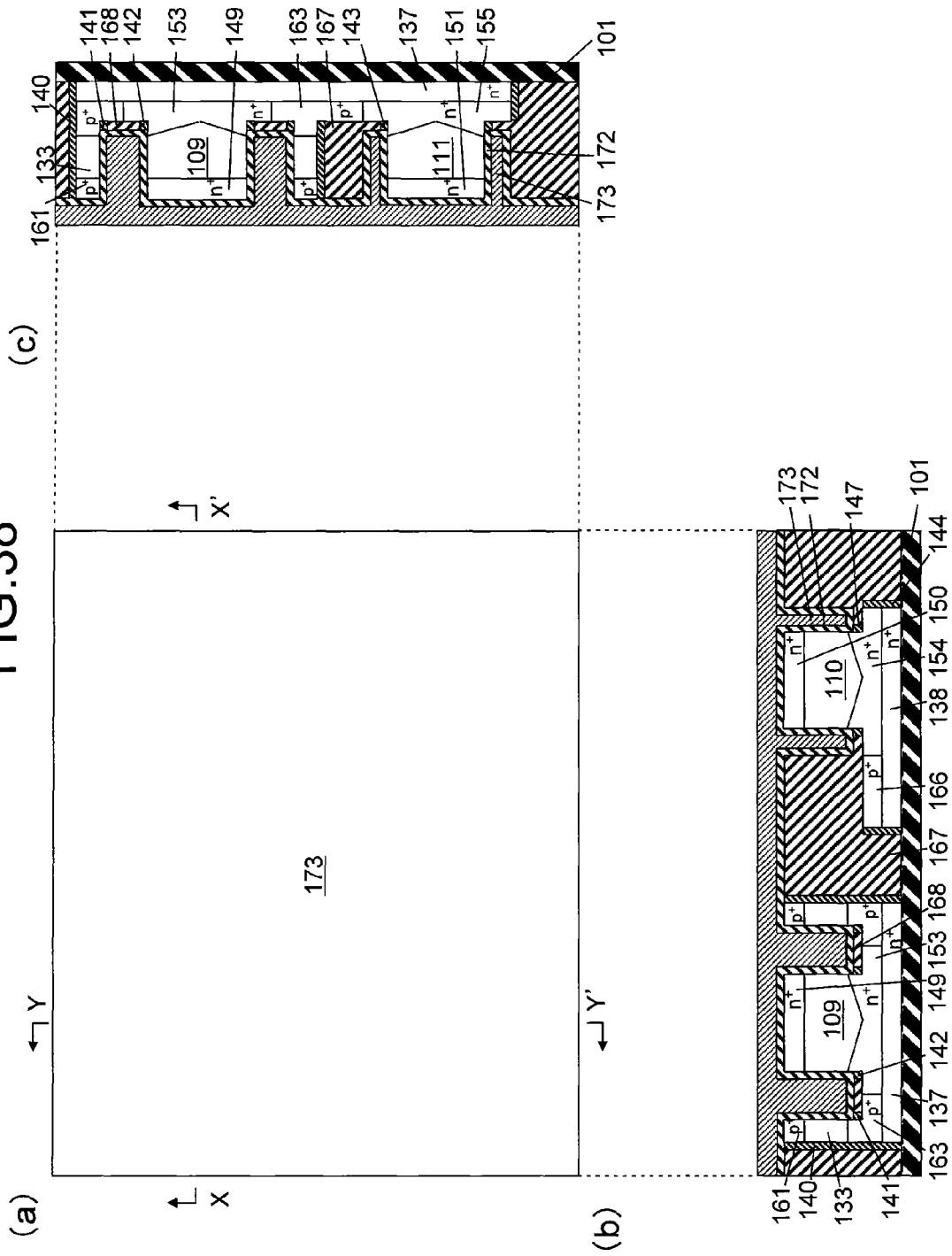
FIG. 38 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 38, a high-K film 172 is deposited so as to thinly cover with a uniform thickness the n+ type silicon layers 149, 150, 151 and 152 and the surface of structures containing indentations on the periphery of these, and a metal 173 is then deposited so as to completely bury the indentations on the periphery of the n+ type silicon layers 149, 150, 151 and 152.

Figure 39:
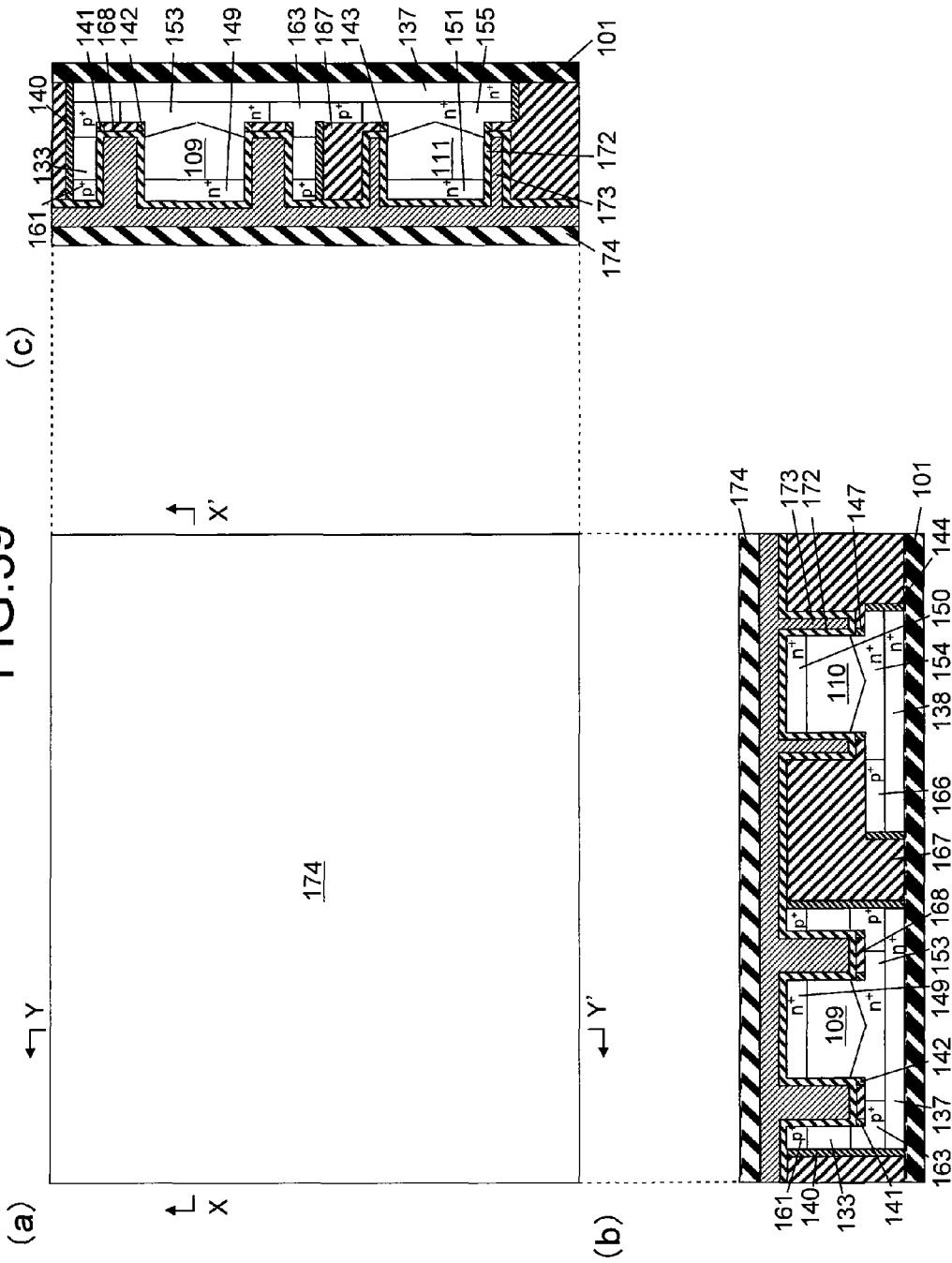
FIG. 39 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 39, a nitride film 174 is deposited from above the metal 173.

Next, referring to FIG. 40, resists 175, 176, 177 and 178 for forming a gate pad are formed at four prescribed positions on the nitride film 174.

Figure 41:
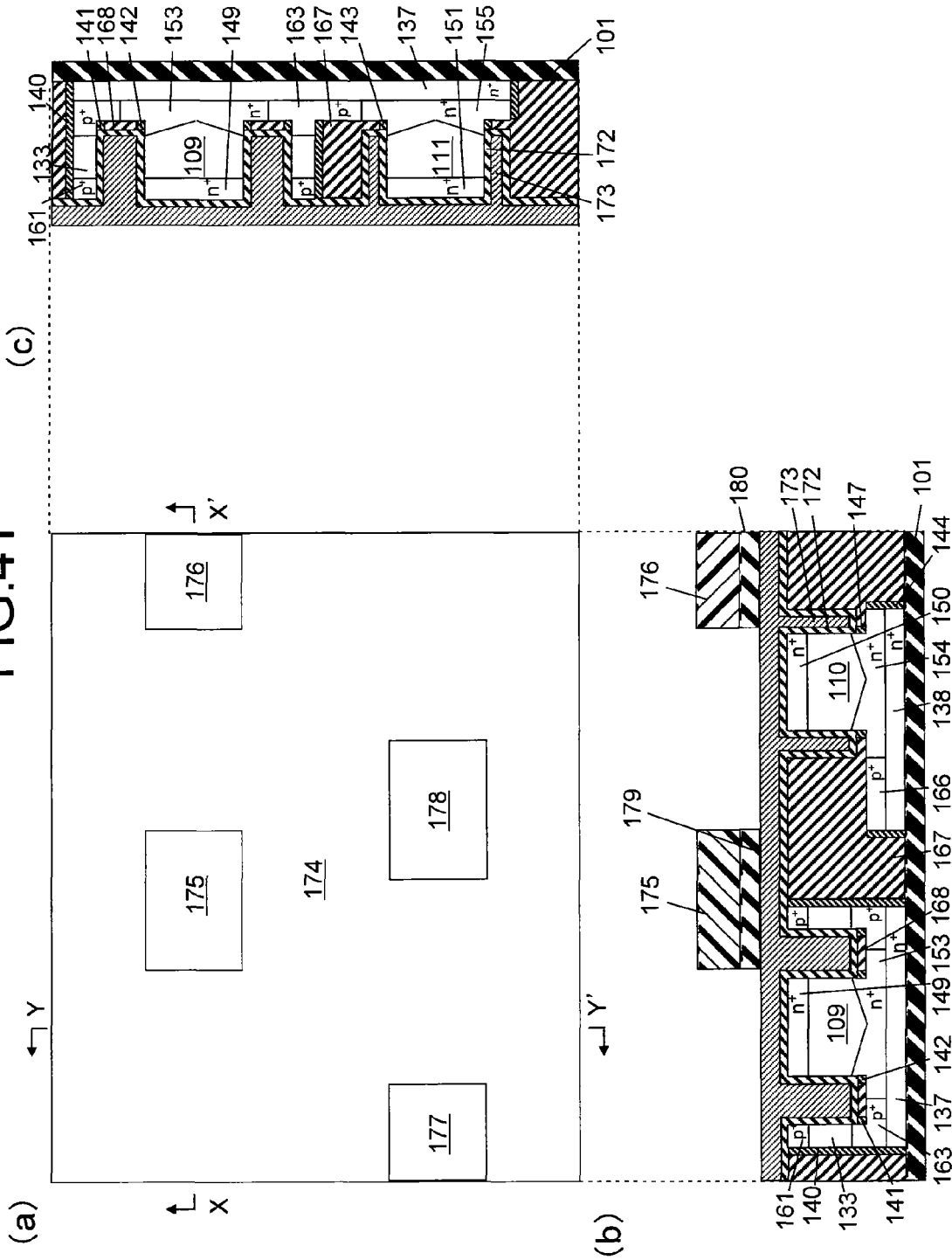
FIG. 41 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 41, the nitride film 174 is etched to form nitride film masks 179, 180, 181 and 182 using the resists 175, 176, 177 and 178 as masks.

Figure 42:
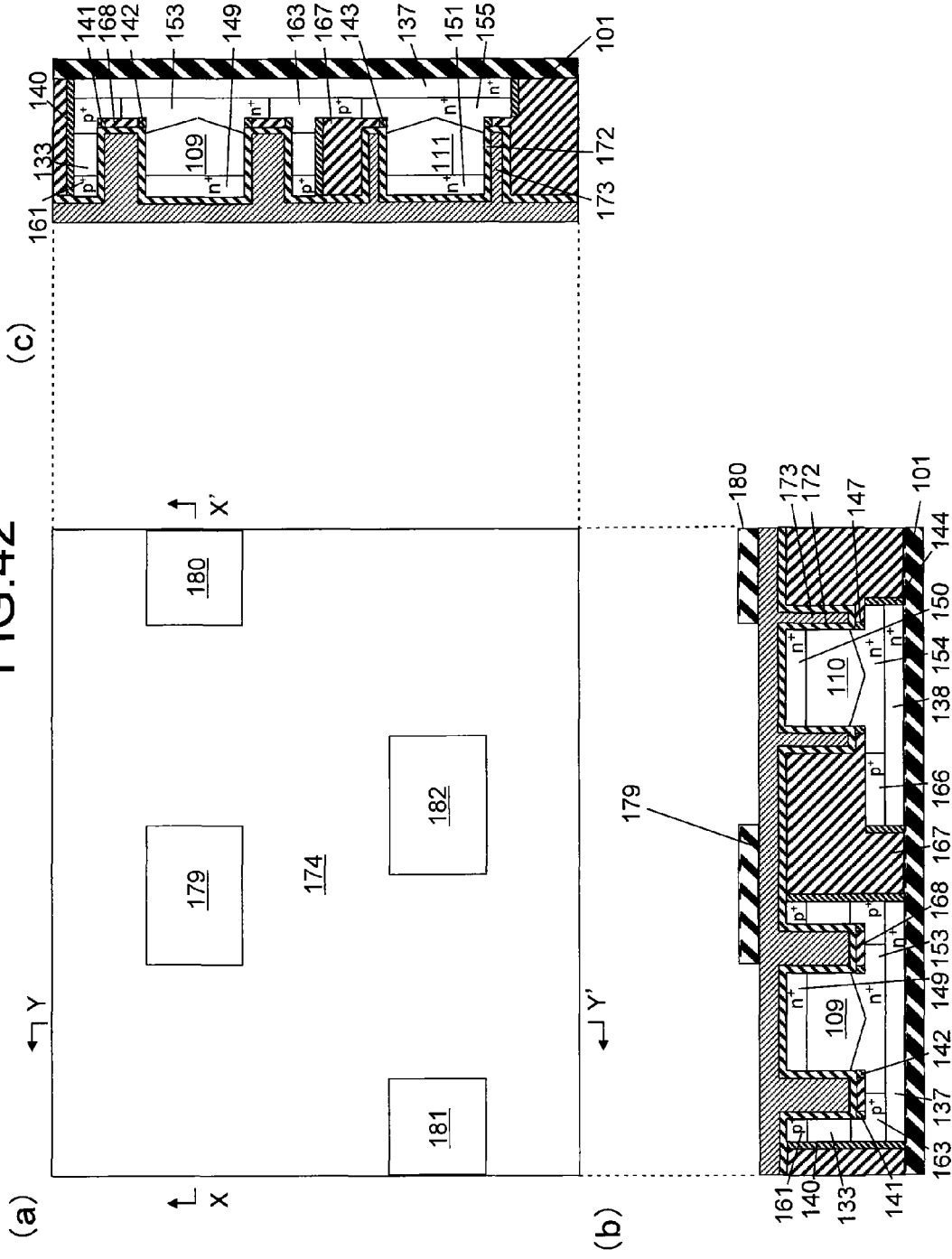
FIG. 42 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 42, the resists 175, 176, 177 and 178 are removed

Figure 43:
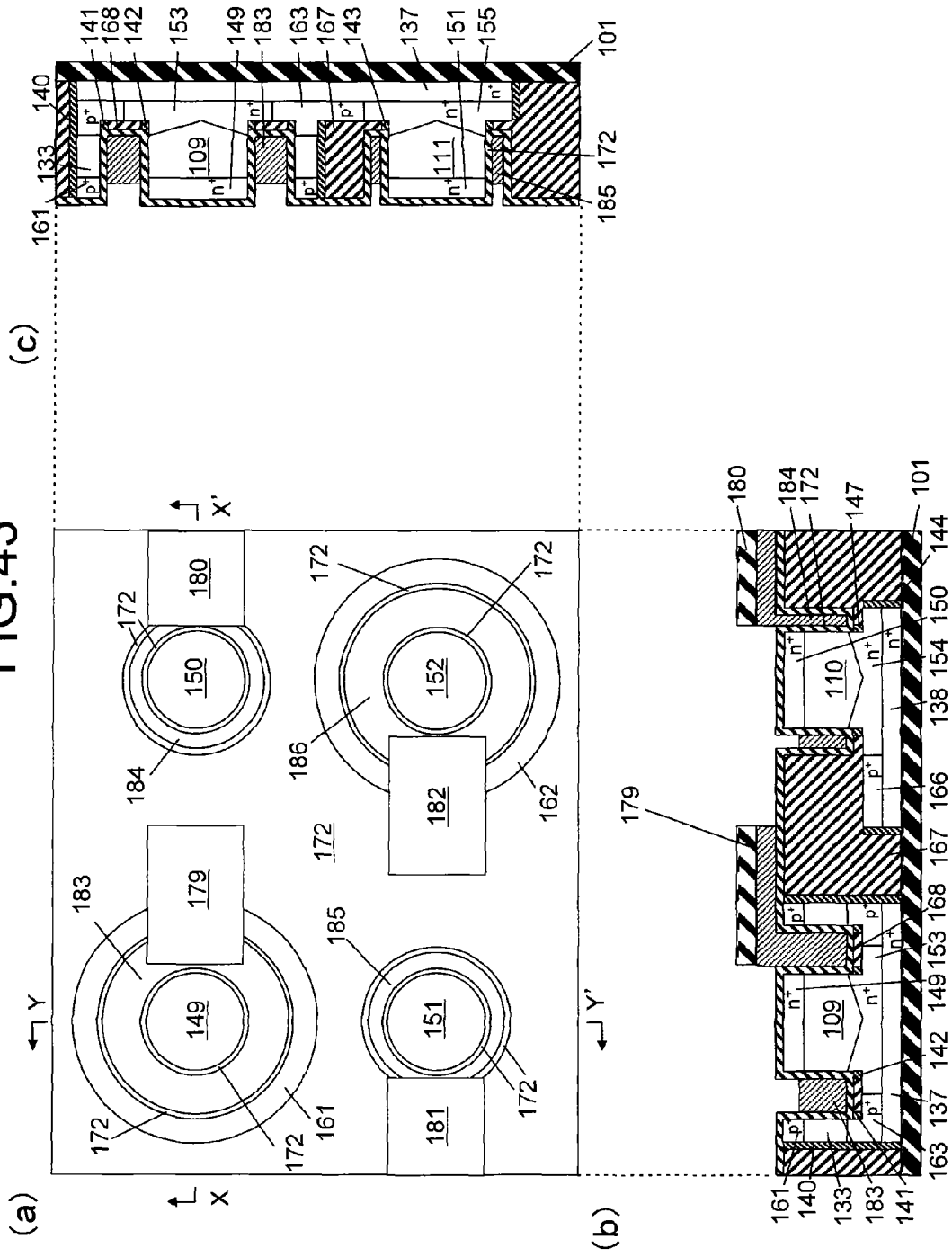
FIG. 43 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 43, the metal 173 is etched to a prescribed depth using the nitride film masks 179, 180, 181 and 182 as masks to form gate electrodes 183, 184, 185 and 186.

Figure 44:
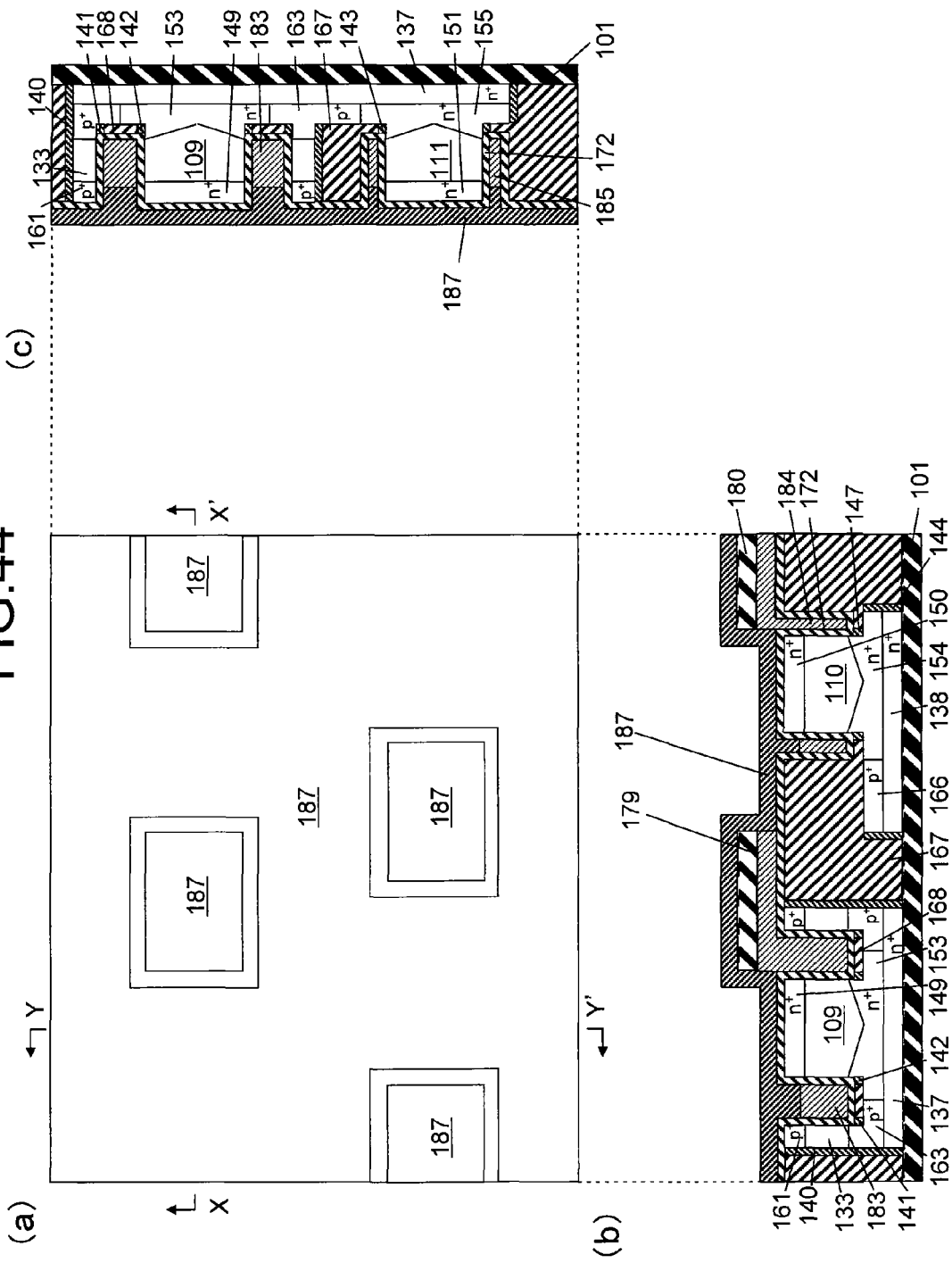
FIG. 44 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 44, a nitride film 187 is deposited from above the high-K film 172 so as to cover the nitride film masks 179, 180, 181 and 182.

Figure 45:
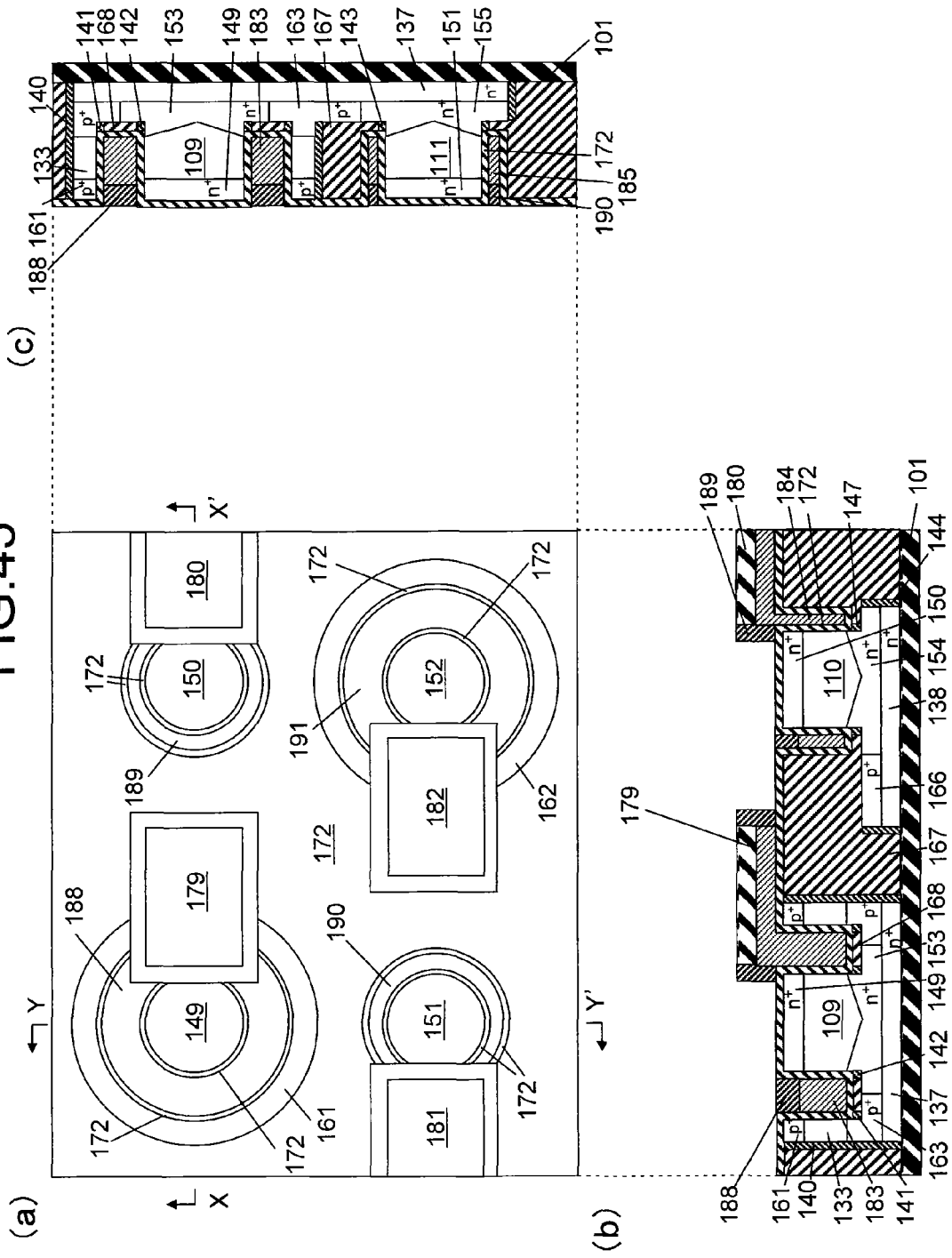
FIG. 45 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 45, the nitride film 187 is etched to form nitride film sidewalls 188, 189, 190 and 191 on the sidewalls of the nitride film masks 179, 180, 181 and 182 and the gate electrodes 183, 184, 185, and 186.

Figure 46:
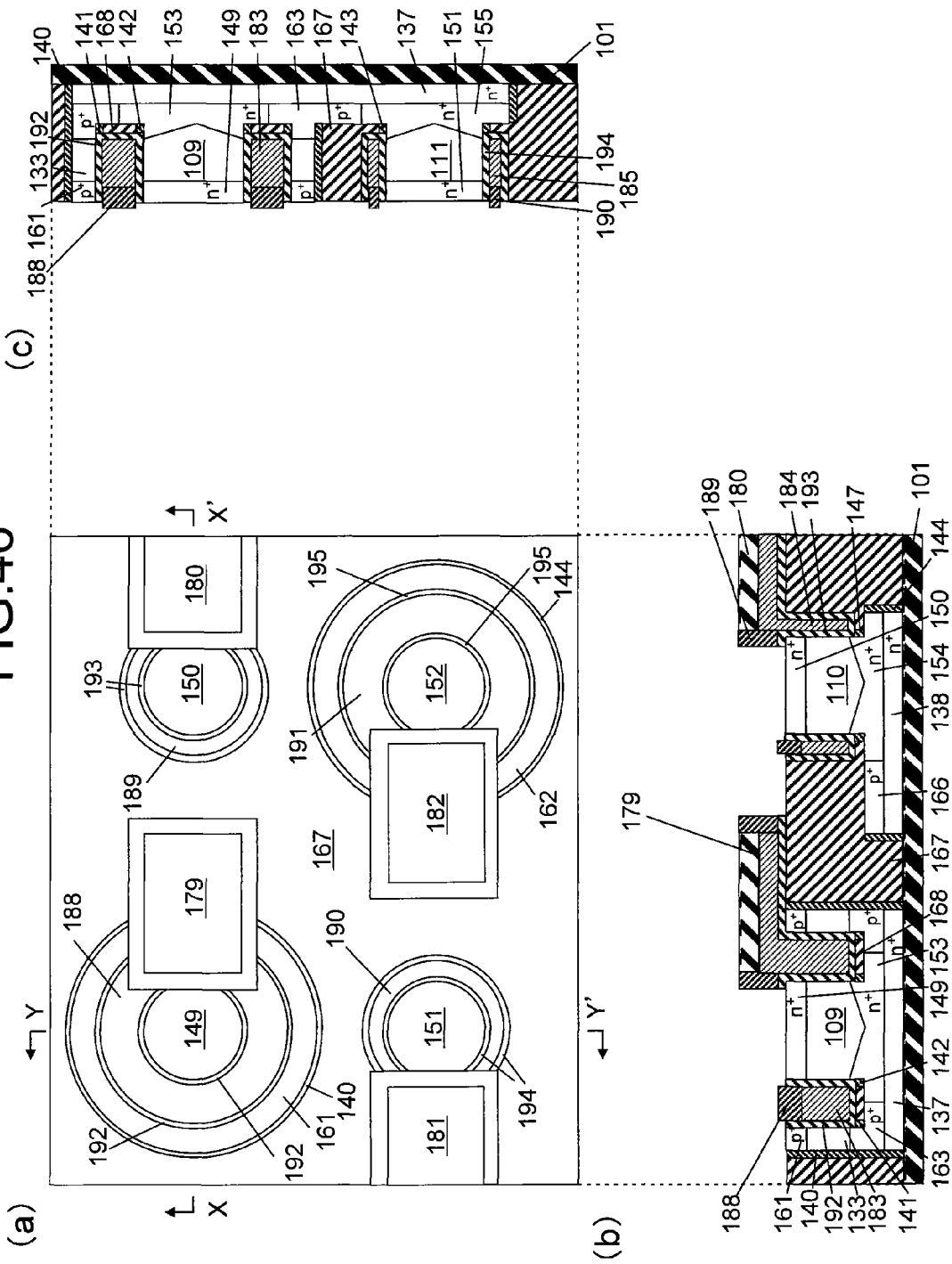
FIG. 46 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 46, gate insulating films 192, 193, 194 and 195 are formed by etching the high-K film 172, whose surface was exposed.

Figure 47:
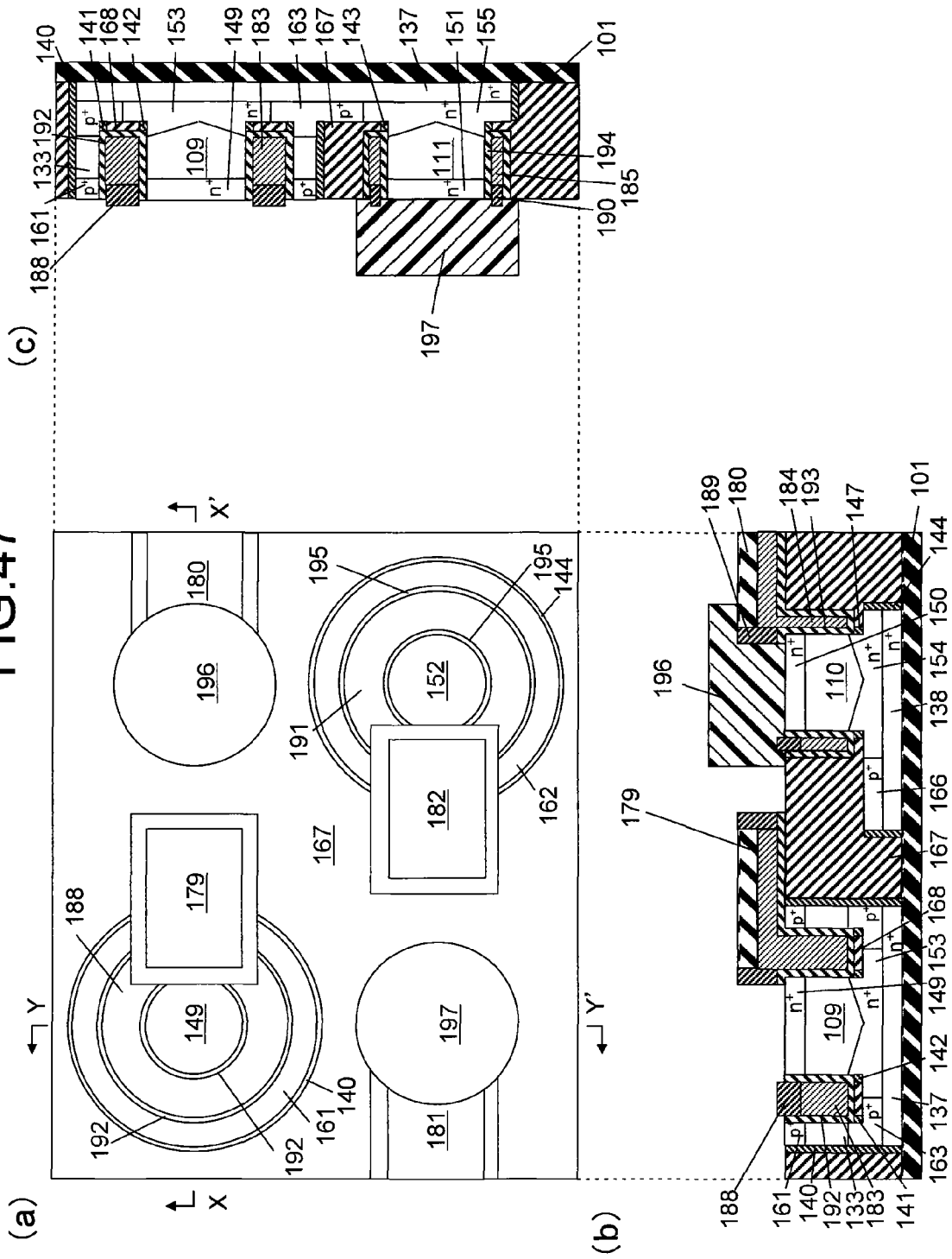
FIG. 47 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 47, resists 196 and 197 for etching nitride film are each formed in a circular shape in two pre-scribed positions on the structure surface.

Figure 48:
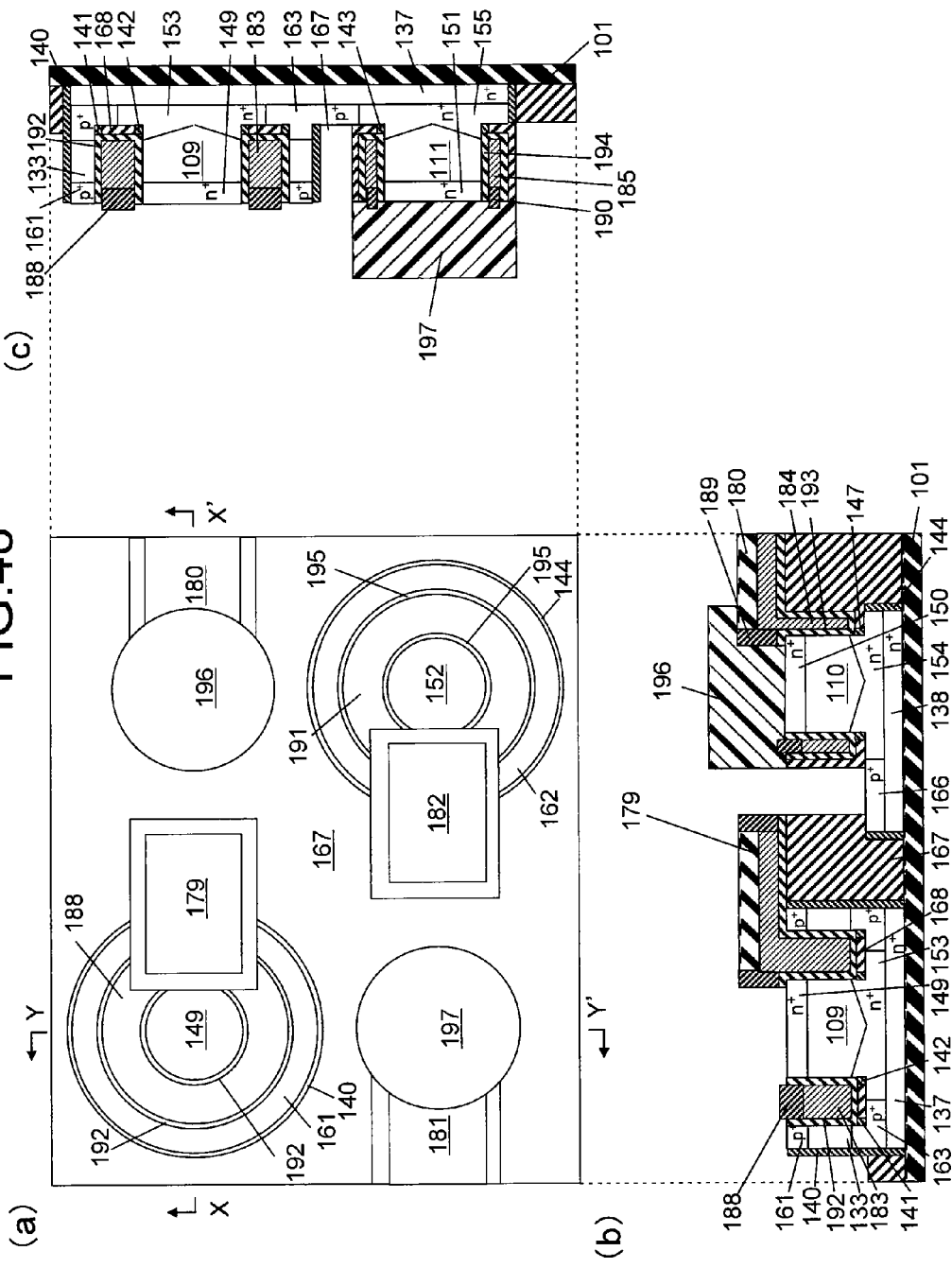
FIG. 48 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 48, the nitride film 167 is etched using the nitride film masks 179, 180, 181 and 182 and the resists 196 and 197 as masks.

Figure 49:
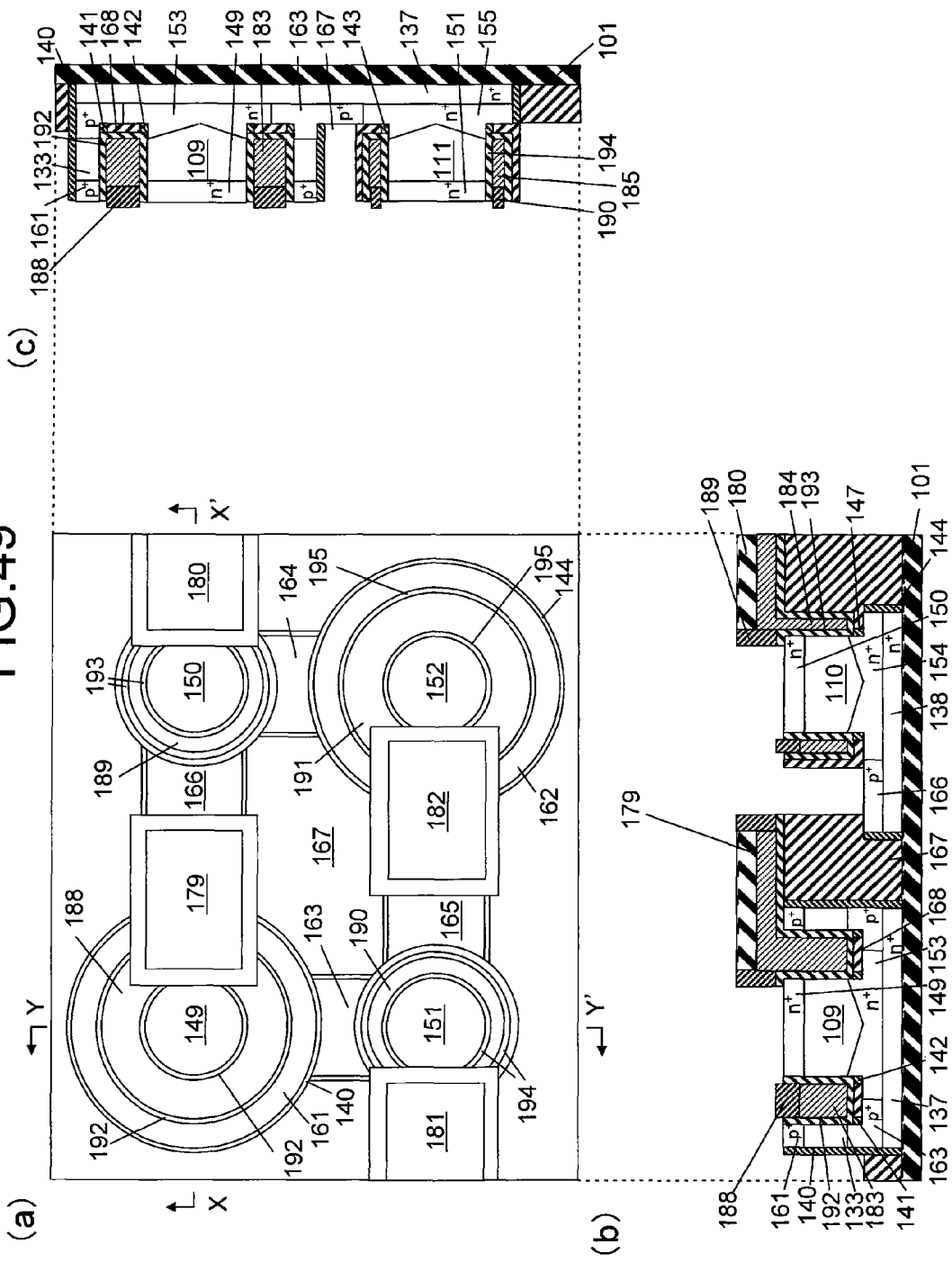
FIG. 49 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 49, the resists 196 and 197 are removed.

Figure 50:
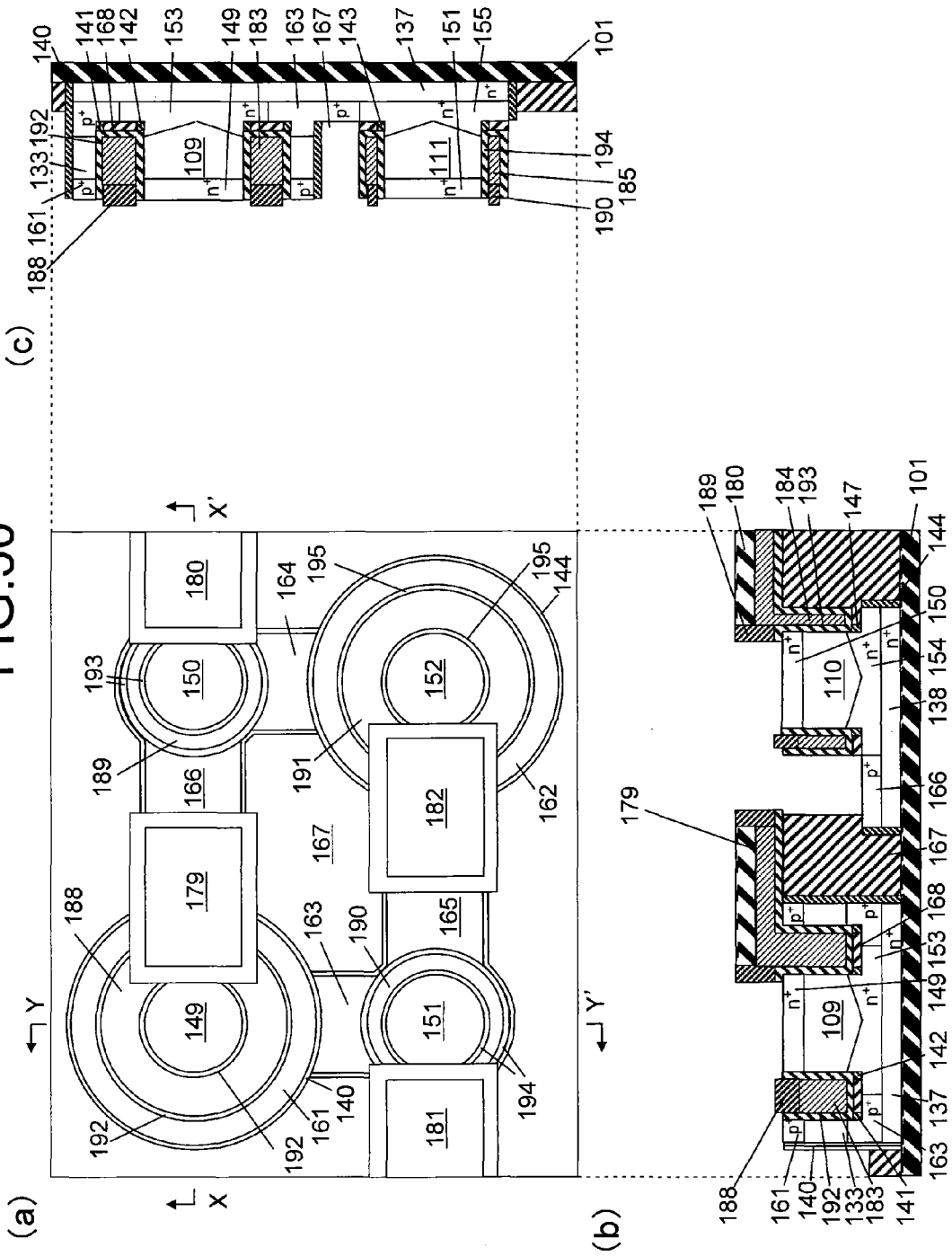
FIG. 50 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 50, the unnecessary nitride film 167 is removed by etching.

Figure 51:
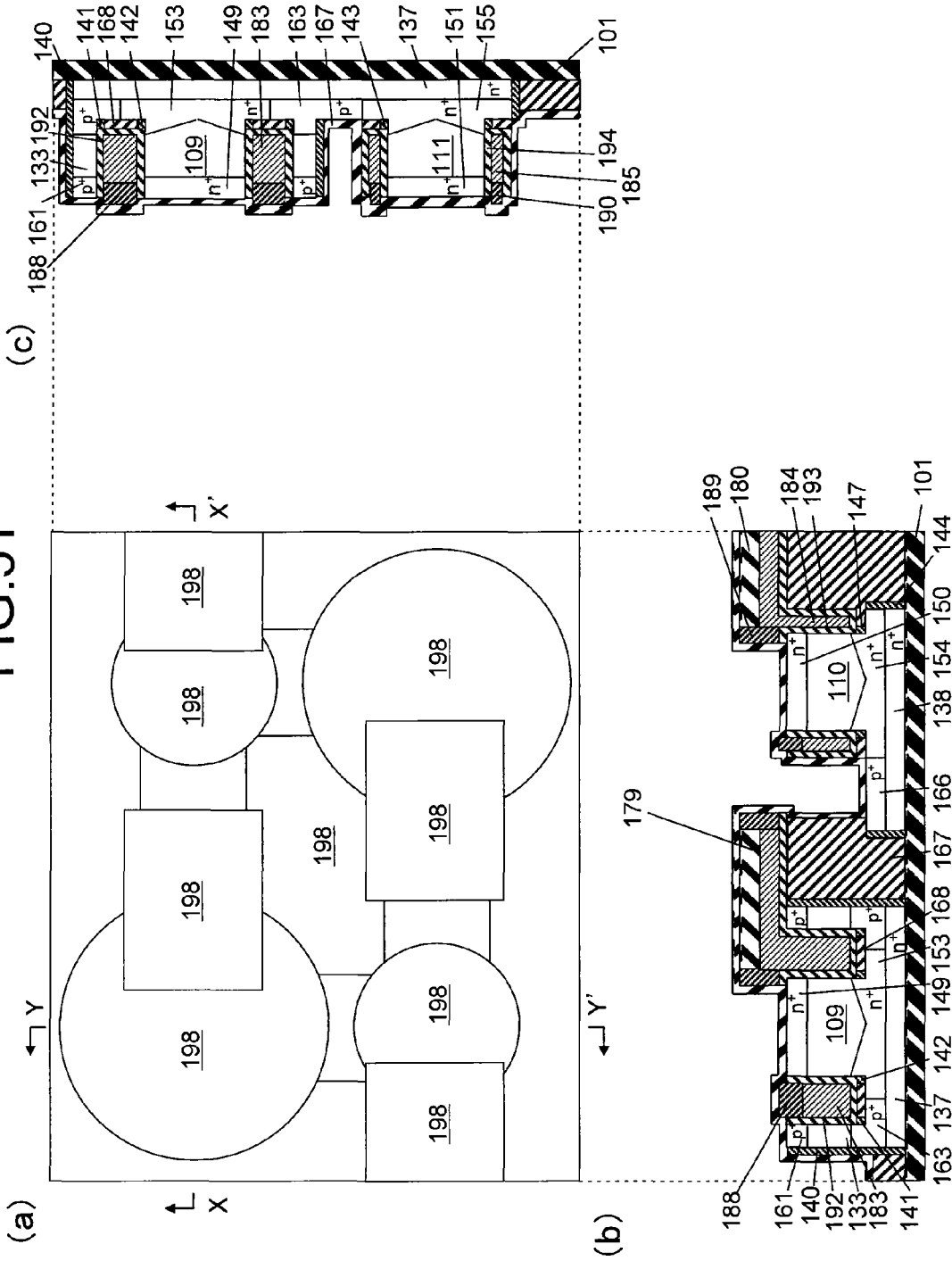
FIG. 51 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 51, a nitride film 198 is deposited so as to thinly cover the surface of the structure with a uniform thickness.

Figure 52:
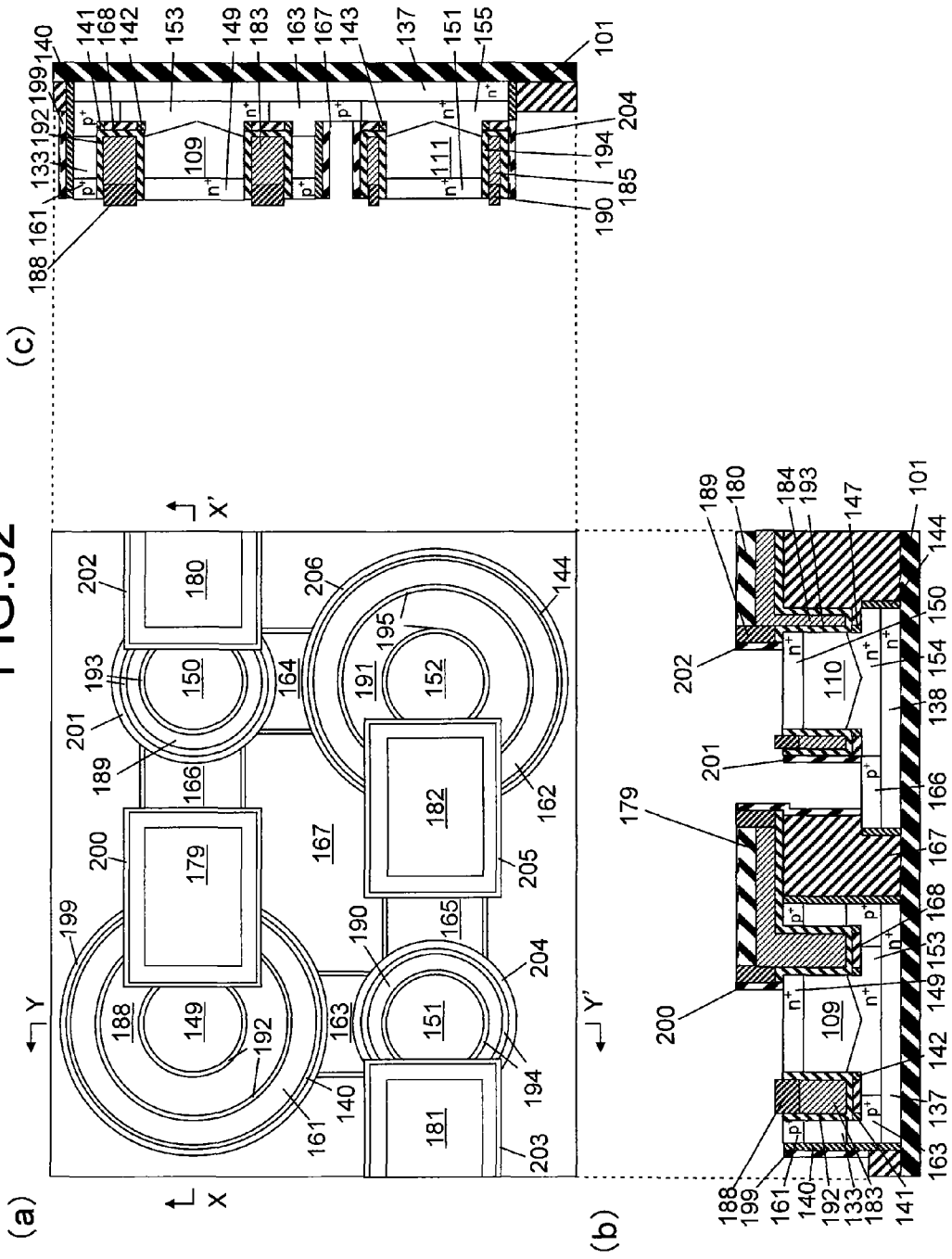
FIG. 52 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 52, the nitride film 198 is etched to form nitride film sidewalls 199, 200, 201, 202, 203, 204, 205 and 206 on the sidewalls of the nitride film sidewalls 188, 189, 190 and 191 and the nitride film masks 179, 180, 181 and 182.

Figure 53:
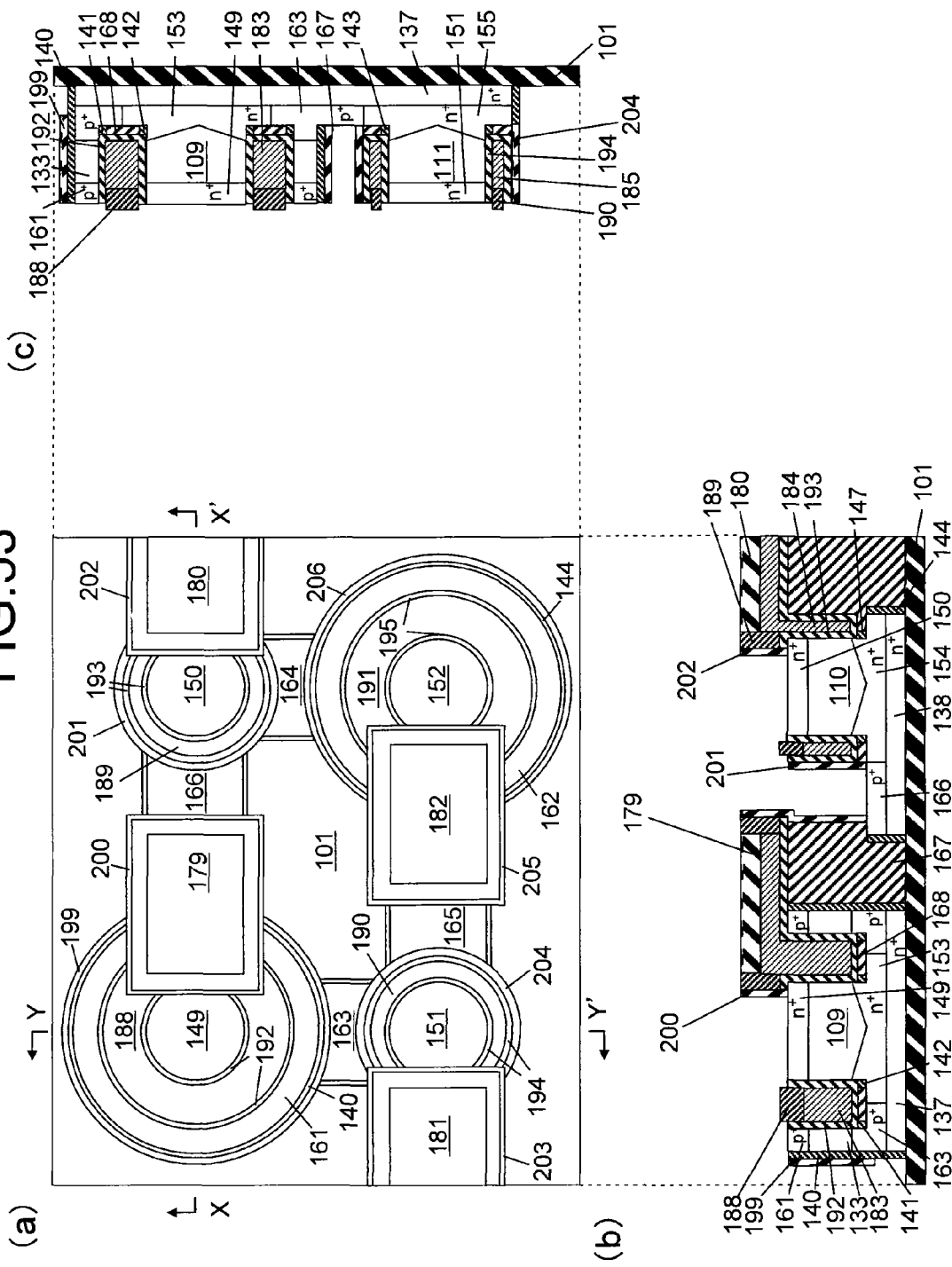
FIG. 53 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 53, the unnecessary nitride film 167 is removed by etching.

Figure 54:
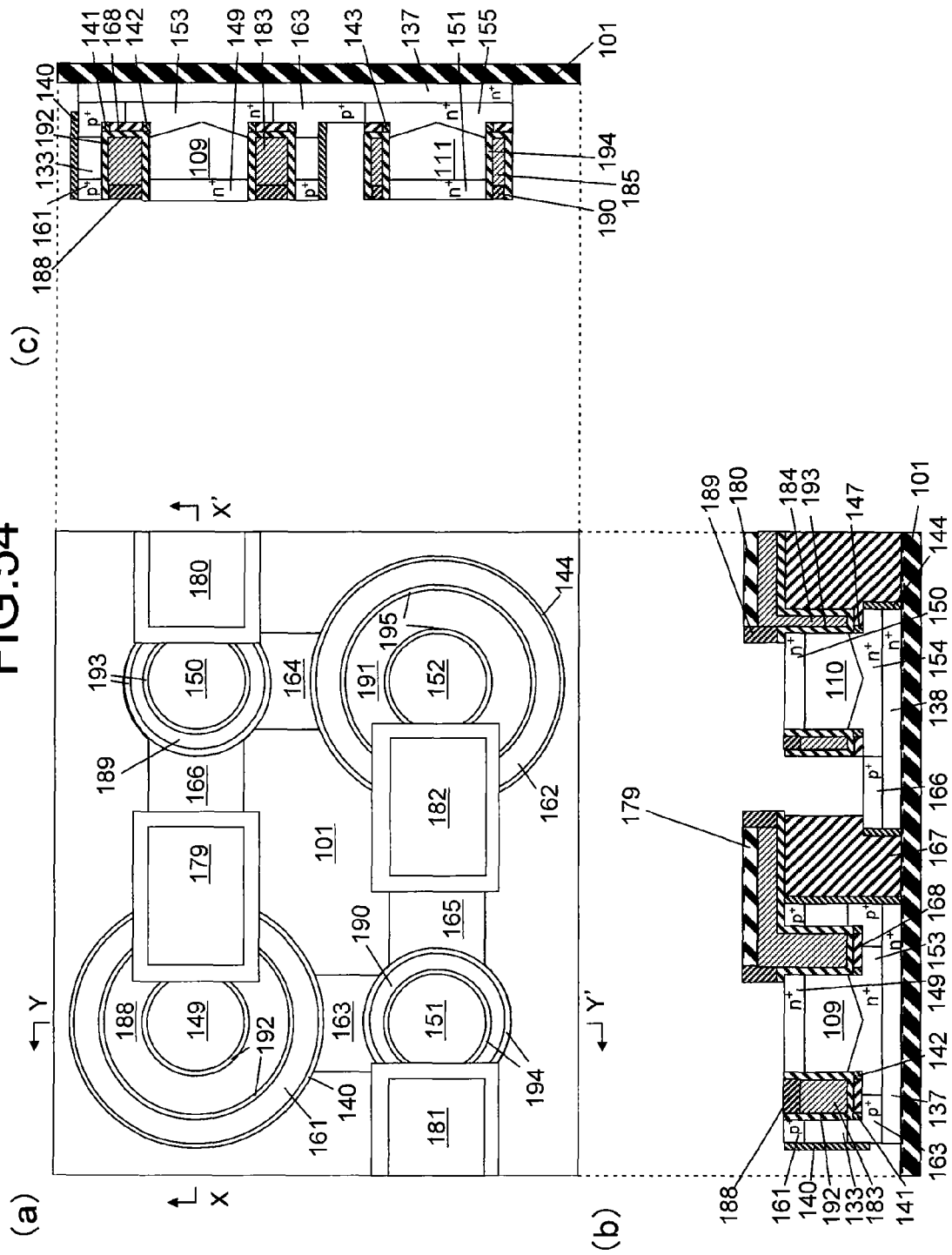
FIG. 54 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 54, the nitride film sidewalls 199, 200, 201, 202, 203, 204, 205 and 206 are removed by etching and a portion of the nitride film sidewalls 140 and 144 not covered by the nitride film sidewalls 199, 200, 201, 202, 203, 204, 205 and 206 is etched.

Figure 55:
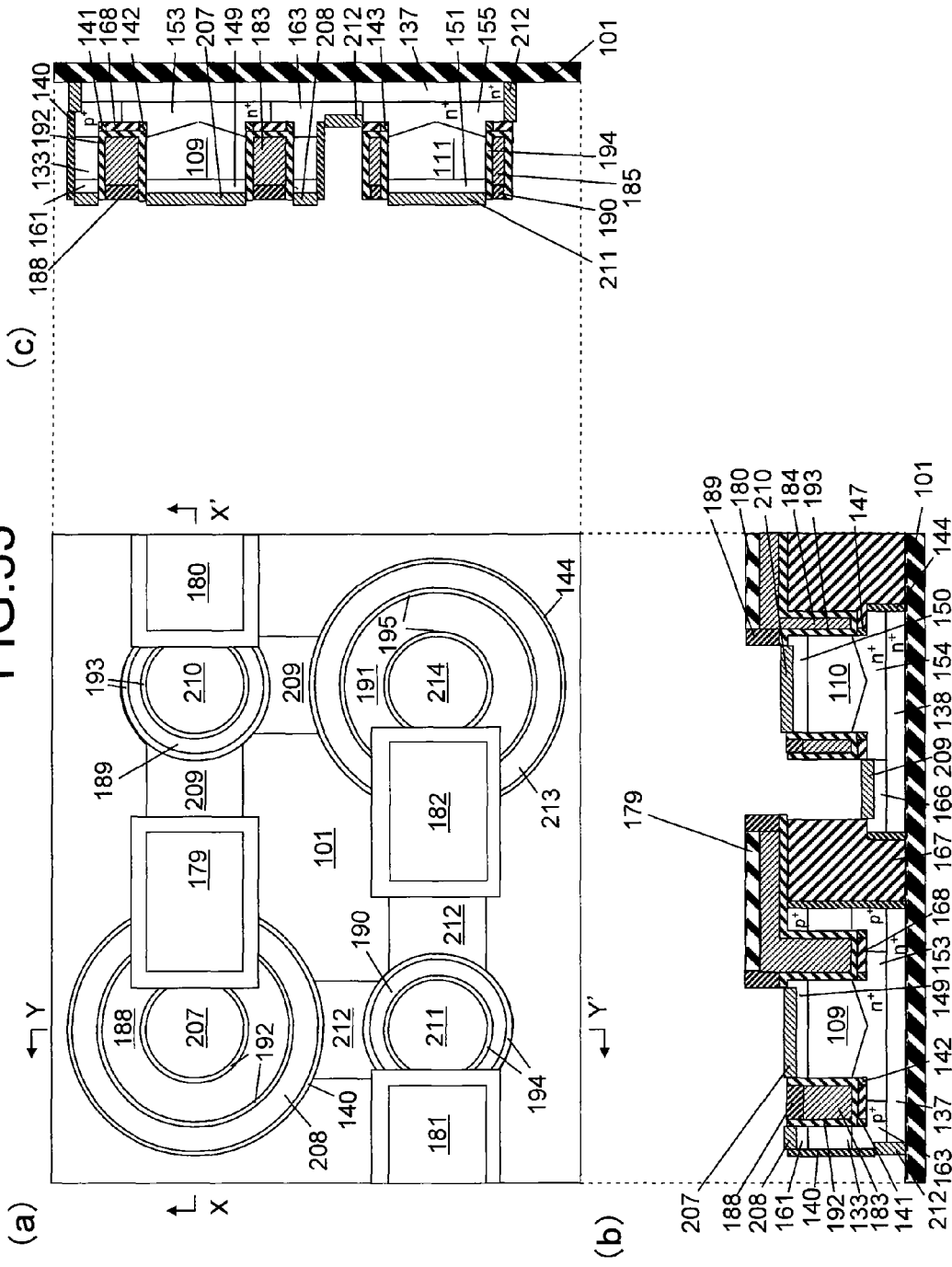
FIG. 55 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 55, first through eighth silicon and metal compound layers 207, 208, 209, 210, 211, 212, 213 and 214 are formed on the p+ type silicon layers 161, 162, 163, 164, 165 and 166 and the n+ type silicon layers 149, 150, 151 and 152.

Nickel (Ni) or cobalt (Co) can be used as this metal, and this compound layer can be formed for example by forming a Ni silicide layer on the silicon surface by depositing a nickel film on the silicon and then performing heat treatment.

Figure 56:
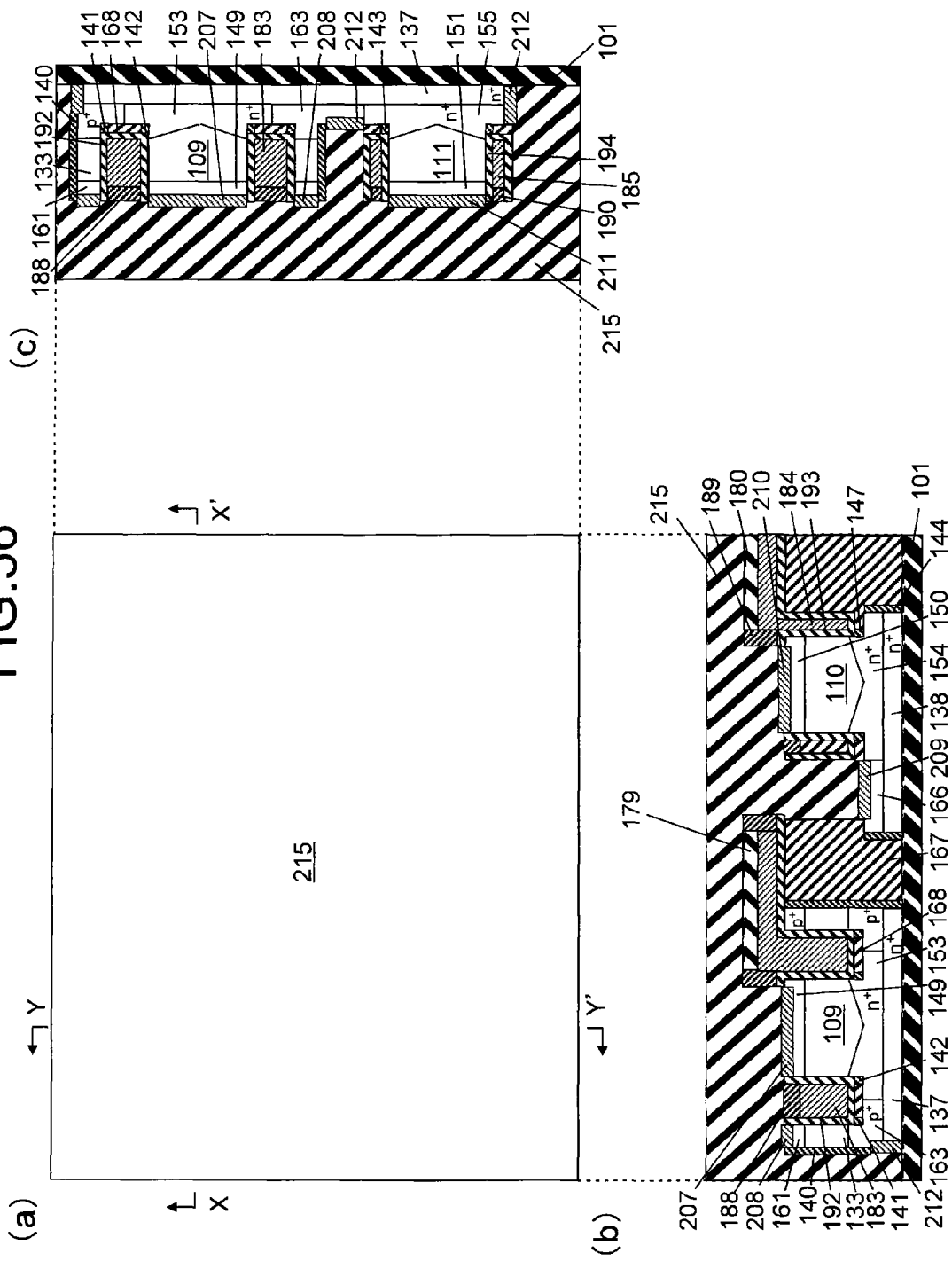
FIG. 56 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 56, an interlayer film 215 is formed on the surface of the structure.

Figure 57:
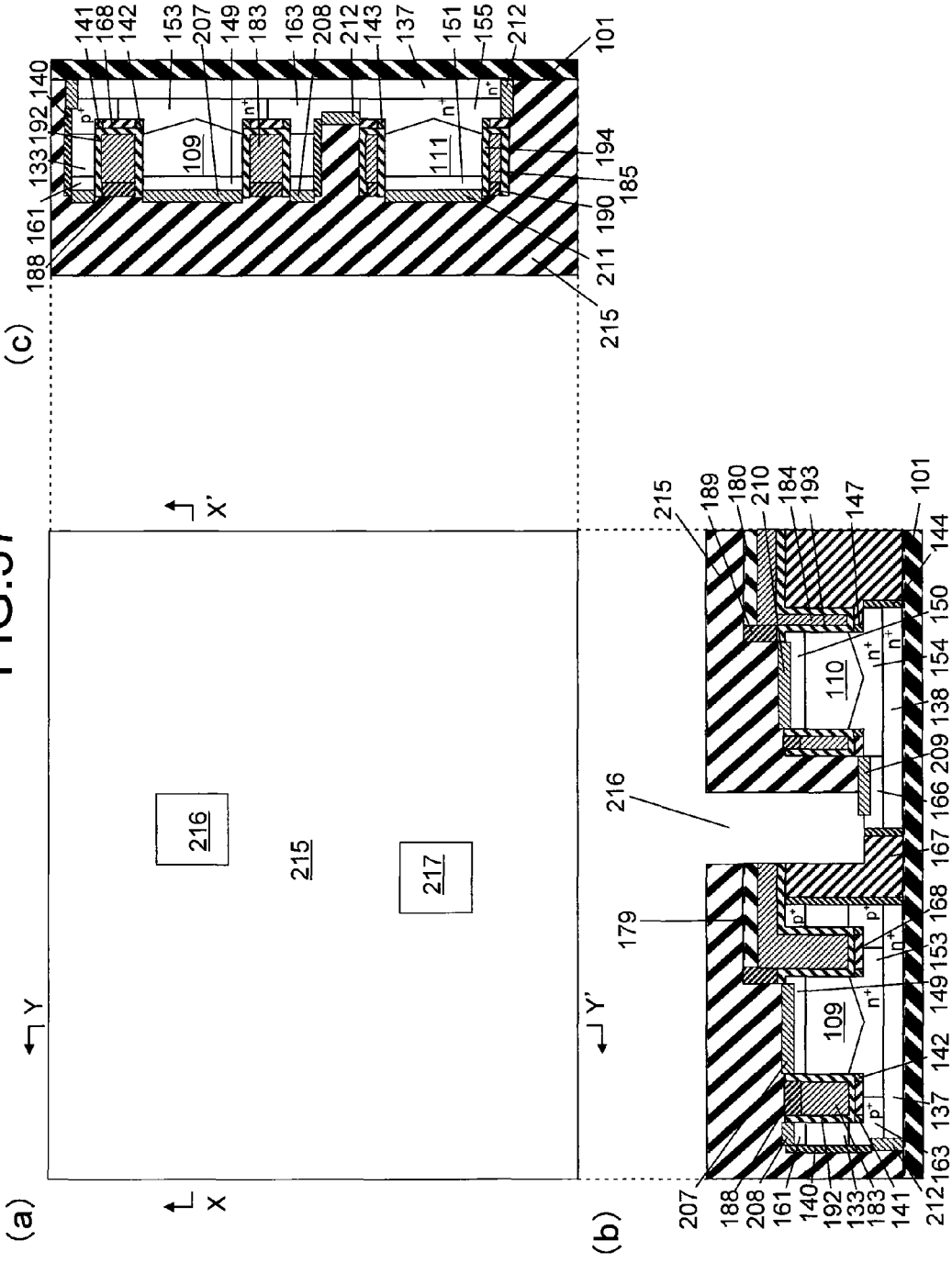
FIG. 57 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 57, contact holes 216 and 217 are formed so that a portion of the third compound layer 209 and the gate electrode 183 are exposed, and so that a portion of the sixth compound layer 212 and the gate electrode 186 are exposed.

Figure 58:
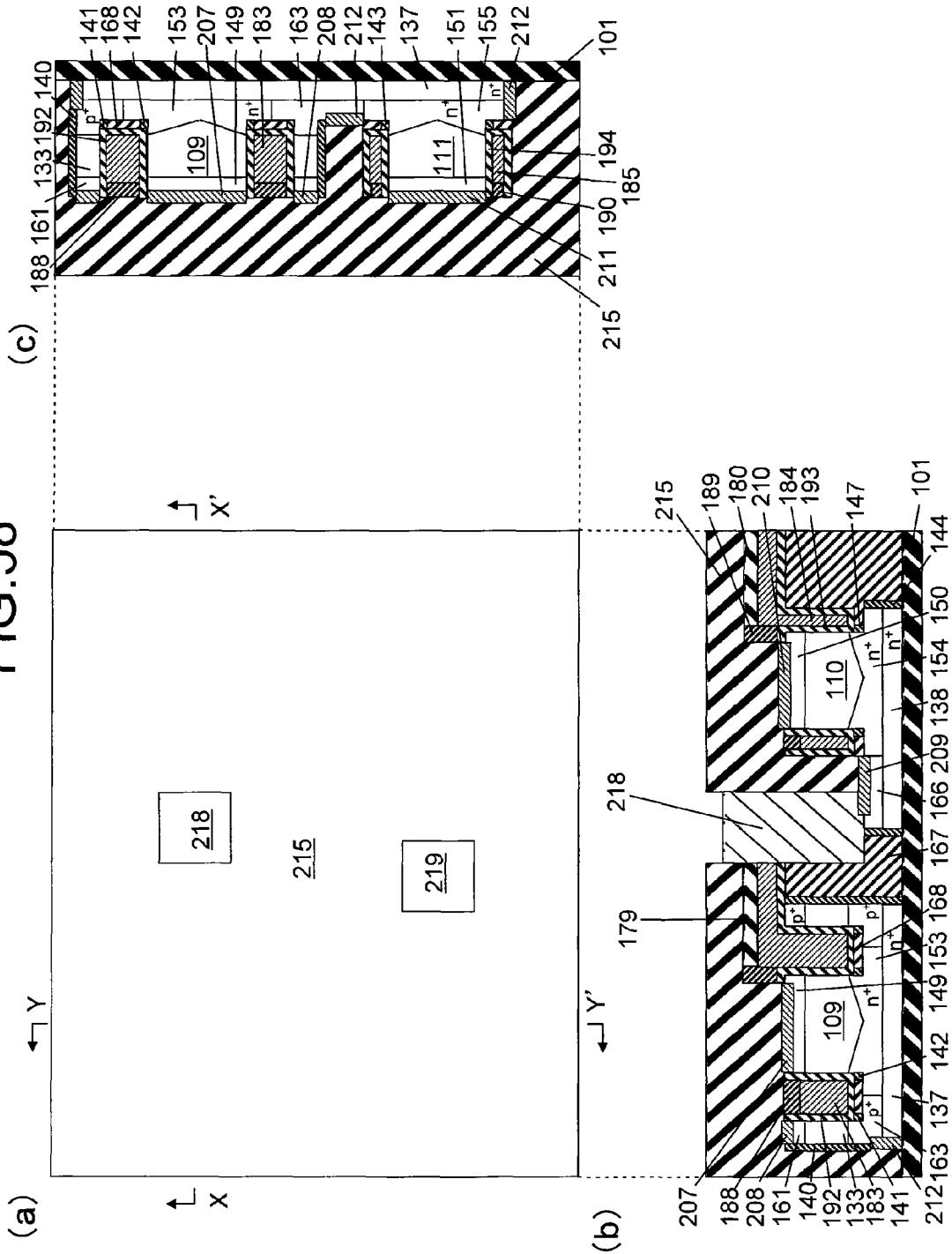
FIG. 58 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 58, contacts 218 and 219 are formed by filling the contact holes 216 and 217 with a metal material.

Figure 59:
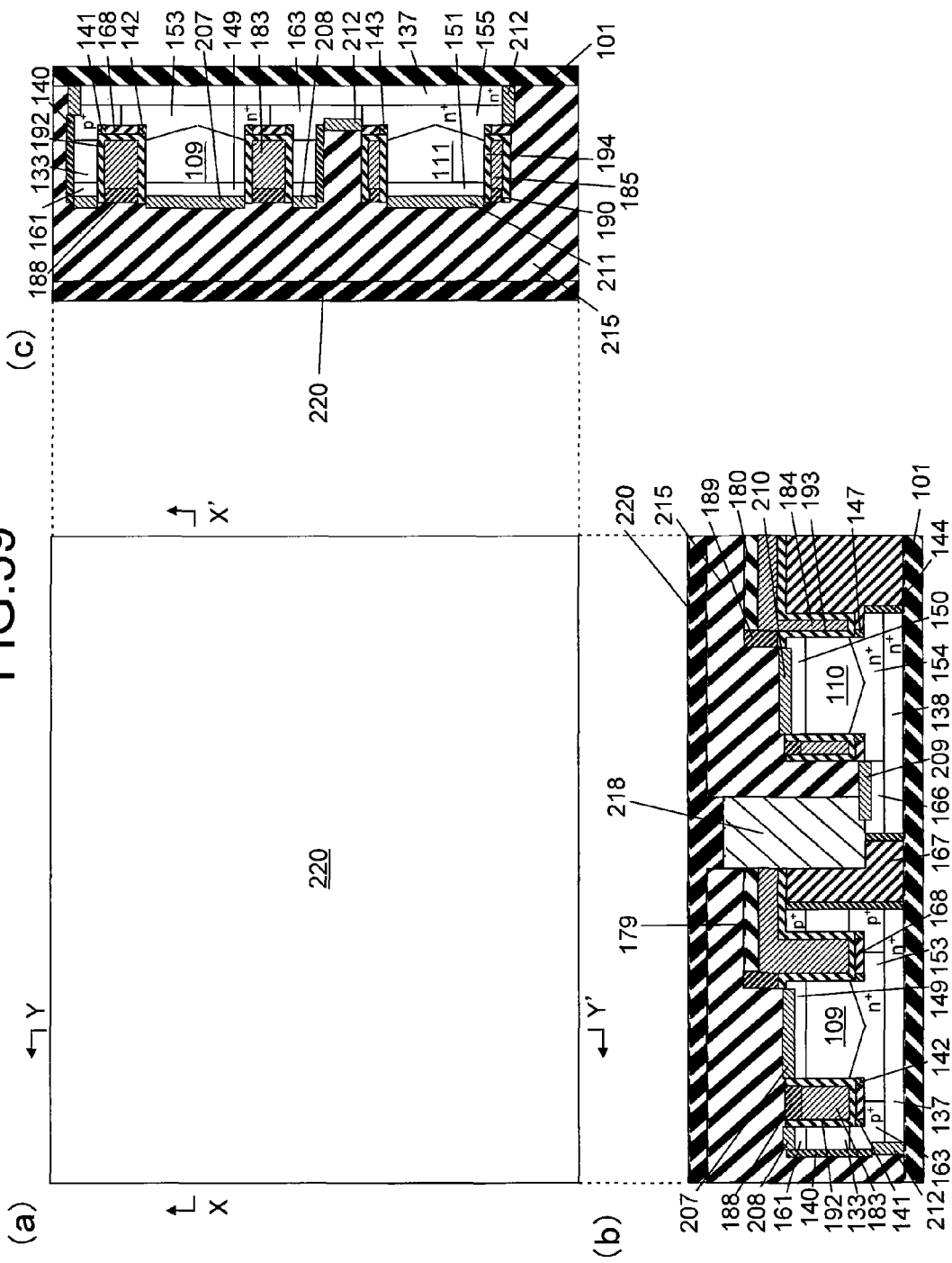
FIG. 59 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 59, an interlayer film 220 is formed from above the contacts 218 and 219 and the interlayer film 215.

Figure 60:
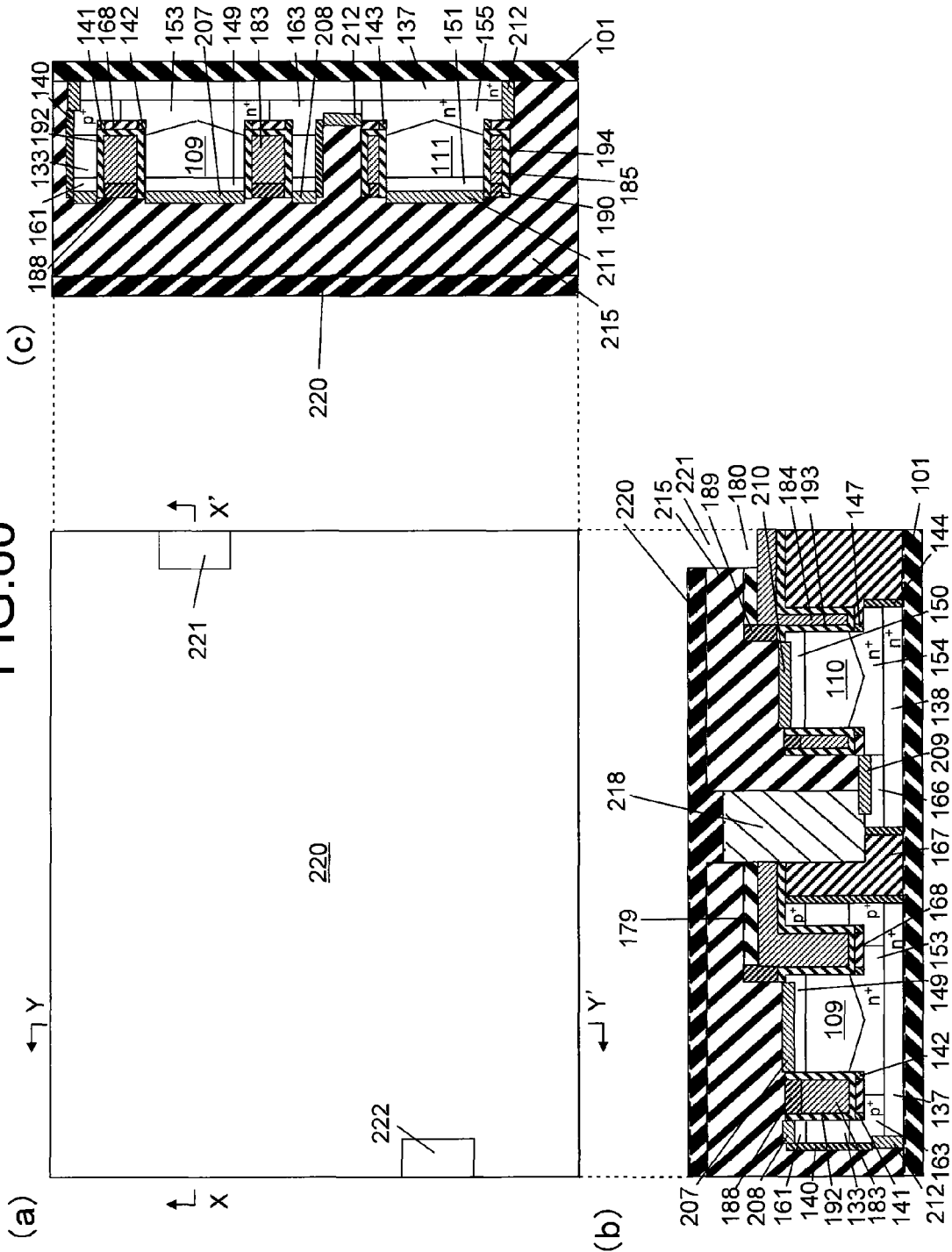
FIG. 60 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 60, contact holes 221 and 222 are formed so that a portion of the gate electrode 185 and the gate electrode 184 are exposed.

Figure 61:
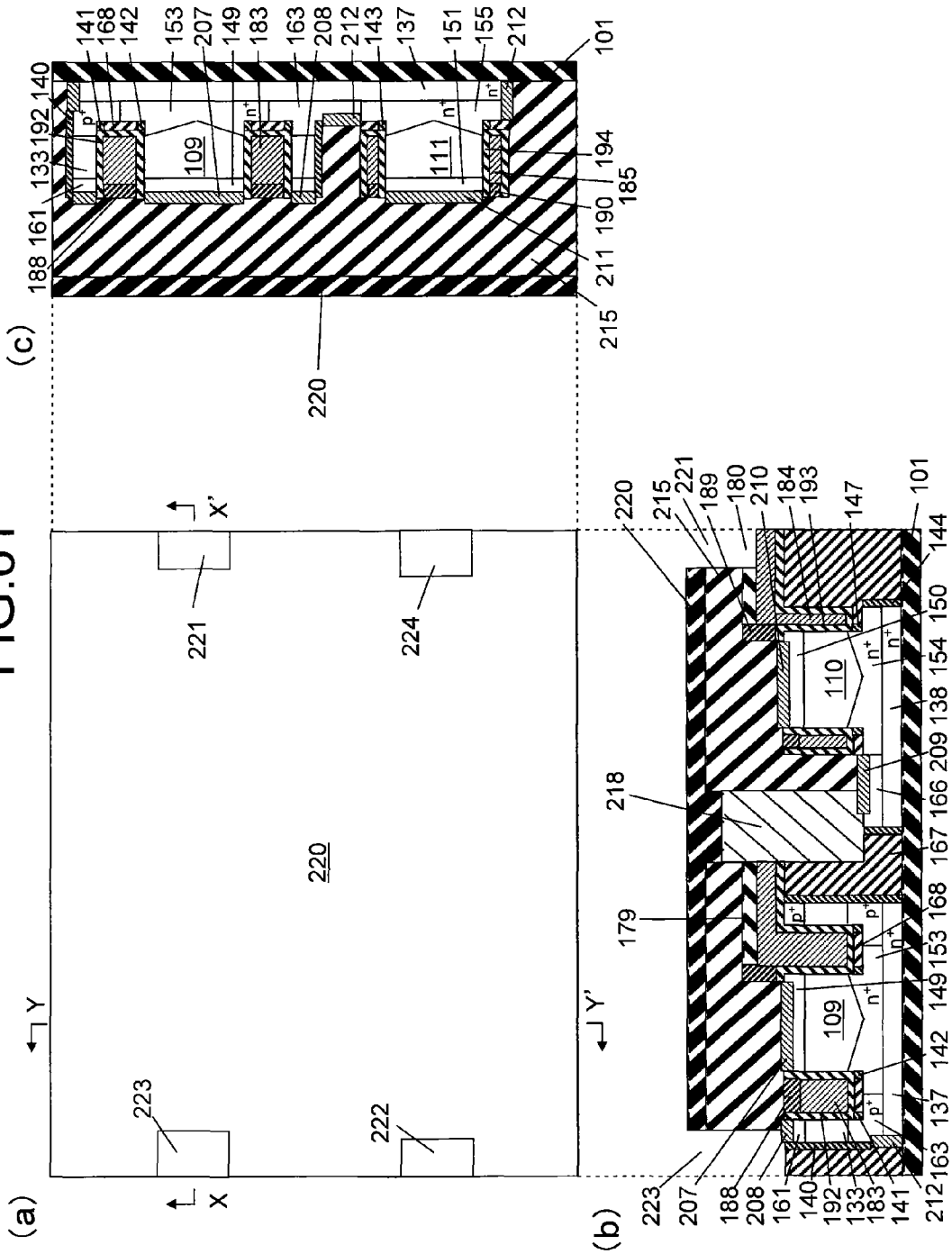
FIG. 61 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 61, contact holes 223 and 224 are formed so as to expose a portion of the sixth compound layer 213 and the second compound layer 208.

Figure 62:
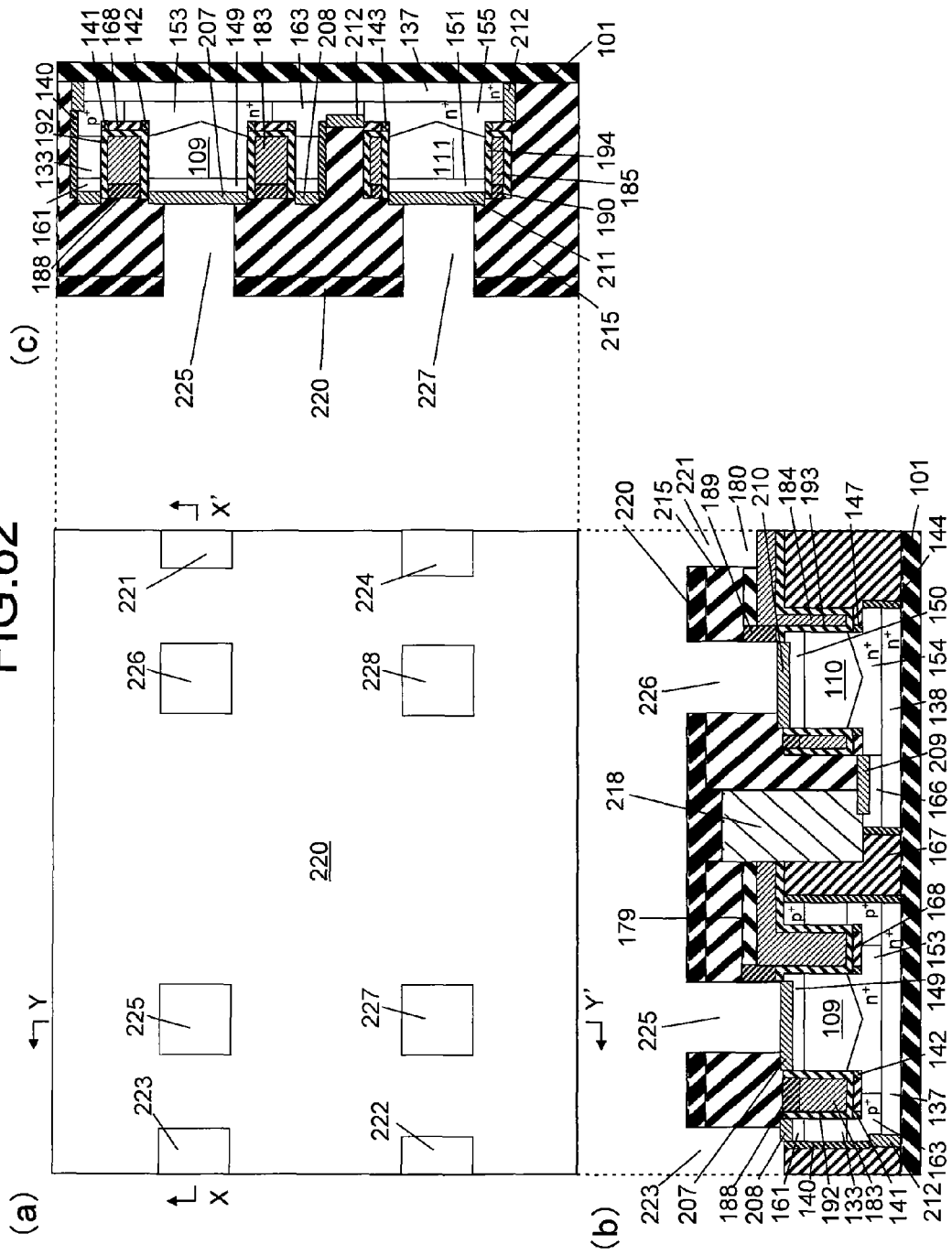
FIG. 62 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 62, contact holes 225, 226, 227 and 228 are formed so as to expose a portion of the first compound layer 207, the eighth compound layer 210, the fourth compound layer 211 and the fifth compound layer 214.

Figure 63:
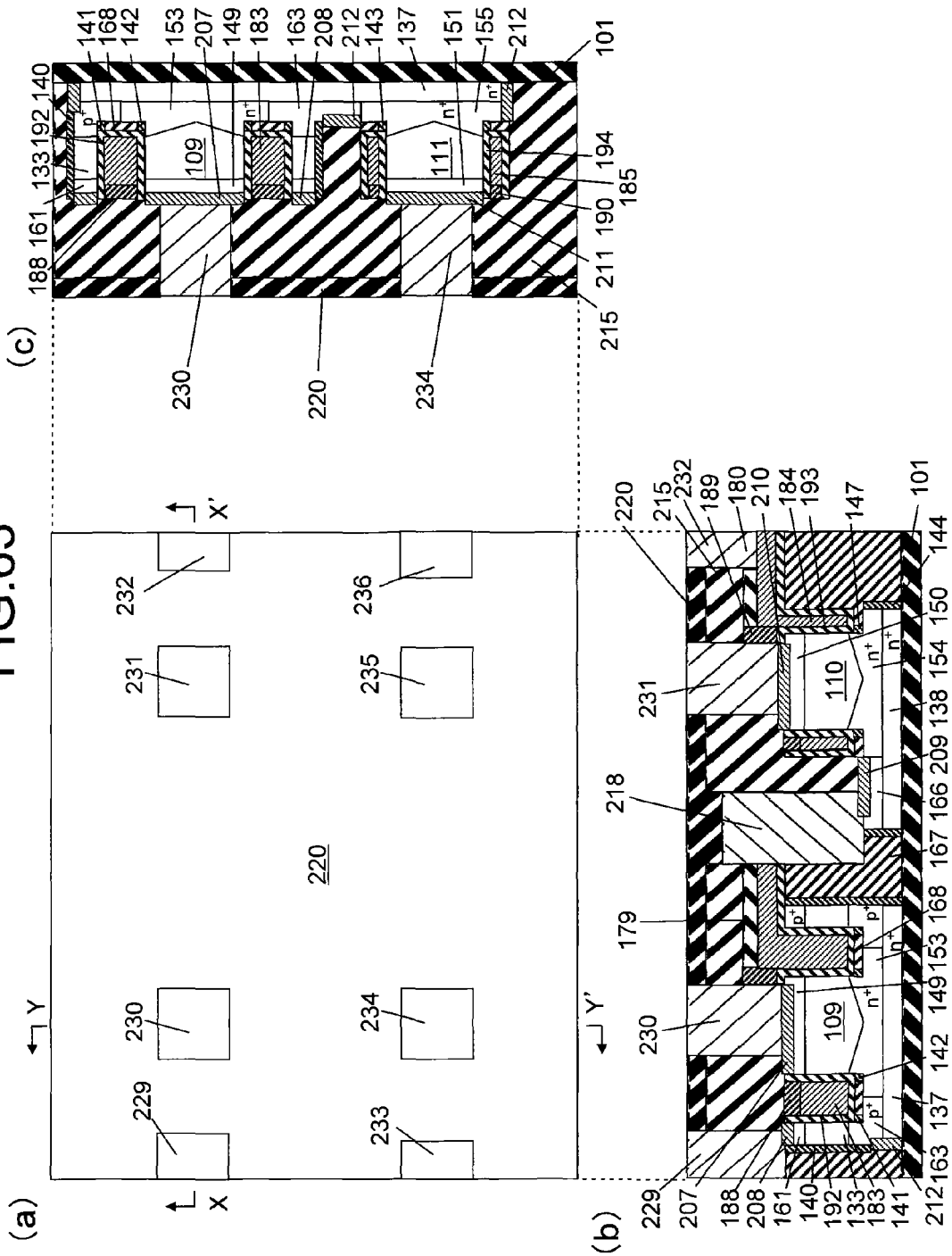
FIG. 63 shows a step in the example of the production process, wherein (a), (b) and (c) are a top plan view, a cross-sectional view taken along the line X-X' in (a), and a cross-sectional view taken along the line Y-Y' in (a), respectively.

Next, referring to FIG. 63, contacts 229, 230, 231, 232, 233, 234, 235 and 236 are formed by filling the contact holes 221, 222, 223, 224, 225, 226, 227 and 228 with a metal material.

Figure 65:
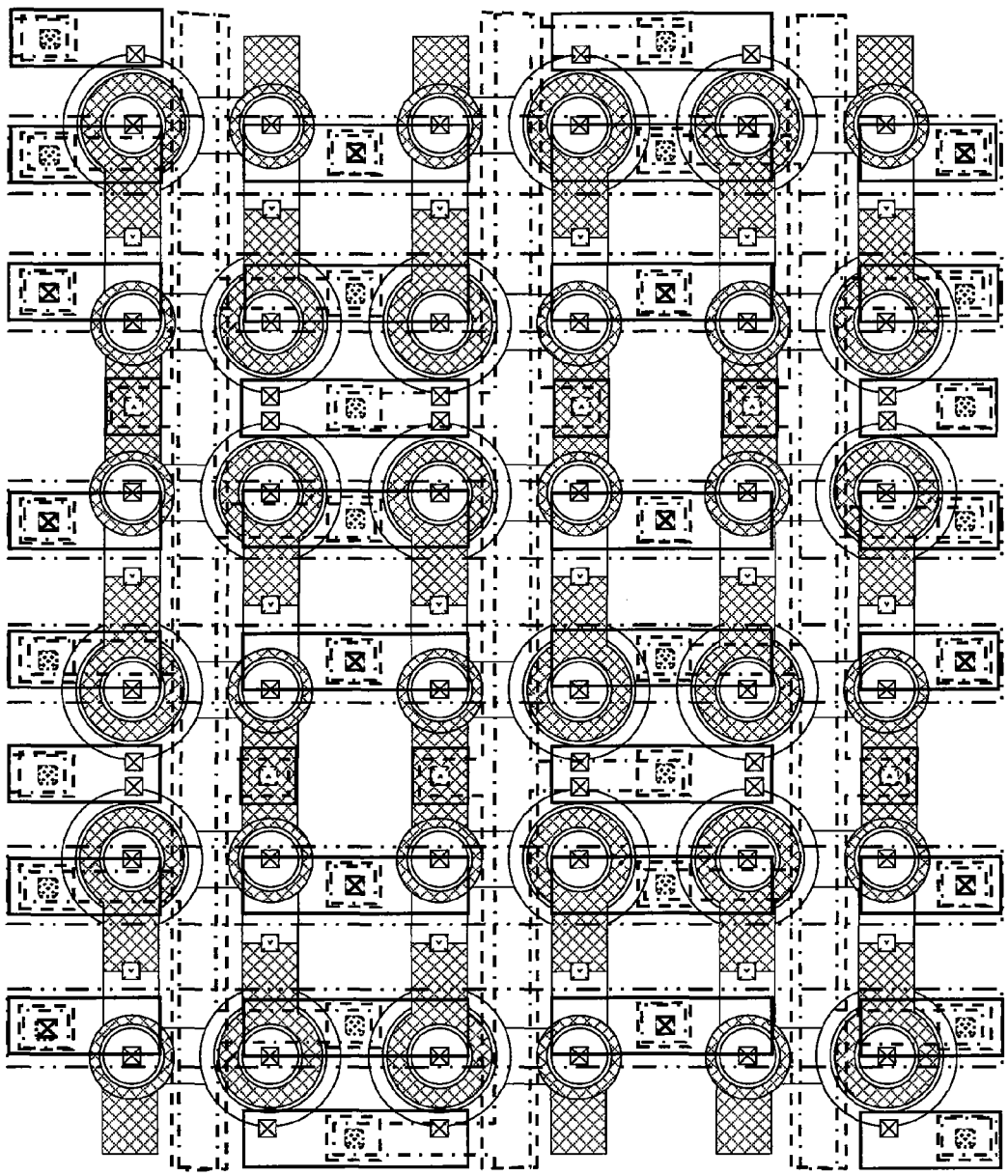
FIG. 65 is a plane view showing a device in which the semiconductor device according to the present invention is arranged in three rows and three columns on a substrate.
Figure 66:
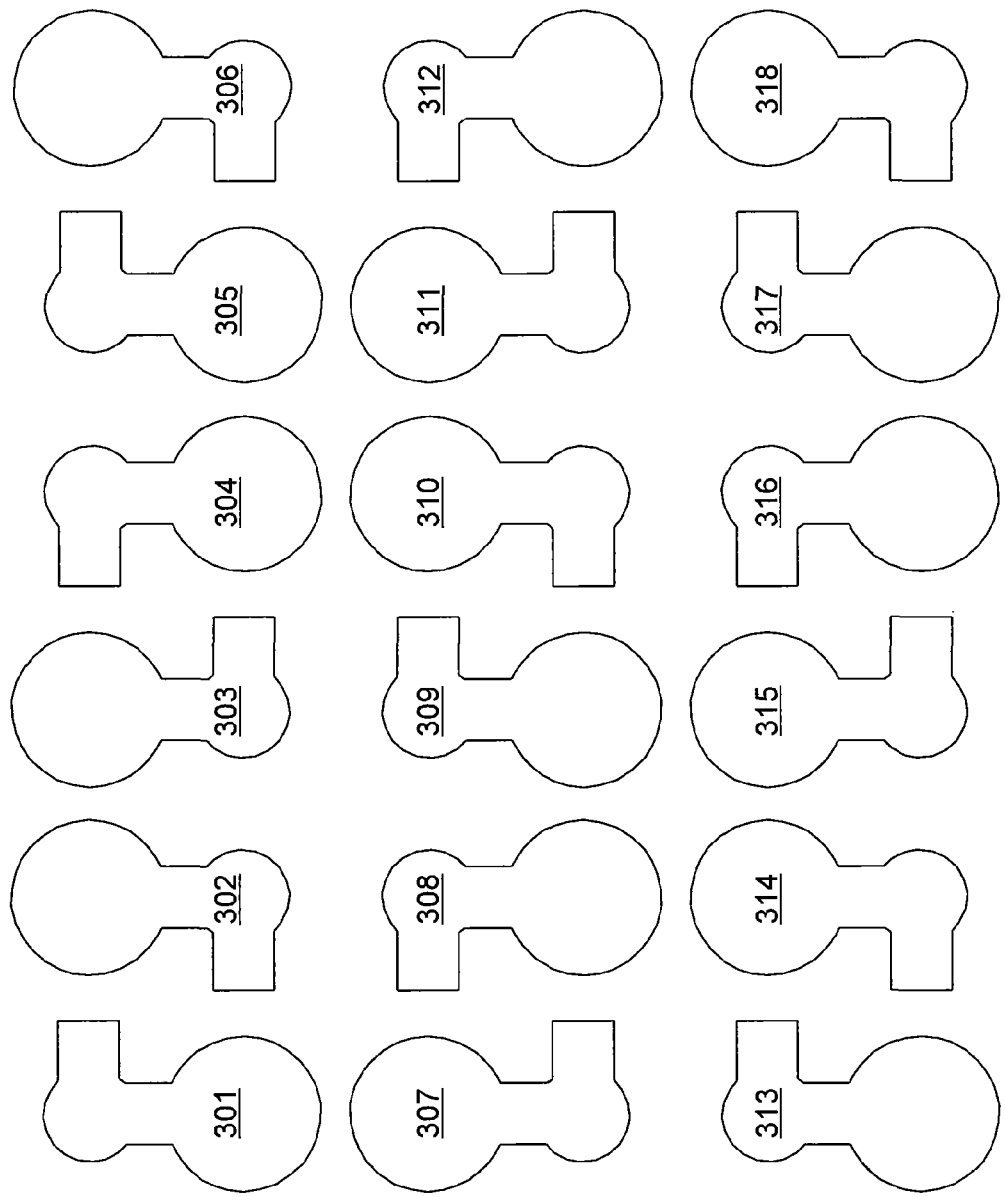
FIG. 66 is a plane view showing the arrangement of the inverter output terminal layer of a device in which the semiconductor device according to the present invention is arranged in three rows and three columns on a substrate.
Figure 67:
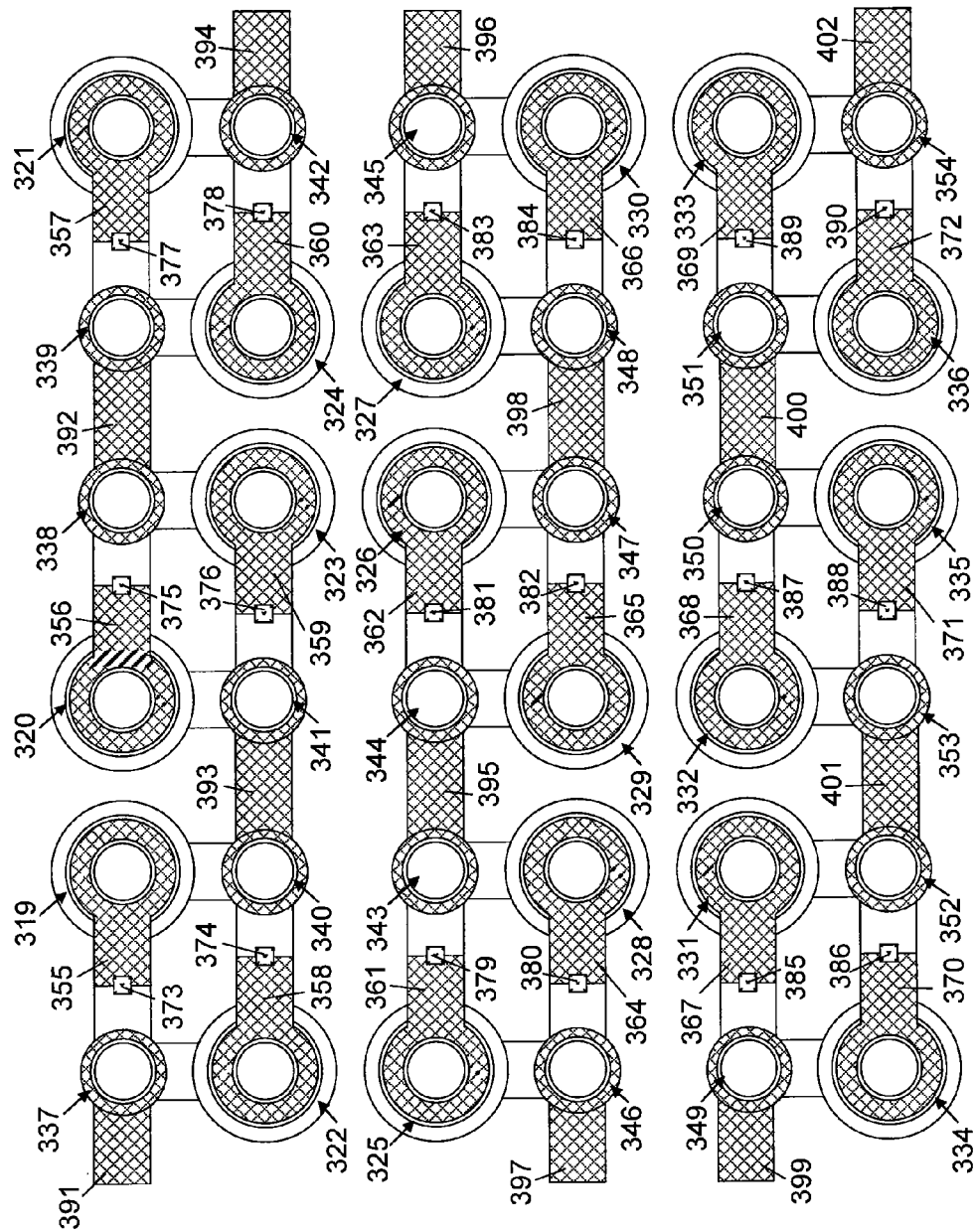
FIG. 67 is a plane view showing the arrangement of the transistor layer of a device in which the semiconductor device according to the present invention is arranged in three rows and three columns on a substrate.
Figure 68:
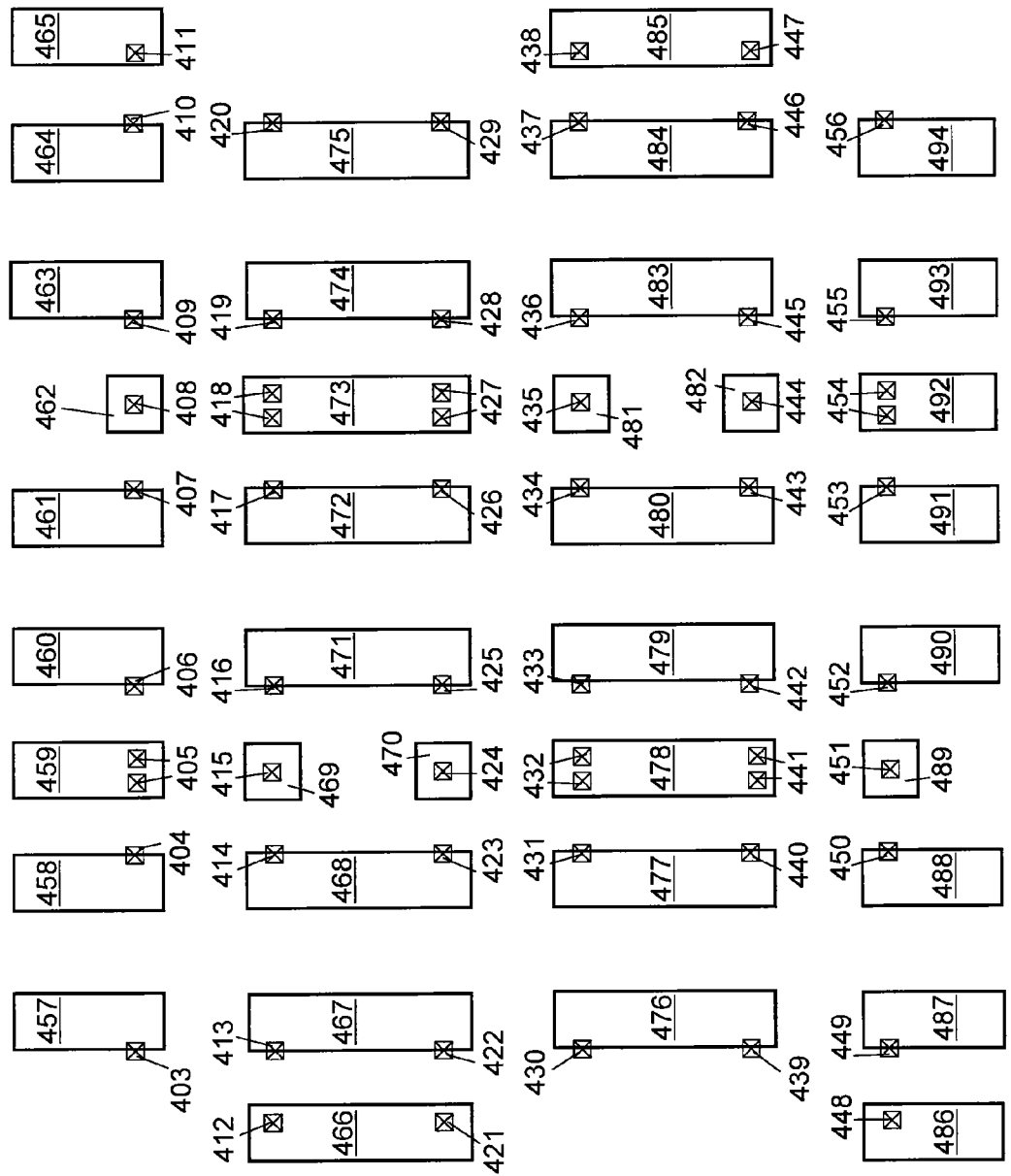
FIG. 68 is a plane view showing the arrangement of the contact layer and first metal layer of a device in which the semiconductor device according to the present invention is arranged in three rows and three columns on a substrate.
Figure 69:
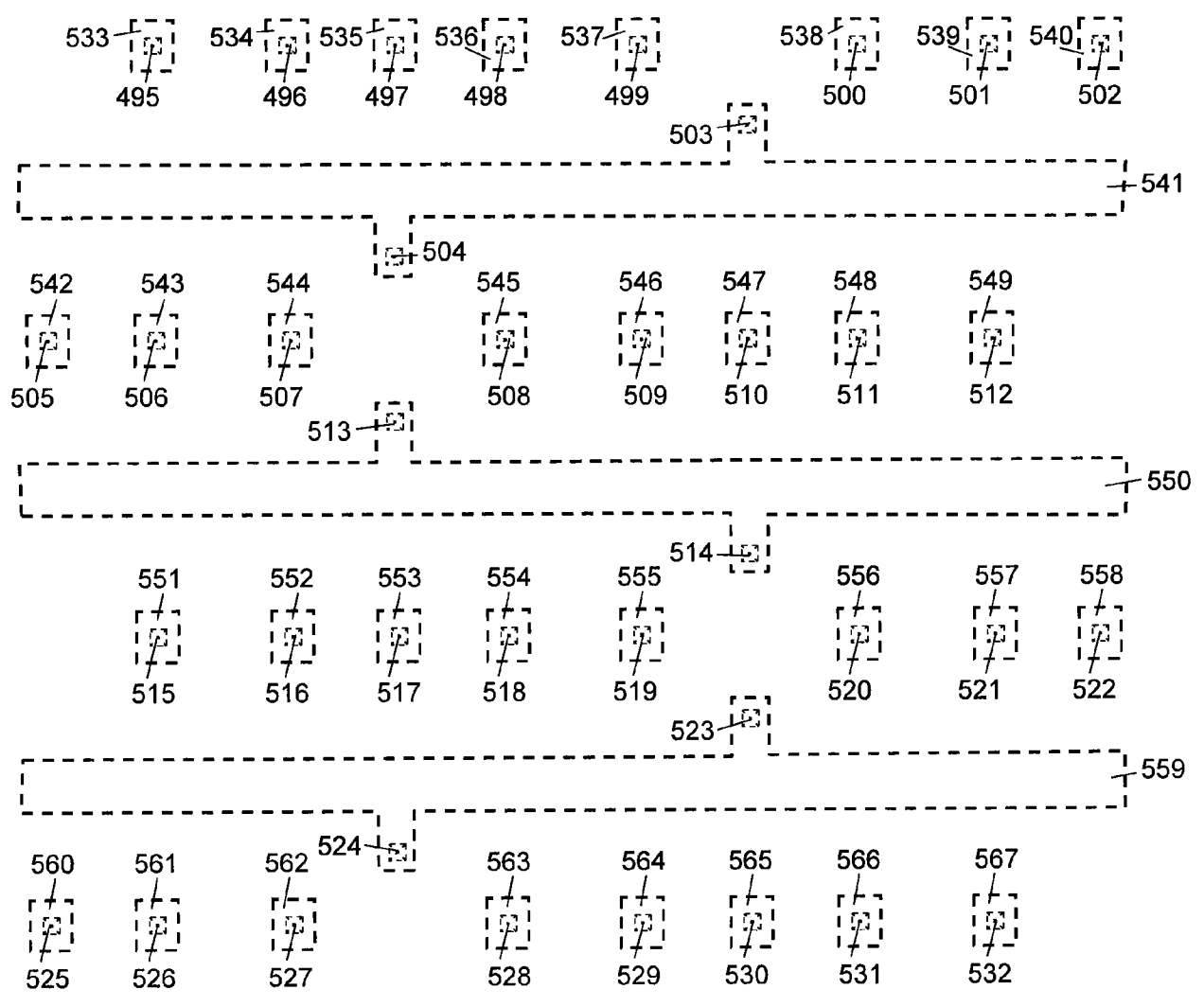
Figure 70:
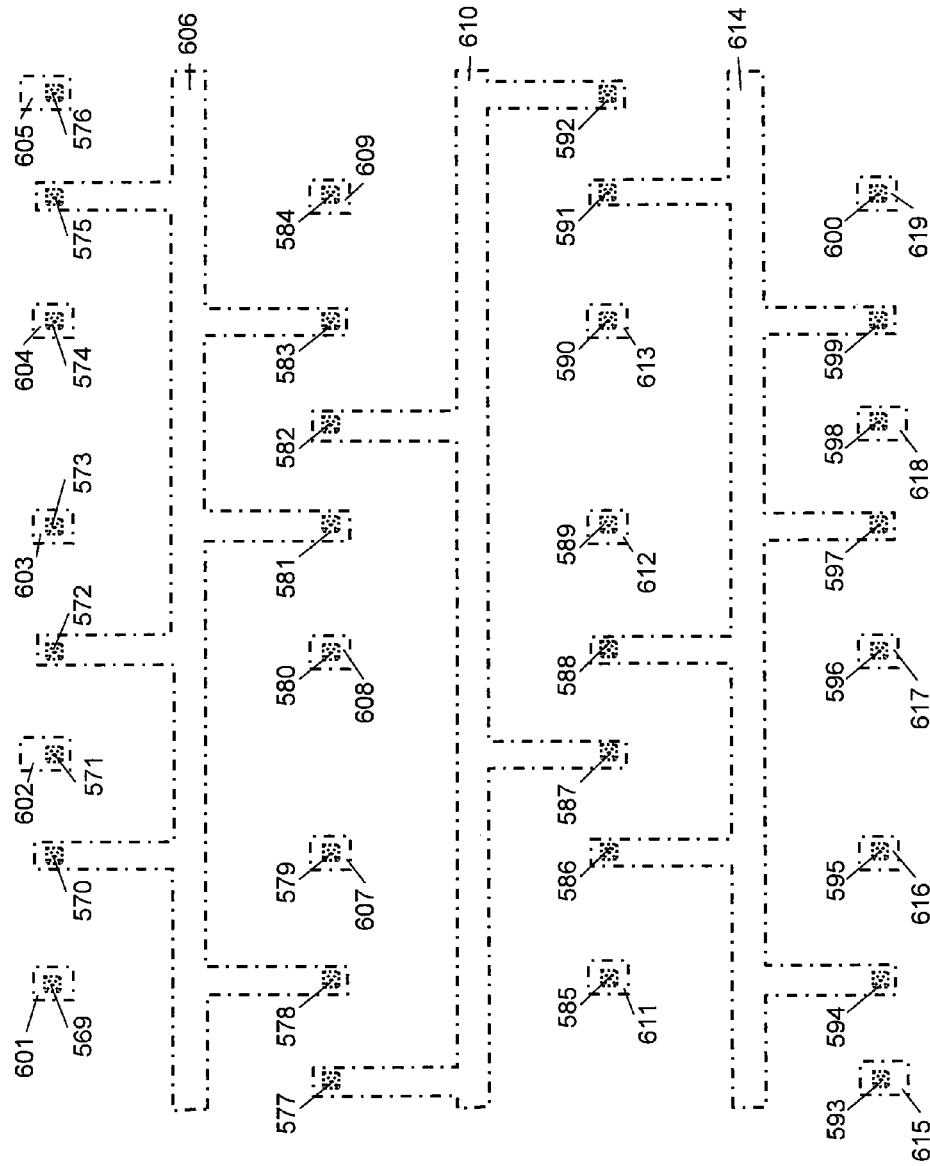
FIG. 70 is a plane view showing the arrangement of the second via (contact between the second metal and the third metal) and the third metal layer of a device in which the semiconductor device according to the present invention is arranged in three rows and three columns on a substrate.

Next, referring to FIG. 64, a first metal 237, 238, 239, 240, 241, 242, 243 and 244 is formed. Here, the first metal 238, 239, 242 and 243 are electrically connected to the contacts 230, 231, 234 and 235. Through the above, an SRAM memory cell is formed An example of a device in which the semiconductor device according to the present invention is arranged in three rows and three columns on a substrate (unrepresented) is explained below with reference to FIGS. 65 to 71. In these figures, the same components are referred to by the same reference numbers. FIG. 65 shows a device in which the semiconductor device according to the present invention is arranged in three rows and three columns on the substrate. FIG. 66 shows the positioning of the inverter output terminal layer of this device. FIG. 67 shows the positioning of the transistor layer of this device. FIG. 68 shows the positioning of the contact layer and the first metal layer of this device. FIG. 69 shows the positioning of the first via (contact between the first metal and the second metal) and the second metal layer of this device. FIG. 70 shows the positioning of the second via (contact between the second metal and the third metal) and the third metal layer of this device. FIG. 71 shows the positioning of the third via (contact between the third metal and the fourth metal) and the fourth metal layer of this device.

As shown in FIGS. 65 to 71, in the matrix orientation on the substrate, a selection transistor 337 is positioned in the first row and first column, an inverter 319 is positioned in the first row and second column, an inverter 322 is positioned in the second row and first column and a selection transistor 340 is positioned in the second row and second column.

The inverter 322 and the selection transistor 337 are mutually connected by an output terminal 301, and the inverter 319 and the selection transistor 340 are mutually connected by an output terminal 302. An input terminal 355 of the inverter 319 is connected to the output terminal 301 via a contact 373, and an input terminal 358 of the inverter 322 is connected to the output terminal 302 via a contact 374.

In the matrix orientation on the substrate, a selection transistor 338 is positioned in the first row and fourth column, an inverter 320 is positioned in the first row and third column, an inverter 323 is positioned in the second row and fourth column and a selection transistor 341 is positioned in the second row and third column.

The inverter 320 and the selection transistor 341 are mutually connected by an output terminal 303, and the inverter 323 and the selection transistor 338 are mutually connected by an output terminal 304.

An input terminal 356 of the inverter 320 is connected to the output terminal 304 via a contact 375, and an input terminal 359 of the inverter 323 is connected to the output terminal 303 via a contact 376.

In the matrix orientation on the substrate, a selection transistor 339 is positioned in the first row and fifth column, an inverter 321 is positioned in the first row and sixth column, an inverter 324 is positioned in the second row and fifth column and a selection transistor 342 is positioned in the second row and sixth column.

The inverter 324 and the selection transistor 339 are mutually connected by an output terminal 305 and the inverter 321 and the selection transistor 342 are mutually connected by an output terminal 306.

An input terminal 357 of the inverter 321 is connected to the output terminal 305 via a contact 377, and an input terminal 360 of the inverter 324 is connected to the output terminal 306 via a contact 378.

The selection transistor 337 has a gate electrode 391, and the selection transistor 340 and the selection transistor 341 have a gate electrode 393.

The selection transistor 338 and the selection transistor 339 have a gate electrode 392, and the selection transistor 342 has a gate electrode 394.

In the matrix orientation on the substrate, a selection transistor 343 is positioned in the third row and second column, an inverter 325 is positioned in the third row and first column, an inverter 328 is positioned in the fourth row and second column and a selection transistor 346 is positioned in the fourth row and first column.

The inverter 325 and the selection transistor 346 are connected by an output terminal 307, and the inverter 328 and the selection transistor 343 are connected by an output terminal 308.

An input terminal 361 of the inverter 325 is connected to the output terminal 308 via a contact 379, and an input terminal 364 of the inverter 328 is connected to the output terminal 307 via a contact 380.

In the matrix orientation on the substrate, a selection transistor 344 is positioned in the third row and third column, an inverter 326 is positioned in the third row and fourth column, an inverter 329 is positioned in the fourth row and third column and a selection transistor 347 is positioned in the fourth row and fourth column.

The inverter 329 and the selection transistor 344 are mutually connected by an output terminal 309, and the inverter 326 and the selection transistor 347 are mutually connected by an output terminal 310.

An input terminal 362 of the inverter 326 is connected to the output terminal 309 via a contact 381, and an input terminal 365 of the inverter 329 is connected to the output terminal 310 via a contact 382.

In the matrix orientation on the substrate, a selection transistor 345 is positioned in the third row and sixth column, an inverter 327 is positioned in the third row and fifth column, an inverter 330 is positioned in the fourth row and sixth column and a selection transistor 348 is positioned in the fourth row and fifth column.

The inverter 327 and the selection transistor 348 are mutually connected by an output terminal 311, and the inverter 330 and the selection transistor 345 are mutually connected by an output terminal 312.

An input terminal 363 of the inverter 327 is connected to the output terminal 312 via a contact 383, and an input terminal 366 of the inverter 330 is connected to the output terminal 311 via a contact 384.

The selection transistor 346 has a gate electrode 397, the selection transistor 343 and the selection transistor 344 have a gate electrode 395, the selection transistor 347 and the selection transistor 348 have a gate electrode 398 and the selection transistor 345 has a gate electrode 396.

In the matrix orientation on the substrate, a selection transistor 349 is positioned in the fifth row and first column, an inverter 331 is positioned in the fifth row and second column, an inverter 334 is positioned in the sixth row and first column and a selection transistor 352 is positioned in the sixth row and second column.

The inverter 334 and the selection transistor 349 are mutually connected by an output terminal 313 and the inverter 331 and the selection transistor 352 are mutually connected by an output terminal 314.

An input terminal 370 of the inverter 334 is connected to the output terminal 314 via a contact 386 and an input terminal 367 of the inverter 331 is connected to the output terminal 313 via a contact 385.

In the matrix orientation on the substrate, a selection transistor 350 is positioned in the fifth row and fourth column, an inverter 332 is positioned in the fifth row and third column, an inverter 335 is positioned in the sixth row and fourth column and a selection transistor 353 is positioned in the sixth row and third column.

The inverter 332 and the selection transistor 353 are mutually connected by an output terminal 315 and the inverter 335 and the selection transistor 350 are mutually connected by an output terminal 316.

An input terminal 368 of the inverter 332 is connected to the output terminal 316 via a contact 387 and an input terminal 371 of the inverter 335 is connected to the output terminal 315 via a contact 388.

In the matrix orientation on the substrate, a selection transistor 351 is positioned in the fifth row and fifth column, an inverter 333 is positioned in the fifth row and sixth column, an inverter 336 is positioned in the sixth row and fifth column and a selection transistor 354 is positioned in the sixth row and sixth column.

The inverter 336 and the selection transistor 351 are mutually connected by an output terminal 317 and the inverter 333 and the selection transistor 354 are mutually connected by an output terminal 318.

An input terminal 372 of the inverter 336 is connected to the output terminal 318 via a contact 390 and an input terminal 369 of the inverter 333 is connected to the output terminal 317 via a contact 389.

The selection transistor 349 has a gate electrode 399, and the selection transistor 352 and the selection transistor 353 have a gate electrode 401. In addition, the selection transistor 350 and the selection transistor 351 have a gate electrode 400, and the selection transistor 354 has a gate electrode 402.

A contact 413 is positioned above the nMOS transistor of the inverter 322, a contact 412 is positioned above the pMOS transistor of the inverter 322, a contact 403 is positioned above the selection transistor 337, a contact 404 is positioned above the nMOS transistor of the inverter 319, a contact 405 is positioned above the pMOS transistor of the inverter 319, a contact 414 is positioned above the selection transistor 340, a contact 406 is positioned above the nMOS transistor of the inverter 320, a contact 405 is positioned above the pMOS transistor of the inverter 320, a contact 416 is positioned above the selection transistor 341, a contact 417 is positioned above the nMOS transistor of the inverter 323, a contact 418 is positioned above the pMOS transistor of the inverter 323, a contact 407 is positioned above the selection transistor 338, a contact 419 is positioned above the nMOS transistor of the inverter 324, a contact 418 is positioned above the pMOS transistor of the inverter 324, a contact 409 is positioned above the selection transistor 339, a contact 410 is positioned above the nMOS transistor of the inverter 321, a contact 411 is positioned above the pMOS transistor of the inverter 321, a contact 420 is positioned above the selection transistor 342, a contact 415 is positioned on the gate electrode 393, a contact 408 is positioned on the gate electrode 392, a contact 422 is positioned above the nMOS transistor of the inverter 325, a contact 421 is positioned above the pMOS transistor of the inverter 325, a contact 430 is positioned above the selection transistor 346, a contact 431 is positioned above the nMOS transistor of the inverter 328, a contact 432 is positioned above the pMOS transistor of the inverter 328, a contact 423 is positioned above the selection transistor 343, a contact 433 is positioned above the nMOS transistor of the inverter 329, a contact 432 is positioned above the pMOS transistor of the inverter 329, a contact 425 is positioned above the selection transistor 344 and a contact 426 is positioned above the nMOS transistor of the inverter 326.

A contact 427 is positioned above the pMOS transistor of the inverter 326, a contact 434 is positioned above the selection transistor 347, a contact 428 is positioned above the nMOS transistor of the inverter 327, a contact 427 is positioned above the pMOS transistor of the inverter 327, a contact 436 is positioned above the selection transistor 348, a contact 437 is positioned above the nMOS transistor of the inverter 330, a contact 438 is positioned above the pMOS transistor of the inverter 330, a contact 429 is positioned above the selection transistor 345, a contact 424 is positioned on the gate electrode 395, a contact 435 is positioned on the gate electrode 398, a contact 449 is positioned above the nMOS transistor of the inverter 334, a contact 448 is positioned above the pMOS transistor of the inverter 334, a contact 439 is positioned above the selection transistor 349, a contact 440 is positioned above the nMOS transistor of the inverter 331, a contact 441 is positioned above the pMOS transistor of the inverter 331, a contact 450 is positioned above the selection transistor 352, a contact 442 is positioned above the nMOS transistor of the inverter 332, a contact 441 is positioned above the pMOS transistor of the inverter 332, a contact 452 is positioned above the selection transistor 353, a contact 453 is positioned above the nMOS transistor of the inverter 335, a contact 454 is positioned above the pMOS transistor of the inverter 335, a contact 443 is positioned above the selection transistor 350, a contact 455 is positioned above the nMOS transistor of the inverter 336, a contact 454 is positioned above the pMOS transistor of the inverter 336, a contact 445 is positioned above the selection transistor 351, a contact 446 is positioned above the nMOS transistor of the inverter 333, a contact 447 is positioned above the pMOS transistor of the inverter 333, a contact 456 is positioned above the selection transistor 354, a contact 451 is positioned on the gate electrode 401, and a contact 444 is positioned on the gate electrode 400.

A first metal 457 is connected to the contact 403, a first metal 458 is connected to the contact 404, a first metal 459 is connected to the contact 405, a first metal 460 is connected to the contact 406, a first metal 461 is connected to the contact 407, a first metal 462 is connected to the contact 408, a first metal 463 is connected to the contact 409, a first metal 464 is connected to the contact 410, a first metal 465 is connected to the contact 411, a first metal 466 is connected to the contact 412 and the contact 421, a first metal 467 is connected to the contact 413 and the contact 422, a first metal 468 is connected to the contact 414 and the contact 423, a first metal 469 is connected to the contact 415, a first metal 470 is connected to the contact 424, a first metal 471 is connected to the contact 416 and the contact 425, a first metal 472 is connected to the contact 417 and the contact 426, a first metal 473 is connected to the contact 418 and the contact 427, a first metal 474 is connected to the contact 419 and the contact 428, a first metal 475 is connected to the contact 420 and the contact 429, a first metal 476 is connected to the contact 430 and the contact 439, a first metal 477 is connected to the contact 431 and the contact 440, a first metal 478 is connected to the contact 432 and the contact 441, a first metal 479 is connected to the contact 433 and the contact 442, a first metal 480 is connected to the contact 434 and the contact 443, a first metal 481 is connected to the contact 435, a first metal 482 is connected to the contact 444, a first metal 483 is connected to the contact 436 and the contact 445, a first metal 484 is connected to the contact 437 and the contact 446, a first metal 485 is connected to the contact 438 and the contact 447, a first metal 486 is connected to the contact 448, a first metal 487 is connected to the contact 449, a first metal 488 is connected to the contact 450, a first metal 489 is connected to the contact 451, a first metal 490 is connected to the contact 452, a first metal 491 is connected to the contact 453, a first metal 492 is connected to the contact 454, a first metal 493 is connected to the contact 455, and a first metal 494 is connected to the contact 456.

A first via 495 is positioned above the first metal 457, a first via 496 is positioned above the first metal 458, a first via 497 is positioned above the first metal 459, a first via 498 is positioned above the first metal 460, a first via 499 is positioned above the first metal 461, a first via 500 is positioned above the first metal 463, a first via 501 is positioned above the first metal 464, a first via 502 is positioned above the first metal 465, a first via 503 is positioned above the first metal 462, a first via 504 is positioned above the first metal 469, a first via 505 is positioned above the first metal 466, a first via 506 is positioned above the first metal 467, a first via 507 is positioned above the first metal 468, a first via 508 is positioned above the first metal 471, a first via 509 is positioned above the first metal 472, a first via 510 is positioned above the first metal 473, a first via 511 is positioned above the first metal 474, a first via 512 is positioned above the first metal 475, a first via 513 is positioned above the first metal 470, a first via 514 is positioned above the first metal 481, a first via 515 is positioned above the first metal 476, a first via 516 is positioned above the first metal 477, a first via 517 is positioned above the first metal 478, a first via 518 is positioned above the first metal 479, a first via 519 is positioned above the first metal 480, a first via 520 is positioned above the first metal 483, a first via 521 is positioned above the first metal 484, a first via 522 is positioned above the first metal 485, a first via 523 is positioned above the first metal 482, a first via 524 is positioned above the first metal 489, a first via 525 is positioned above the first metal 486, a first via 526 is positioned above the first metal 487, a first via 527 is positioned above the first metal 488, a first via 528 is positioned above the first metal 490, a first via 529 is positioned above the first metal 491, a first via 530 is positioned above the first metal 492, a first via 531 is positioned above the first metal 493, and a first via 532 is positioned above the first metal 494.

A second metal 533 is connected to the first via 495, a second metal 534 is connected to the first via 496, a second metal 535 is connected to the first via 497, a second metal 536 is connected to the first via 498, a second metal 537 is connected to the first via 499, a second metal 538 is connected to the first via 500, a second metal 539 is connected to the first via 501, a second metal 540 is connected to the first via 502, a second metal 541 is connected to the first via 503 and the first via 504, a second metal 542 is connected to the first via 505, a second metal 543 is connected to the first via 506, a second metal 544 is connected to the first via 507, a second metal 545 is connected to the first via 508, a second metal 546 is connected to the first via 509, a second metal 547 is connected to the first via 510, a second metal 548 is connected to the first via 511, a second metal 549 is connected to the first via 512, a second metal 550 is connected to the first via 513 and the first via 514, a second metal 551 is connected to the first via 515, a second metal 552 is connected to the first via 516, a second metal 553 is connected to the first via 517, a second metal 554 is connected to the first via 518, a second metal 555 is connected to the first via 519, a second metal 556 is connected to the first via 520, a second metal 557 is connected to the first via 521, a second metal 558 is connected to the first via 522, a second metal 559 is connected to the first via 523 and the first via 524, a second metal 560 is connected to the first via 525, a second metal 561 is connected to the first via 526, a second metal 562 is connected to the first via 527, a second metal 563 is connected to the first via 528, a second metal 564 is connected to the first via 529, a second metal 565 is connected to the first via 530, a second metal 566 is connected to the first via 531, and a second metal 567 is connected to the first via 532.

A second via 569 is positioned above the second metal 533, a second via 570 is positioned above the second metal 534, a second via 571 is positioned above the second metal 535, a second via 572 is positioned above the second metal 536, a second via 573 is positioned above the second metal 537, a second via 574 is positioned above the second metal 538, a second via 575 is positioned above the second metal 539, a second via 576 is positioned above the second metal 540, a second via 577 is positioned above the second metal 542, a second via 578 is positioned above the second metal 543, a second via 579 is positioned above the second metal 544, a second via 580 is positioned above the second metal 545, a second via 581 is positioned above the second metal 546, a second via 582 is positioned above the second metal 547, a second via 583 is positioned above the second metal 548, a second via 584 is positioned above the second metal 549, a second via 585 is positioned above the second metal 551, a second via 586 is positioned above the second metal 552, a second via 587 is positioned above the second metal 553, a second via 588 is positioned above the second metal 554, a second via 589 is positioned above the second metal 555, a second via 590 is positioned above the second metal 556, a second via 591 is positioned above the second metal 557, a second via 592 is positioned above the second metal 558, a second via 593 is positioned above the second metal 560, a second via 594 is positioned above the second metal 561, a second via 595 is positioned above the second metal 562, a second via 596 is positioned above the second metal 563, a second via 597 is positioned above the second metal 564, a second via 598 is positioned above the second metal 565, a second via 599 is positioned above the second metal 566, and a second via 600 is positioned above the second metal 567.

A third metal 601 is connected to the second via 569 and a third metal 606 is connected to the second via 570, the second via 572, the second via 575, the second via 578, the second via 581 and the second via 583.

A third metal 602 is connected to the second via 571, a third metal 603 is connected to the second via 573, a third metal 604 is connected to the second via 574, a third metal 605 is connected to the second via 576, and a third metal 610 is connected to the second via 577, the second via 582, the second via 587 and the second via 592.

A third metal 607 is connected to the second via 579, a third metal 608 is connected to the second via 580, a third metal 609 is connected to the second via 584, and a third metal 611 is connected to the second via 585.

A third metal 614 is connected to the second via 586, the second via 588, the second via 591, the second via 594, the second via 597 and the second via 599.

A third metal 612 is connected to the second via 589, a third metal 613 is connected to the second via 590, a third metal 615 is connected to the second via 593, a third metal 616 is connected to the second via 595, a third metal 617 is connected to the second via 596, a third metal 618 is connected to the second via 598, and a third metal 619 is connected to the second via 600.

A third via 620 is positioned above the third metal 601, a third via 623 is positioned above the third metal 607, a third via 624 is positioned above the third metal 608, a third via 621 is positioned above the third metal 603, a third via 622 is positioned above the third metal 604, a third via 625 is positioned above the third metal 609, a third via 626 is positioned above the third metal 611, a third via 629 is positioned above the third metal 616, a third via 630 is positioned above the third metal 617, a third via 627 is positioned above the third metal 612, a third via 628 is positioned above the third metal 613, and a third via 631 is positioned above the third metal 619.

A fourth metal 632 is connected to the third via 620 and the third via 626, a fourth metal 633 is connected to the third via 623 and the third via 629, a fourth metal 634 is connected to the third via 624 and the third via 630, a fourth metal 635 is connected to the third via 621 and the third via 627, a fourth metal 636 is connected to the third via 622 and the third via 628, and a fourth metal 637 is connected to the third via 625 and the third via 661.

Having described and illustrated the principles of this application by reference to one (or more) preferred embodiment(s), it should be apparent that the preferred embodiment(s) may be modified in arrangement and detail without departing from the principles disclosed herein and that it is intended that the application be construed as including all such modifications and variations insofar as they come within the spirit and scope of the subject matter disclosed herein.

What is claimed is:
1. A semiconductor device, comprising:
  a first inverter circuit positioned in a first row and a first column in a matrix orientation on a substrate,
  wherein the first inverter circuit has:
    a first gate insulating film surrounding the periphery of a first island-shaped semiconductor layer,
    a first gate electrode surrounding the periphery of the first gate insulating film,
    a second gate insulating film surrounding the periphery of the first gate electrode,
    a first columnar semiconductor layer surrounding the periphery of the second gate insulating film, a first upper part high concentration semiconductor layer of a first conductivity type positioned on the upper part of the first island-shaped semiconductor layer,
a second lower part high concentration semiconductor layer of the first conductivity type positioned on the lower part of the first island-shaped semiconductor layer,
a first upper part high concentration semiconductor layer of a second conductivity type positioned on the upper part of the first columnar semiconductor layer, and
a second lower part high concentration semiconductor layer of the second conductivity type positioned on the lower part of the first columnar semiconductor layer;
further comprising a second inverter circuit positioned in a second row and a second column in a matrix orientation on the substrate,
wherein the second inverter circuit has:
a second island-shaped semiconductor layer,
a third gate insulating film surrounding the periphery of the second island-shaped semiconductor layer,
a second gate electrode surrounding the periphery of the third gate insulating film,
a fourth gate insulating film surrounding the periphery of the second gate electrode,
a second columnar semiconductor layer surrounding the periphery of the fourth gate insulating film,
a third upper part high concentration semiconductor layer of the first conductivity type positioned on the upper part of the second island-shaped semiconductor layer,
a fourth lower part high concentration semiconductor layer of the first conductivity type positioned on the lower part of the second island-shaped semiconductor layer,
a third upper part high concentration semiconductor layer of the second conductivity type positioned on the upper part of the second columnar semiconductor layer, and
a fourth lower part high concentration semiconductor layer of the second conductivity type positioned on the lower part of the second columnar semiconductor layer;
further comprising a first selection transistor positioned in the first row and second column of the matrix orientation on the substrate,
wherein this first selection transistor has:
a third island-shaped semiconductor layer,
a fifth gate insulating film surrounding the periphery of the third island-shaped semiconductor layer,
a third gate electrode surrounding the periphery of the fifth gate insulating film,
a fifth upper part high concentration semiconductor layer of the first conductivity type positioned on the upper part of the third island-shaped semiconductor layer, and
a sixth lower part high concentration semiconductor layer of the first conductivity type positioned on the lower part of the third island-shaped semiconductor layer, and
further comprising a second selection transistor positioned in the second row and first column of the matrix orientation on the substrate,
wherein the second selection transistor has:
a fourth island-shaped semiconductor layer,
a sixth gate insulating film surrounding the periphery of the fourth island-shaped semiconductor layer,
a fourth gate electrode surrounding the periphery of the sixth gate insulating film,
a seventh upper part high concentration semiconductor layer of the first conductivity type positioned on the upper part of the fourth island-shaped semiconductor layer, and
an eighth lower part high concentration semiconductor layer of the first conductivity type positioned on the lower part of the fourth island-shaped semiconductor layer;
further comprising a ninth lower part high concentration semiconductor layer of the first conductivity type that contacts the second lower part high concentration semiconductor layer of the first conductivity type, the second lower part high concentration semiconductor layer of the second conductivity type and the eighth lower part high concentration semiconductor layer of the first conductivity type; and
a tenth lower part high concentration semiconductor layer of the first conductivity type positioned that contacts the fourth lower part high concentration semiconductor layer of the first conductivity type, the fourth lower part high concentration semiconductor layer of the second conductivity type and the sixth lower part high concentration semiconductor layer of the first conductivity type;
and having a first compound layer of semiconductor and metal that contacts the first upper part high concentration semiconductor layer of the first conductivity type;
a second compound layer of semiconductor and metal that contacts the first lower part high concentration semiconductor layer of the second conductivity type;
a third compound layer of semiconductor and metal that contacts the second lower part high concentration semiconductor layer of the second conductivity type, the ninth lower part high concentration semiconductor layer of the first conductivity type and the eighth lower part high concentration semiconductor layer of the first conductivity type;
a fourth compound layer of semiconductor and metal that contacts the seventh upper part high concentration semiconductor layer of the first conductivity type;
a fifth compound layer of semiconductor and metal that contacts the third upper part high concentration semiconductor layer of the first conductivity type;
a sixth compound layer of semiconductor and metal that contacts the third upper part high concentration semiconductor layer of the second conductivity type;
a seventh compound layer of semiconductor and metal that contacts the fourth lower part high concentration semiconductor layer of the second conductivity type, the tenth lower part high concentration semiconductor layer of the first conductivity type and the sixth lower part high concentration semiconductor layer of the first conductivity type;
an eighth compound layer of semiconductor and metal that contacts the fifth upper part high concentration semiconductor layer of the first conductivity type;
a first contact for electrically connecting the first gate electrode and the seventh compound layer; and
a second contact for electrically connecting the second gate electrode and the third compound layer.

2. The semiconductor device according to claim 1, wherein:
in the first inverter circuit,
the first upper part high concentration semiconductor layer of the first conductivity type is a first n+ type semiconductor layer,
the second lower part high concentration semiconductor layer of the first conductivity type is a second n+ type semiconductor layer, the first upper part high concentration semiconductor layer of the second conductivity type is a first p+ type semiconductor layer, and the second lower part high concentration semiconductor layer of the second conductivity type is a second p+ type semiconductor layer;

in the second inverter circuit, the third upper part high concentration semiconductor layer of the first conductivity type is a third n+ type semiconductor layer, the fourth lower part high concentration semiconductor layer of the first conductivity type is a fourth n+ type semiconductor layer, the third upper part high concentration semiconductor layer of the second conductivity type is a third p+ type semiconductor layer, and the fourth lower part high concentration semiconductor layer of the second conductivity type is a fourth p+ type semiconductor layer;

in the first selection transistor, the fifth upper part high concentration semiconductor layer of the first conductivity type is a fifth n+ type semiconductor layer, the sixth lower part high concentration semiconductor layer of the first conductivity type is a sixth n+ type semiconductor layer, the fifth upper part high concentration semiconductor layer of the second conductivity type is a fifth p+ type semiconductor layer, and the sixth lower part high concentration semiconductor layer of the second conductivity type is a sixth p+ type semiconductor layer; and in the second selection transistor, the seventh upper part high concentration semiconductor layer of the first conductivity type is a seventh n+ type semiconductor layer, and the eighth lower part high concentration semiconductor layer of the first conductivity type is an eighth n+ type semiconductor layer.

3. The semiconductor device according to claim 2, wherein the ninth lower part high concentration semiconductor layer of the first conductivity type is a ninth n+ type semiconductor layer, and the tenth lower part high concentration semiconductor layer of the first conductivity type is a tenth n+ type semiconductor layer.

4. The semiconductor device according to claim 2, wherein $Wp \approx 2Wn$, where Wp is the inner circumference of the first columnar semiconductor layer and Wn is the outer circumference of the first island-shaped semiconductor layer, and $Wp \approx 2Wn$, where Wp is the inner circumference of the second columnar semiconductor layer and Wn is the outer circumference of the second island-shaped semiconductor layer.

5. The semiconductor device according to claim 2, wherein $Rp \approx 2Rn$, where Rp is the inner diameter of the first columnar semiconductor layer and Rn is the radius of the first island-shaped semiconductor layer, and $Rp \approx 2Rn$, where Rp is the inner diameter of the second columnar semiconductor layer and Rn is the radius of the second island-shaped semiconductor layer.

6. The semiconductor device according to claim 2, wherein $Lp \approx Ln$, where Lp is the channel length of the first columnar semiconductor layer and Ln is the channel length of the first island-shaped semiconductor layer, and $Lp \approx Ln$, where Lp is the channel length of the second columnar semiconductor layer and Ln is the channel length of the second island-shaped semiconductor layer.

7. The semiconductor device according to claim 2, wherein the first inverter circuit has an enhancement-type nMOS transistor, the first upper part high concentration semiconductor layer of the first conductivity type is a first n+ type semiconductor layer, the second lower part high concentration semiconductor layer of the first conductivity type is a second n+ type semiconductor layer, the first upper part high concentration semiconductor layer of the second conductivity type is a first p+ type semiconductor layer, the second lower part high concentration semiconductor layer of the second conductivity type is a second p+ type semiconductor layer, the second inverter circuit has an enhancement-type pMOS transistor, the third upper part high concentration semiconductor layer of the first conductivity type is a third n+ type semiconductor layer, the fourth lower part high concentration semiconductor layer of the first conductivity type is a fourth n+ type semiconductor layer, the third upper part high concentration semiconductor layer of the second conductivity type is a third p+ type semiconductor layer, the fourth lower part high concentration semiconductor layer of the second conductivity type is a fourth p+ type semiconductor layer, and the second gate electrode is formed of a material for making the nMOS transistor and the pMOS transistor enhancement type.

8. The semiconductor device according to claim 2, wherein the first through fourth compound layers are each compound layers of silicon and metal.

9. The semiconductor device according to claim 2, wherein:
the first and second island-shaped semiconductor layers are each island-shaped silicon layers;
the first and second columnar semiconductor layers are each columnar silicon layers;
the first and second n+ type semiconductor layers are each n+ type silicon layers; and
the first and second p+ type semiconductor layers are each p+ type silicon layers.

10. The semiconductor device according to claim 9, wherein:
the first and second island-shaped silicon layers are each p type or non-doped island-shaped silicon layers; and
the first and second columnar silicon layers are each n type or non-doped columnar silicon layers.

* * * * *